(12) United States Patent
Endo et al.

(10) Patent No.: US 12,356,787 B2
(45) Date of Patent: Jul. 8, 2025

(54) ORGANIC LIGHT EMITTING ELEMENT

(71) Applicant: KYULUX, INC., Fukuoka (JP)

(72) Inventors: Ayataka Endo, Fukuoka (JP); Ping Kuen Daniel Tsang, Fukuoka (JP); Hayato Kakizoe, Fukuoka (JP); Makoto Yoshizaki, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 912 days.

(21) Appl. No.: 17/298,250

(22) PCT Filed: Nov. 28, 2019

(86) PCT No.: PCT/JP2019/046675
§ 371 (c)(1),
(2) Date: May 28, 2021

(87) PCT Pub. No.: WO2020/111205
PCT Pub. Date: Jun. 4, 2020

(65) Prior Publication Data
US 2022/0123249 A1    Apr. 21, 2022

(30) Foreign Application Priority Data

Nov. 30, 2018  (JP) ................................. 2018-224557
Nov. 30, 2018  (JP) ................................. 2018-224558

(51) Int. Cl.
| | |
|---|---|
| *H01L 51/50* | (2006.01) |
| *H01L 51/00* | (2006.01) |
| *H10K 50/11* | (2023.01) |
| *H10K 85/60* | (2023.01) |
| *H10K 101/10* | (2023.01) |

(52) U.S. Cl.
CPC ........... *H10K 50/11* (2023.02); *H10K 85/649* (2023.02); *H10K 2101/10* (2023.02)

(58) Field of Classification Search
CPC .................. H01L 51/5016; H01L 51/0062
See application file for complete search history.

(56) References Cited

FOREIGN PATENT DOCUMENTS

| | | |
|---|---|---|
| CN | 104885249 A | 9/2015 |
| CN | 105074951 A | 11/2015 |
| JP | 2014-43541 A | 3/2014 |
| JP | 2014-45179 A | 3/2014 |
| JP | 2014-75249 A | 4/2014 |
| JP | 2015-179809 A | 10/2015 |
| JP | 2017-126598 A | 7/2017 |
| JP | 2017-147450 A | 8/2017 |
| JP | 2018-076259 A | 5/2018 |
| JP | 2018-93175 A | 6/2018 |
| JP | 2019-4849 A | 1/2019 |
| JP | 2019-4850 A | 1/2019 |
| WO | 2013-150592 A1 | 10/2013 |
| WO | WO-2014157619 A1 * | 10/2014 ......... H01L 51/5028 |
| WO | 2014-203729 A1 | 12/2014 |

OTHER PUBLICATIONS

Japanese office action dated Aug. 15, 2023, in corresponding Japanese patent application No. 2019-216459.
Office Action dated Sep. 5, 2023 issued in the corresponding Chinese application No. 201980076273.5 with its English Machine Translation.
Japanese International Preliminary Report on Patentability of Chapter I for PCT International Application No. PCT/JP2019/046675, mailed May 25, 2021, with English translation.
International Search Report and Search Opinion for PCT International Application No. JP2019/046675.
H. Uoyama, et al., Highly efficient organic light-emitting diodes from delayed fluorescence, Nature 492, 234 (2012).
Office Action dated Jun. 21, 2024 issued in the corresponding Chinese patent application No. 201980076273.5 with its English Machine Translation.

* cited by examiner

*Primary Examiner* — Robert D Harlan
(74) *Attorney, Agent, or Firm* — FISHERBROYLES, LLP; Roger L. Browdy

(57)    ABSTRACT

An organic light-emitting device having an organic mixed layer that contains a first organic compound and a second organic compound and a third organic compound satisfying $E_{S1}(A) > E_{S1}(B) > E_{S1}(C)$. $E_{S1}(A)$, $E_{S1}(B)$ and $E_{S1}(C)$ each represent a lowest excited singlet energy level of the first organic compound, the second organic compound and the third organic compound, respectively. The second organic compound and the third organic compound are delayed fluorescent materials. The invention provides an organic light-emitting device having a long lifetime and a high light emission efficiency.

26 Claims, 1 Drawing Sheet

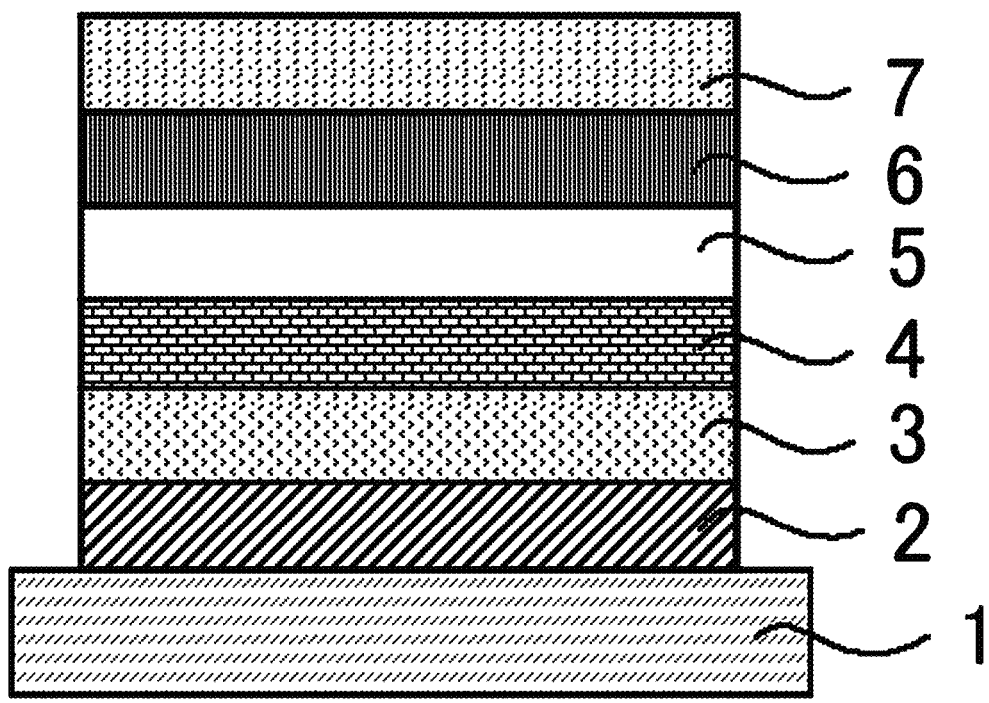

ORGANIC LIGHT EMITTING ELEMENT

TECHNICAL FIELD

The present invention relates to an organic light-emitting device using a delayed fluorescent material.

BACKGROUND ART

Studies for enhancing the light emission efficiency of organic light-emitting devices such as organic electroluminescent devices (organic EL devices) are being made actively. In particular, various kinds of efforts have been made for increasing light emission efficiency by newly developing and combining an electron transporting material, a hole transporting material, a host material and a light-emitting material to constitute an organic electroluminescent device. Among them, there is known a study relating to an organic light-emitting device that utilizes a delayed fluorescent material.

A delayed fluorescent material is a compound which, in an excited state, after having undergone reverse intersystem crossing from an excited triplet state to an excited singlet state, emits fluorescence when returning back from the excited singlet state to a ground state thereof. Fluorescence through the route is observed later than fluorescence from the excited singlet state directly occurring from the ground state (ordinary fluorescence), and is therefore referred to as delayed fluorescence. Here, for example, in the case where a light-emitting compound is excited through carrier injection thereinto, the occurring probability of the excited singlet state to the excited triplet state is statistically 25%/75%, and therefore improvement of light emission efficiency by the fluorescence alone from the directly occurring excited singlet state is limited. On the other hand, in a delayed fluorescent material, not only the excited singlet state thereof but also the excited triplet state can be utilized for fluorescent emission through the route via the above-mentioned reverse intersystem crossing, and therefore as compared with an ordinary fluorescent material, a delayed fluorescent material can realize a higher emission efficiency.

Regarding such a delayed fluorescent material, there has been proposed a benzene derivative having a heteroaryl group such as a carbazolyl group or a diphenylamino group and at least two cyano groups, and it has been confirmed that an organic EL device using the benzene derivative in a light-emitting layer could attain a high emission efficiency (see PTL 1).

Further, NPL 1 reports that a carbazolyldicyanobenzene derivative (4CzTPN) represented by the following formula is a thermal activation type delayed fluorescent material and that an organic electroluminescent device using the carbazolyldicyanobenzene derivative attained a high internal EL quantum efficiency.

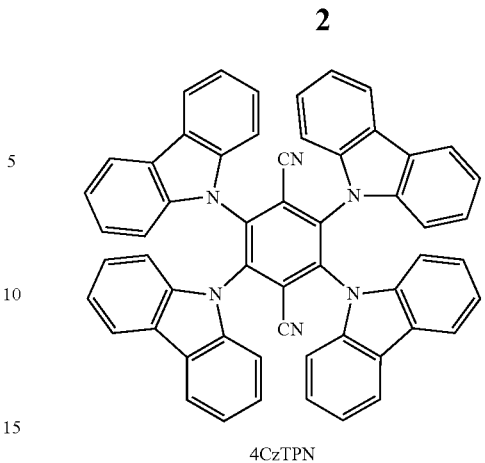

4CzTPN

On the other hand, there has also been proposed use of a delayed fluorescent material in a light-emitting layer not as a light-emitting material but as an assist dopant therein (see PTL 2). In this, it is described that, in addition to a host material and a fluorescent light-emitting material, a delayed fluorescent material having a lowest excited singlet energy level that is between the host material and the fluorescent light-emitting material is added to the light-emitting layer to improve the emission efficiency.

CITATION LIST

Patent Literature

PTL 1: JP 2014-43541 A
PTL 2: JP 2015-179809 A

Non-Patent Literature

NPL 1: H. Uoyama, et al., Nature 492, 234 (2012)

SUMMARY OF INVENTION

Technical Problem

As described above, PTL 1, PTL 2 and NPL 1 report that organic electroluminescent devices using a delayed fluorescent material attained a high light emission efficiency. However, the present inventors produced organic electroluminescent devices according to the description of PTL 1 and PTL 2, and revealed that the devices could hardly secure a sufficient lifetime. Specifically, when the concentration of the delayed fluorescent material in the light-emitting layer is increased so as to improve the lifetime, the luminescent quantum efficiency lowers, and therefore it is difficult to satisfy both a long lifetime and a high emission efficiency. In addition, since the drive voltage is high, and therefore the drive voltage needs to be lowered for practical use of the devices. In particular, in an organic light-emitting device using a fluorescent material or a delayed fluorescent material of a red light emitter, any studies for solving the problems are not as yet made sufficiently.

Given the situation, the present inventors have promoted assiduous studies for the purpose of attaining both a prolonged lifetime and an increased emission efficiency of an organic light-emitting device using a delayed fluorescent material.

Solution to Problem

As a result of assiduous studies made for the purpose of attaining the above-mentioned object, the present inventors have found that a long lifetime and a high emission efficiency can be realized by adding multiple delayed fluorescent materials satisfying a specific requirement to the light-emitting material. The inventors have further found that a long lifetime and a high emission efficiency can also be realized by forming a layer containing such multiple delayed fluorescent materials as a layer neighboring to the light-emitting layer. The present invention has been proposed on the basis of these findings, and specifically has the following constitution. [1] An organic light-emitting device having an organic mixed layer that contains a first organic compound and a second organic compound and a third organic compound satisfying the following requirement (a), wherein:
the second organic compound and the third organic compound are delayed fluorescent materials each having a different structure:

Requirement(a)$E_{S1}(A) > E_{S1}(B) > E_{S1}(C)$ wherein $E_{S1}(A)$ represents a lowest excited singlet energy level of the first organic compound, $E_{S1}(B)$ represents a lowest excited singlet energy level of the second organic compound, $E_{S1}(C)$ represents a lowest excited singlet energy level of the third organic compound.
[2] The organic light-emitting device according to [1], which is an organic electroluminescent device having an anode, a cathode, and at least one organic layer that includes the organic mixed layer between the anode and the cathode.
[3] The organic light-emitting device according to [1] or [2], wherein the second organic compound is such that the energy difference $\Delta E_{st}$ between the lowest excited singlet state and the lowest excited triplet state at 77K is 0.3 eV or less.
[4] The organic light-emitting device according to any one of [1] to [3], wherein the third organic compound is such that the energy difference $\Delta E_{st}$ between the lowest excited singlet state and the lowest excited triplet state at 77K is 0.3 eV or less.
[5] The organic light-emitting device according to any one of [1] to [4], wherein the content of the second organic compound in the organic mixed layer is larger than the content of the third organic compound therein.
[6] The organic light-emitting device according to any one of [1] to [5], wherein the content of the second organic compound in the organic mixed layer is larger than the content of the first organic compound therein.
[7] The organic light-emitting device according to any one of [1] to [6], wherein the content of the second organic compound in the organic mixed layer is 45% by weight or more of the organic mixed layer.
[8] The organic light-emitting device according to any one of [1] to [7], wherein the content of the third organic compound in the organic mixed layer is 10% by weight or less of the organic mixed layer.
[9] The organic light-emitting device according to any one of [1] to [8], wherein the organic mixed layer does not contain a metal element.
[10] The organic light-emitting device according to any one of [1] to [9], wherein the organic mixed layer is composed of compounds alone each formed of atoms selected from the group consisting of a carbon atom, a hydrogen atom, a nitrogen atom, an oxygen atom and a sulfur atom.
[11] The organic light-emitting device according to any one of [1] to [10], wherein the second organic compound and the third organic compound both contain a dicyanobenzene structure.
[12] An organic light-emitting device having an organic mixed layer that contains a fifth organic compound and a sixth organic compound and a seventh organic compound and an eighth organic compound satisfying the following requirement (b), and requirement (c), wherein:
the sixth organic compound and the seventh organic compound are delayed fluorescent materials each having a different structure:

Requirement(b)$E_{S1}(D) > E_{S1}(E)$, or $E_{S1}(D) > E_{S1}(F)$

Requirement(c)$E_{S1}(E) > E_{S1}(F) > E_{S1}(G)$ wherein $E_{S1}(D)$ represents a lowest excited singlet energy level of the fifth organic compound, $E_{S1}(E)$ represents a lowest excited singlet energy level of the sixth organic compound, $E_{S1}(F)$ represents a lowest excited singlet energy level of the seventh organic compound, $E_{S1}(G)$ represents a lowest excited singlet energy level of the eighth organic compound.
[13] The organic light-emitting device according to [12], which is an organic electroluminescent device having an anode, a cathode, and at least one organic layer that includes the organic mixed layer between the anode and the cathode.
[14] The organic light-emitting device according to [12] or [13], wherein the sixth organic compound is such that the energy difference $\Delta E_{st}$ between the lowest excited singlet state and the lowest excited triplet state at 77K is 0.3 eV or less.
[15] The organic light-emitting device according to any one of [12] to [14], wherein the seventh organic compound is such that the energy difference $\Delta E_{st}$ between the lowest excited singlet state and the lowest excited triplet state at 77K is 0.3 eV or less.
[16] The organic light-emitting device according to any one of [12] to [15], wherein the content of the sixth organic compound in the organic mixed layer is larger than the content of the seventh organic compound therein.
[17] The organic light-emitting device according to any one of [12] to [16], wherein the content of the sixth organic compound in the organic mixed layer is larger than the content of the fifth organic compound therein.
[18] The organic light-emitting device according to any one of [12] to [17], wherein the content of the fifth organic compound in the organic mixed layer is larger than the content of the seventh organic compound therein.
[19] The organic light-emitting device according to any one of [12] to [18], wherein the content of the fifth organic compound, the content of the sixth organic compound and the content of the seventh organic compound in the organic mixed layer are all larger than the content of the eighth organic compound therein.
[20] The organic light-emitting device according to any one of [12] to [19], wherein the content of the sixth organic compound in the organic mixed layer is 45% by weight or more of the organic mixed layer.
[21] The organic light-emitting device according to any one of [12] to [20], wherein the content of the seventh organic compound in the organic mixed layer is 25% by weight or less of the organic mixed layer.
[22] The organic light-emitting device according to any one of [12] to [21], wherein the organic mixed layer does not contain a metal element.
[23] The organic light-emitting device according to any one of [12] to [22], wherein the organic mixed layer is composed of compounds alone each formed of atoms selected from the group consisting of a carbon atom, a hydrogen atom, a nitrogen atom, an oxygen atom and a sulfur atom.

[24] The organic light-emitting device according to any one of [12] to [23], wherein the sixth organic compound and the seventh organic compound both contain a dicyanobenzene structure.
[25] The organic light-emitting device according to any one of [1] to [24], wherein the organic mixed layer is a light-emitting layer.
[26] The organic light-emitting device according to any one of [1] to [24], wherein the organic mixed layer is formed as a layer different from a light-emitting layer.

Advantageous Effects of Invention

According to the present invention, there can be provided an organic light-emitting device having a high light emission efficiency and a long lifetime. In addition, an organic light-emitting device for which the drive voltage is suppressed can also be provided.

BRIEF DESCRIPTION OF DRAWING

FIG. 1 This is a schematic cross-sectional view showing a layer configuration example of an organic electroluminescent device.

DESCRIPTION OF EMBODIMENTS

The contents of the invention will be described in detail below. The constitutional elements may be described below with reference to representative embodiments and specific examples of the invention, but the invention is not limited to the embodiments and the examples. In the description herein, a numerical range expressed as "to" means a range that includes the numerical values described before and after "to" as the upper limit and the lower limit. The hydrogen atom that is present in the compound used in the invention is not particularly limited in isotope species, and for example, all the hydrogen atoms in the molecule may be $^1H$, and all or a part of them may be $^2H$ (deuterium (D)).

First Embodiment of Organic Light-Emitting Device

The organic light-emitting device of the first embodiment of the present invention is an organic light-emitting device having an organic mixed layer that contains a first organic compound and a second organic compound and a third organic compound. The first organic compound and the second organic compound and the third organic compound satisfy the following requirement (a).

Requirement(a) $E_{S1}(A) > E_{S1}(B) > E_{S1}(C)$

In the requirement (a), $E_{S1}(A)$ represents a lowest excited singlet energy level of the first organic compound, $E_{S1}(B)$ represents a lowest excited singlet energy level of the second organic compound, $E_{S1}(C)$ represents a lowest excited singlet energy level of the third organic compound. In the following description, the organic light-emitting device of the first embodiment is referred to as "the first organic light-emitting device".

The second organic compound is a delayed fluorescent material. The third organic compound is a delayed fluorescent material that differs from the second organic compound in the structure. In the present invention, "delayed fluorescent material" is an organic compound which, in an excited state, undergoes reverse intersystem crossing from the excited triplet state to the excited singlet state, and emits fluorescence (delayed fluorescence) when returning back from the excited singlet state to a ground state. In the present invention, an emission lifetime of a fluorescent material is measured using a fluorescence lifetime measuring system (e.g., Streak Camera from Hamamatsu Photonics), and the fluorescent material having an emission lifetime of 100 ns (nanoseconds) or more is referred to as a delayed fluorescent material.

The second organic compound is preferably such that the difference $\Delta E_{st}$ between the lowest excited singlet energy level and the lowest excited triplet energy level at 77K is 0.3 eV or less, more preferably 0.25 eV or less, even more preferably 0.2 eV or less, further more preferably 0.15 eV or less, further more preferably 0.1 eV or less, further more preferably 0.07 eV or less, further more preferably 0.05 eV or less, further more preferably 0.03 eV or less, further more preferably 0.01 eV or less.

The third organic compound is preferably such that the difference $\Delta E_{st}$ between the lowest excited singlet energy level and the lowest excited triplet energy level at 77K is 0.3 eV or less, more preferably 0.25 eV or less, even more preferably 0.2 eV or less, further more preferably 0.15 eV or less, further more preferably 0.1 eV or less, further more preferably 0.07 eV or less, further more preferably 0.05 eV or less, further more preferably 0.03 eV or less, further more preferably 0.01 eV or less.

When $\Delta E_{st}$ is smaller, reverse intersystem crossing from an excited triplet state to an excited singlet state can more readily occur through thermal energy absorption, and therefore the material of the type can function as a thermal activation type delayed fluorescent material. A thermal activation type delayed fluorescent material can absorb heat generated by a device to relatively readily undergo reverse intersystem crossing from an excited triplet state to an excited singlet state, and can make the excited triplet energy efficiently contribute toward light emission.

[Measurement of Difference $\Delta E_{ST}$ Between Lowest Excited Singlet Energy Level ($E_{S1}$) and Lowest Excited Triplet Energy Level ($E_{T1}$)]

A difference $\Delta E_{ST}$ between a lowest excited singlet energy level ($E_{S1}$) and a lowest excited triplet energy level ($E_{T1}$) of a compound is determined by calculating the lowest excited singlet energy level ($E_{S1}$) and the lowest excited triplet energy level ($E_{T1}$) from the fluorescence spectrum and the phosphorescence spectrum of the compound, according to an equation, $\Delta E_{ST} = E_{S1} - E_{T1}$.

(1) Lowest Excited Singlet Energy Level ($E_{S1}$)

A thin film or a toluene solution (concentration: $10^{-5}$ mol/L) of the compound to be analyzed is prepared as a measurement sample, and the fluorescent spectrum of the sample was measured at room temperature (300 K). For the fluorescent spectrum, the emission intensity is on the vertical axis and the wavelength is on the horizontal axis. A tangent line is drawn to the rising of the emission spectrum on the short wavelength side, and the wavelength value λedge [nm] at the intersection between the tangent line and the horizontal axis is read. The wavelength value is converted into an energy value according to the following conversion expression to calculate $E_{S1}$.

Conversion Expression: $E_{S1}[eV] = 1239.85/\lambda\text{edge}$

For the measurement of the emission spectrum in Examples given below, an LED light source (by Thorlabs Corporation, M340L4) is used as an excitation light source along with a detector (by Hamamatsu Photonics K. K., PMA-12 Multichannel Spectroscope C10027-01).

(2) Lowest Excited Triplet Energy Level ($E_{T1}$)

The same sample as that for measurement of the lowest excited singlet energy level ($E_{S1}$) is cooled to 77 [K] with liquid nitrogen, and the sample for phosphorescence measurement is irradiated with excitation light (300 nm), and using a detector, the phosphorescence thereof was measured. The emission after 100 milliseconds from irradiation with the excitation light is drawn as a phosphorescent spectrum. A tangent line is drawn to the rising of the phosphorescent spectrum on the short wavelength side, and the wavelength value λedge [nm] at the intersection between the tangent line and the horizontal axis is read. The wavelength value is converted into an energy value according to the following conversion expression to calculate $E_{T1}$.

Conversion Expression: $E_{T1}[eV]=1239.85/\lambda \text{edge}$

The tangent line to the rising of the phosphorescent spectrum on the short wavelength side is drawn as follows. While moving on the spectral curve from the short wavelength side of the phosphorescent spectrum toward the maximum value on the shortest wavelength side among the maximum values of the spectrum, a tangent line at each point on the curve toward the long wavelength side is taken into consideration. With rising thereof (that is, with increase in the vertical axis), the inclination of the tangent line increases. The tangent line drawn at the point at which the inclination value has a maximum value is referred to as the tangent line to the rising on the short wavelength side of the phosphorescent spectrum.

The maximum point having a peak intensity of 10% or less of the maximum peak intensity of the spectrum is not included in the maximum value on the above-mentioned shortest wavelength side, and the tangent line drawn at the point which is closest to the maximum value on the shortest wavelength side and at which the inclination value has a maximum value is referred to as the tangent line to the rising on the short wavelength side of the phosphorescent spectrum.

(First Organic Compound)

The first organic compound is an organic compound having a larger lowest excited singlet energy than the second organic compound and the third organic compound, and has a function as a host material to take a role in carrier transport and also a function to trap the energy of the third organic compound in the compound. Accordingly, the third organic compound can efficiently convert the energy generated by recombination of holes and electrons in the molecule and the energy having received from the first organic compound and the second organic compound into light emission, and an organic light-emitting device having a high light emission efficiency can be thereby realized.

The first organic compound is preferably an organic compound having a hole transport ability and an electron transport ability, capable of preventing the wavelength of light emission from being prolonged, and having a high glass transition temperature. In preferred embodiments of the present invention, the first organic compound is selected from compounds not emitting delayed fluorescence. Preferred compounds usable as the first organic compound are listed below.

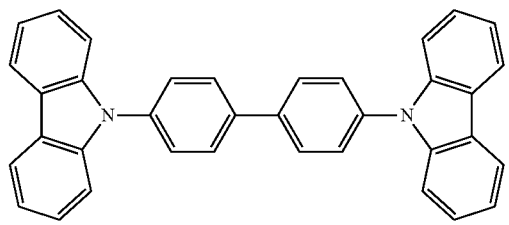

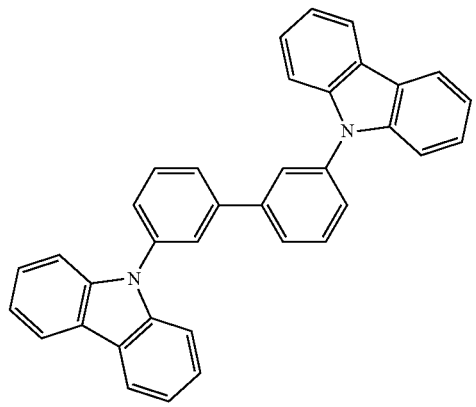

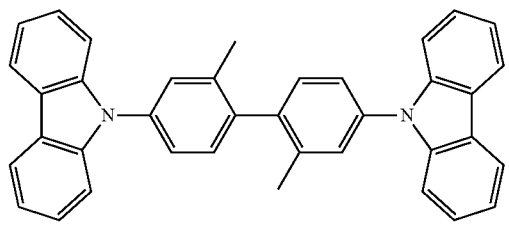

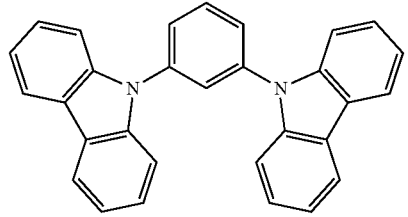

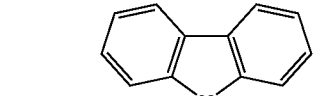

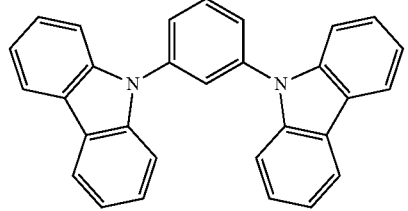

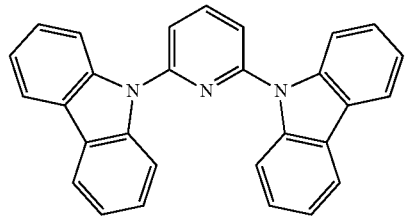

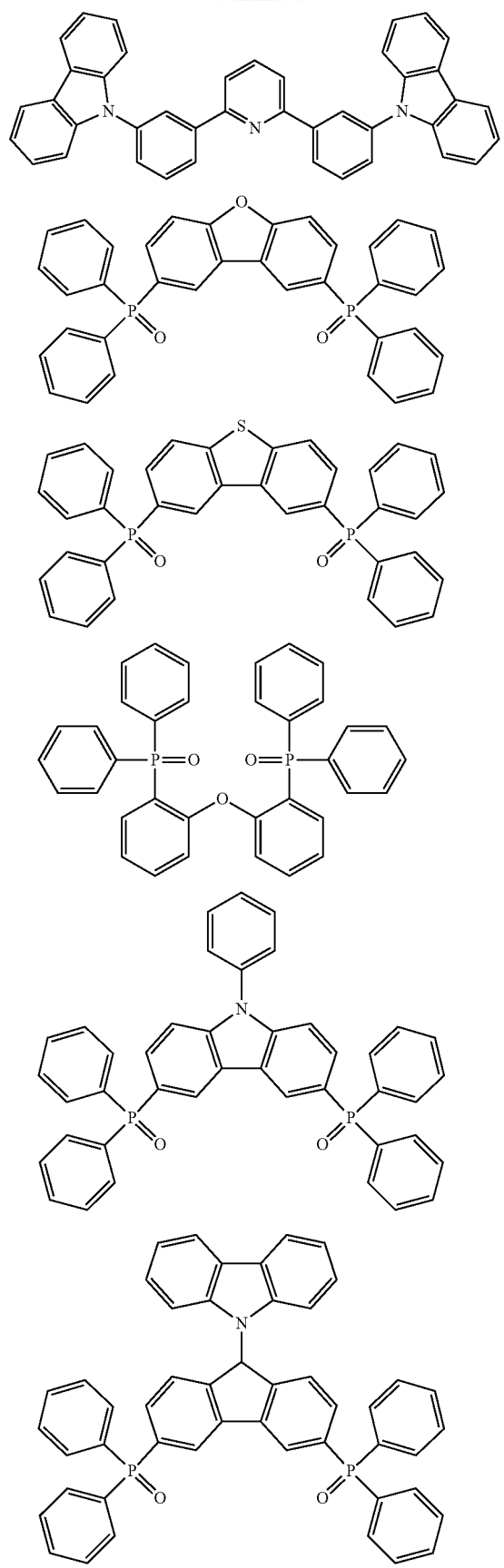
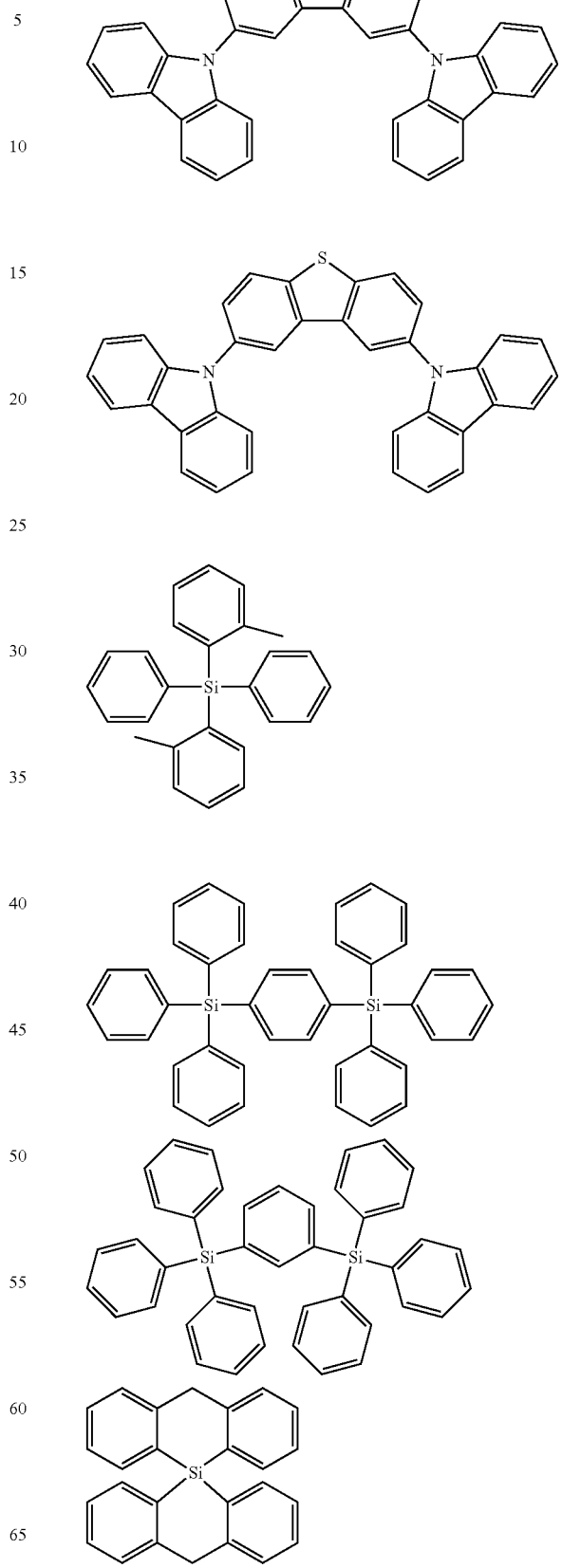

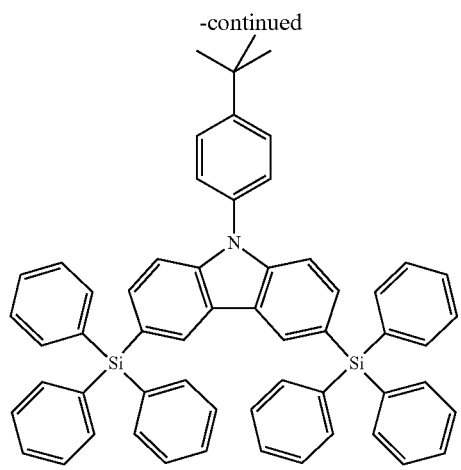
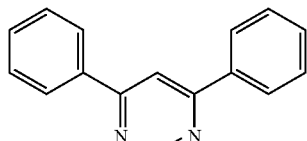
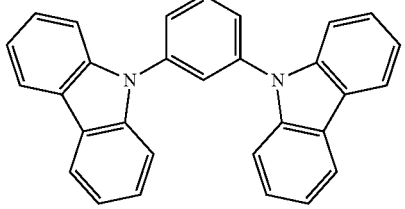
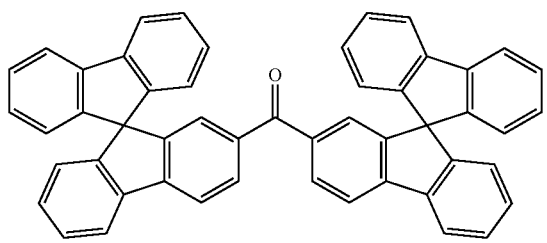
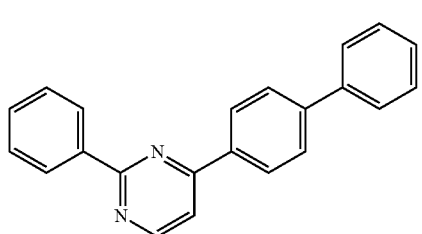
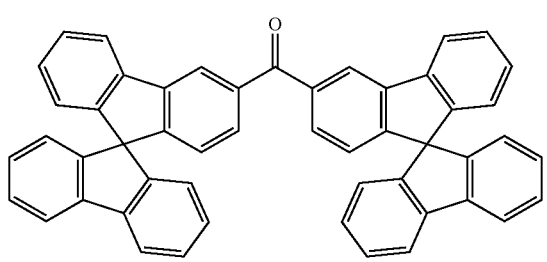
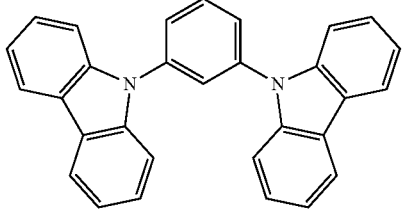
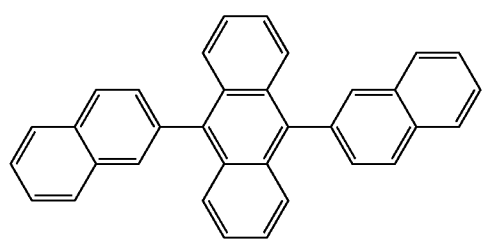
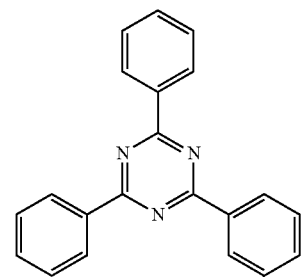
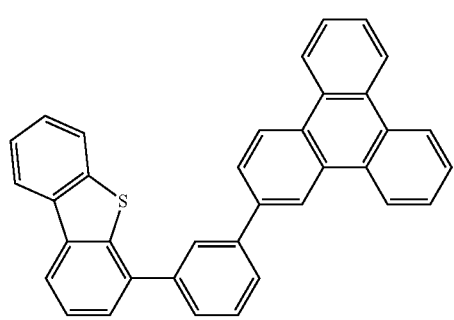
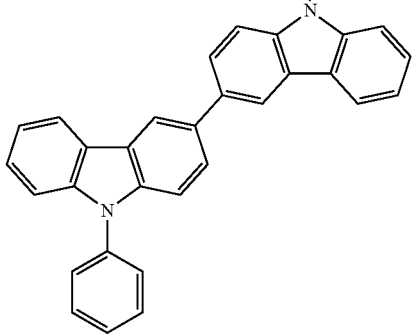

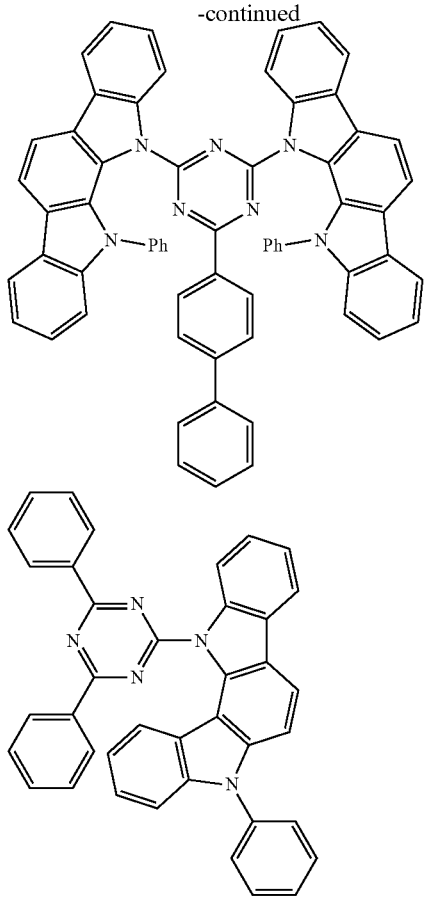

(Second Organic Compound and Third Organic Compound)

The second organic compound is a delayed fluorescent material having a smaller lowest excited singlet energy than the first organic compound and having a larger lowest excited single energy than the third organic compound. The second organic compound may be any compound capable of emitting delayed fluorescence under some condition, and the first organic light-emitting device of the present invention is not essentially required to emit delayed fluorescent light derived from the second organic compound. In the first organic light-emitting device of the present invention, the second organic compound receives energy from the first organic compound in an excited singlet state to transit to an excited singlet state. The second organic compound may also transit to an excited triplet state, after having received energy from the first organic compound in an excited triplet state. The second organic compound has a small $\Delta E_{ST}$, and therefore the second organic compound in an excited triplet state can readily undergo reverse intersystem crossing to the second organic compound in an excited singlet state. The second organic compound in an excited singlet state having occurred through the route gives energy to the third organic compound to transit the third organic compound to an excited singlet state.

The third organic compound is a delayed fluorescent material having a smaller lowest excited singlet energy than the first organic compound and the second organic compound. The third organic compound may be any compound capable of emitting delayed fluorescence under some condition, and the first organic light-emitting device of the present invention emits delayed fluorescence derived from the third organic compound. Emission from the third organic compound generally includes delayed fluorescence. The major part of emission from the first organic light-emitting device of the present invention is emission from the third organic compound. The third organic compound receives energy from the first organic compound and the second organic compound in an excited singlet state and from the second organic compound having been in an excited singlet state through reverse intersystem crossing from an excited triplet state, and thus transits to an excited singlet state. The third organic compound has a small $\Delta E_{ST}$, and therefore the third organic compound in an excited triplet state can readily undergo reverse intersystem crossing to the third organic compound in an excited singlet state. The excited singlet state having occurred through the routes thereafter emits fluorescence when returning back to a ground state. Not specifically limited, the delayed fluorescent material for use as the third organic compound may be any one capable of receiving energy from the first organic compound and the second organic compound to emit light. In preferred embodiments of the present invention, the second organic compound and the third organic compound are appropriately selected and combined in such a manner that the emission wavelength region of the second organic compound and the absorption wavelength region of the third organic compound can overlap. Especially preferably, the edge on the long wavelength side of the emission spectrum of the second organic compound overlaps with the edge on the short wavelength side of the absorption spectrum of the third organic compound.

For the second organic compound and the third organic compound, known delayed fluorescent materials can be used. Even unknown delayed fluorescent materials can also be used for those compounds.

Preferred delayed fluorescent materials are compounds included in the general formulae described in WO2013/154064, paragraphs 0008 to 0048 and 0095 to 0133; WO2013/011954, paragraphs 0007 to 0047 and 0073-0085; WO2013/011955, paragraphs 0007 to 0033 and 0059 to 0066; WO2013/081088, paragraphs 0008 to 0071 and 0118 to 0133; JP 2013-256490 A, paragraphs 0009 to 0046 and 0093 to 0134; JP 2013-116975 A, paragraphs 0008 to 0020 and 0038 to 0040; WO2013/133359, paragraphs 0007 to 0032 and 0079 to 0084; WO2013/161437, paragraphs 0008 to 0054 and 0101-0121; JP 2014-9352 A, paragraphs 0007 to 0041 and 0060 to 0069; and JP 2014-9224 A, paragraphs 0008 to 0048 and 0067 to 0076; JP 2017-119663 A, paragraphs 0013 to 0025; JP 2017-119664 A, paragraphs 0013 to 0026; JP 2017-222623 A, paragraphs 0012 to 0025; JP 2017-226838 A, paragraphs 0010 to 0050; JP 2018-100411 A, paragraphs 0012 to 0043; WO2018/047853, paragraphs 0016 to 0044; and exemplary compounds therein capable of emitting delayed fluorescence are especially preferred. In addition, light-emitting materials capable of emitting delayed fluorescence, as described in JP 2013-253121 A, WO2013/133359, WO2014/034535, WO2014/115743, WO2014/122895, WO2014/126200, WO2014/136758, WO2014/133121, WO2014/136860, WO2014/196585, WO2014/189122, WO2014/168101, WO2015/008580, WO2014/203840, WO2015/002213, WO2015/016200, WO2015/019725, WO2015/072470, WO2015/108049, WO2015/080182, WO2015/072537, WO2015/080183, JP 2015-129240 A, WO2015/129714, WO2015/129715, WO2015/133501, WO2015/136880, WO2015/137244, WO2015/137202, WO2015/137136, WO2015/146541 and WO2015/159541, are also preferably employed. These patent publications described in this paragraph are hereby incorporated as a part of this description by reference.

Compounds capable of emitting delayed fluorescence and represented by the following general formula (1) can be preferably used as the delayed fluorescent material in the present invention. In preferred embodiments of the present invention, the compounds represented by the general formula (1) can be used as both the second organic compound and the third organic compound.

General Formula (1)

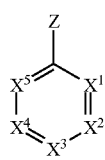

In the general formula (1), $X^1$ to $X^5$ each represent N or C—R. R represents a hydrogen atom or a substituent. When two or more of $X^1$ to $X^5$ each are C—R, these (C—R)s may be the same or different. However, at least one of $X^1$ to $X^5$ is C-D (where D means a donor group). When all of $X^1$ to $X^5$ are (C—R)s, Z represents an acceptor group; when at least one of $X^1$ to $X^5$ is N, Z represents a hydrogen atom or a substituent.

Among the compounds represented by the general formula (1), especially preferred compounds are those represented by the following general formula (2).

General Formula (2)

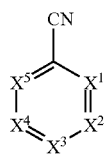

In the general formula (2), $X^1$ to $X^5$ each represent N or C—R. R represents a hydrogen atom or a substituent. When two or more of $X^1$ to $X^5$ each are C—R, these (C—R)s may be the same or different. However, at least one of $X^1$ to $X^5$ is C-D (where D means a donor group).

Regarding the description and the preferred range of the substituent that Z in the general formula (1) represents, reference may be made to the description and the preferred range of the substituent of the general formula (7) to be mentioned hereinunder. The acceptor group that Z in the general formula (1) represents is a group that has a property to give an electron to the ring to which Z bonds, and, for example, can be selected from groups having a positive Hammett's $\sigma_p$ value. The donor group that D in the general formula (1) and the general formula (2) represents is a group that has a property to draw an electron from the ring to which D bonds, and, for example, can be selected from groups having a negative Hammett's $\sigma_p$ value. Hereinunder the acceptor group may be represented by A.

Here, "Hammett's $\sigma_p$ value" is one propounded by L. P. Hammett, and is one to quantify the influence of a substituent on the reaction rate or the equilibrium of a para-substituted benzene derivative. Specifically, the value is a constant ($\sigma_p$) peculiar to the substituent in the following equation that is established between a substituent and a reaction rate constant or an equilibrium constant in a para-substituted benzene derivative:

$$\log(k/k_0) = \rho \sigma_p$$

or $$\log(K/K_0) = \rho \sigma p$$

In the above equations, k represents a rate constant of a benzene derivative not having a substituent; $k_0$ represents a rate constant of a benzene derivative substituted with a substituent; K represents an equilibrium constant of a benzene derivative not having a substituent; $K_0$ represents an equilibrium constant of a benzene derivative substituted with a substituent; p represents a reaction constant to be determined by the kind and the condition of reaction. Regarding the description relating to the "Hammett's $\sigma_p$ value" and the numerical value of each substituent, reference may be made to the description relating to $\sigma_p$ value in Hansch, C. et. al., Chem. Rev., 91, 165-195 (1991).

In the general formula (1) and the general formula (2), $X^1$ to $X^5$ each represent N or C—R, and at least one is C-D. The number of Ns among $X^1$ to $X^5$ is 0 to 4, and for example, there can be exemplified cases where N is $X^1$ and $X^3$ and $X^5$, $X^1$ and $X^3$, $X^1$ and $X^4$, $X^2$ and $X^3$, $X^1$ and $X^5$, $X^2$ and $X^4$, $X^1$ alone, $X^2$ alone, or $X^3$ alone. The number of (C-D)s among $X^1$ to $X^5$ is 1 to 5, preferably 2 to 5. For example, there can be exemplified cases where (C-D) is $X^1$ and $X^2$ and $X^3$ and $X^4$ and $X^5$, $X^1$ and $X^2$ and $X^4$ and $X^5$, $X^1$ and $X^2$ and $X^3$ and $X^4$, $X^1$ and $X^3$ and $X^4$ and $X^5$, $X^1$ and $X^3$ and $X^5$, $X^1$ and $X^2$ and $X^5$, $X^1$ and $X^2$ and $X^4$, $X^1$ and $X^3$ and $X^4$, $X^1$ and $X^3$, $X^1$ and $X^4$, $X^2$ and $X^3$, $X^1$ and $X^5$, $X^2$ and $X^4$, $X^1$ alone, $X^2$ alone, or $X^3$ alone. At least one of $X^1$ to $X^5$ may be C-A. Here, A represents an acceptor group. The number of (C-A)s among $X^1$ to $X^5$ is preferably 0 to 2, more preferably 0 or 1. A in C-A is preferably a cyano group. $X^1$ to $X^5$ each may be independently C-D or C-A.

When neighboring two of $X^1$ to $X^5$ are (C—R)s, the two R's may bond to each other to form a cyclic structure. The cyclic structure to be formed by the two bonding to each other may be an aromatic ring or an aliphatic ring, and may contain a hetero atom. Further, the cyclic structure may also be a condensed ring of two or more rings. Here, the hetero ring is preferably selected from the group consisting of a nitrogen atom, an oxygen atom and a sulfur atom. Examples of the cyclic structure to be formed include a benzene ring, a naphthalene ring, a pyridine ring, a pyridazine ring, a pyrimidine ring, a pyrazine ring, a pyrrole ring, an imidazole ring, a pyrazole ring, an imidazoline ring, an oxazole ring, an isoxazole ring, a thiazole ring, an isothiazole ring, a cyclohexadiene ring, a cyclohexene ring, a cyclopentaene ring, a cycloheptatriene ring, a cycloheptadiene ring, a cycloheptaene ring, a furan ring, a thiophene ring, a naphthyridine ring, a quinoxaline ring, and a quinoline ring. For example, a condensed ring of many rings, such as a triphenylene, may also be formed.

The donor group D in the general formula (1) and the general formula (2) is, for example, preferably a group represented by the following general formula (3).

General Formula (3)

$$\begin{array}{c} R^{11} \\ \diagdown \\ N\text{—}L\text{—}* \\ \diagup \\ R^{12} \end{array}$$

In the general formula (3), $R^{11}$ and $R^{12}$ each independently represent a substituted or unsubstituted alkyl group, a substituted or unsubstituted alkenyl group, a substituted or unsubstituted aryl group, or a substituted or unsubstituted heteroaryl group. $R^{11}$ and $R^{12}$ may bond to each other to form a cyclic structure. L represents a single bond, a substituted or unsubstituted arylene group, or a substituted or unsubstituted heteroarylene group. The substituent that may be introduced into the arylene group or the heteroarylene group of L may be a group represented by the general formula (1) or the general formula (2), or a group represented by any of the general formulae (3) to (6) to be mentioned hereinunder. The groups represented by these (1) to (6) may be introduced into L up to the largest number of substituents that can be introduced thereinto. In the case where multiple groups of the general formulae (1) to (6) are introduced, these substituents may be the same as or different from each other. * indicates a bonding position to the carbon atom (C) constituting a ring skeleton of the ring in the general formula (1) or the general formula (2).

The "alkyl group" as referred to herein may be any of a linear, branched or cyclic one. The group may have two or more kinds of a linear moiety, a cyclic moiety and a branched moiety as combined. The carbon number of the alkyl group may be, for example, 1 or more, 2 or more, or 4 or more. The carbon number may be 30 or less, 20 or less, 10 or less, 6 or less, or 4 or less. Specific examples of the alkyl group include a methyl group, an ethyl group, an n-propyl group, an isopropyl group, an n-butyl group, an isobutyl group, a tert-butyl group, an n-pentyl group, an isopentyl group, an n-hexyl group, an isohexyl group, a 2-ethylhexyl group, an n-heptyl group, an isoheptyl group, an n-octyl group, an isooctyl group, an n-nonyl group, an isononyl group, an n-decanyl group, an isodecanyl group, a cyclopentyl group, a cyclohexyl group, and a cycloheptyl group. The alkyl group to be a substituent may be further substituted with an aryl group.

The "alkyl group" as referred to herein may be any of a linear, branched or cyclic one. The group may have two or more kinds of a linear moiety, a cyclic moiety and a branched moiety as combined. The carbon number of the alkenyl group may be, for example, 2 or more, or 4 or more. The carbon number may be 30 or less, 20 or less, 10 or less, 6 or less, or 4 or less. Specific examples of the alkenyl group include an ethenyl group, an n-propenyl group, an isopropenyl group, an n-butenyl group, an isobutenyl group, an n-pentenyl group, an isopentenyl group, an n-hexenyl group, an isohexenyl group, and a 2-ethylhexenyl group. The alkenyl group to be a substituent may be further substituted with an aryl group.

The "aryl group" and the "heteroaryl group" each may be a single ring or may be a condensed ring of two or more rings. In the case of a condensed ring, the number of the rings that are condensed is preferably 2 to 6, and, for example, can be selected from 2 to 4. Specific examples of the ring include a benzene ring, a pyridine ring, a pyrimidine ring, a triazine ring, a naphthalene ring, an anthracene ring, a phenanthrene ring, a triphenylene ring, a quinoline ring, a pyrazine ring, a quinoxaline ring, and a naphthyridine ring. Specific examples of the arylene ring or the heteroarylene ring include a phenyl group, a 1-naphthyl group, a 2-naphthyl group, a 1-anthracenyl group, a 2-anthracenyl group, a 9-anthracenyl group, a 2-pyridyl group, a 3-pyridyl group, and a 4-pyridyl group.

The substituent means a monovalent group capable of substituting for a hydrogen atom, and is not a concept to include condensation. Regarding the description and the preferred range of the substituent, reference may be made to the description and the preferred range of the substituent of the general formula (7) to be mentioned hereinunder.

The compound represented by the general formula (3) is preferably a compound of any of the following general formulae (4) to (6).

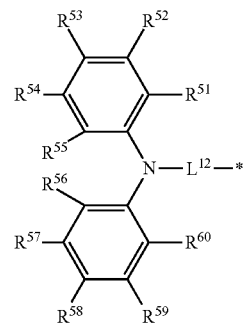

General Formula (4)

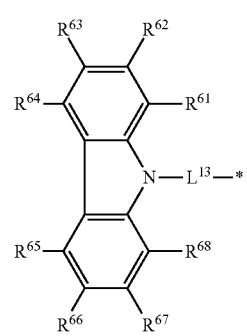

General Formula (5)

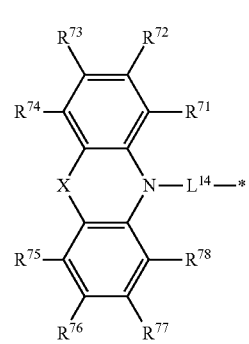

General Formula (6)

In the general formulae (4) to (6), $R^{5'}$ to $R^{60}$, $R^{61}$ to $R^{68}$, and $R^{7'}$ to $R^{78}$ each independently represent a hydrogen atom or a substituent. Regarding the description and the preferred range of the substituent as referred to herein, reference may be made to the description and the preferred range of the substituent in the general formula (7) to be mentioned hereinunder. Preferably, $R^{51}$ to $R^{60}$, $R^{61}$ to $R^{68}$, and $R^{71}$ to $R^{78}$ each independently represent a group represented by any of the above-mentioned general formulae (4) to (6). The number of the substituents in the general formulae (4) to (6) is not specifically limited. Also preferred is a case where all are unsubstituted (that is, all are hydrogen atoms). In the case where the general formulae (4) to (6) each have two or more substituents, those substituents may be the same as or different from each other. In the case where the general formulae (4) to (6) each have a substituent, the substituent is preferably any of $R^{52}$ to $R^{59}$ in the general formula (4), or any of $R^{62}$ to $R^{67}$ in the general formula (5), or any of $R^{72}$ to $R^{77}$ in the general formula (6).

In the general formulae (4) to (6), $R^{51}$ and $R^{52}$, $R^{52}$ and $R^{53}$, $R^{53}$ and $R^{54}$, $R^{54}$ and $R^{55}$, $R^{55}$ and $R^{56}$, $R^{56}$ and $R^{57}$, $R^{57}$ and $R^{58}$, $R^{58}$ and $R^{59}$, $R^{59}$ and $R^{60}$, $R^{61}$ and $R^{62}$, $R^{62}$ and $R^{63}$, $R^{63}$ and $R^{64}$, $R^{65}$ and $R^{66}$, $R^{66}$ and $R^{67}$, $R^{67}$ and $R^{68}$, $R^{71}$ and $R^{72}$, $R^{72}$ and $R^{73}$, $R^{73}$ and $R^{74}$, $R^{75}$ and $R^{76}$, $R^{76}$ and $R^{77}$, and $R^{77}$ and $R^{78}$ each may bond to each other to form a cyclic structure. Regarding the description and preferred examples of the cyclic structure, reference may be made to the description and the preferred examples of the cyclic structure in $X^1$ to $X^5$ in the general formula (1) and the general formula (2) mentioned above.

In the general formula (6), X represents an oxygen atom, a sulfur atom, a substituted or unsubstituted nitrogen atom, a substituted or unsubstituted carbon atom, a substituted or unsubstituted silicon atom or a carbonyl group, which is divalent and which has a linking chain length of one atom, or represents a substituted or unsubstituted ethylene group, a substituted or unsubstituted vinylene group, a substituted or unsubstituted o-arylene group or a substituted or unsubstituted o-heteroarylene group, which is divalent and which has a bonding chain length of two atoms. Regarding specific examples and the preferred range of the substituent, reference may be made to the description of the substituent in the general formula (1) and the general formula (2) mentioned above.

In the general formulae (4) to (6), $L^{12}$ to $L^{14}$ each independently represent a single bond, a substituted or unsubstituted arylene group, or a substituted or unsubstituted heteroarylene group. Regarding the description and the preferred range of the arylene group or the heteroarylene group that $L^{12}$ to $L^{14}$ represent, reference may be made to the description and the preferred range of the arylene group and the heteroarylene group that L represents. Preferably, $L^{12}$ to $L^{14}$ each are a single bond, or a substituted or unsubstituted arylene group. Here, the substituent for the arylene group or the heteroarylene group may be a group represented by the general formulae (1) to (6). The groups represented by the general formulae (1) to (6) may be introduced into $L^{11}$ to $L^{14}$ up to the largest number of substituents that can be introduced thereinto. In the case where multiple groups of the general formulae (1) to (6) are introduced, these substituents may be the same as or different from each other. * indicates a bonding position to the carbon atom (C) constituting a ring skeleton of the ring in the general formula (1) or the general formula (2).

In the present invention, a compound capable of emitting delayed fluorescence and represented by the following general formula (7) is especially preferably used as the delayed fluorescent material. In a preferred embodiment of the present invention, a compound represented by the general formula (7) can be employed both as the second organic compound and the third organic compound. Especially preferably, both the second organic compound and the third organic compound are compounds each containing a dicyanobenzene structure.

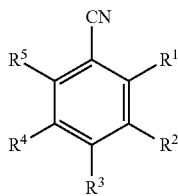

General Formula (7)

In the general formula (7), 0 to 4 of $R^1$ to $R^5$ each represent a cyano group, at least one of $R^1$ to $R^5$ represents a substituted amino group, and the remaining $R^1$ to $R^5$ each are a hydrogen atom, or a substituent except a cyano group and a substituted amino group.

Here, the substituted amino group is preferably a substituted or unsubstituted diarylamino group, and the two aryl groups constituting the substituted or unsubstituted diarylamino group may bond to each other. The bonding may be made by a single bond (in the case, a carbazole ring is formed), or may be made via a linking group of —O—, —S—, —N($R^6$)—, —C($R^7$)($R^8$)—, or —Si($R^9$)($R^{10}$)—. $R^6$ to $R^{10}$ each represent a hydrogen atom or a substituent, and $R^7$ and $R^8$, and $R^9$ and $R^{10}$ each may bond to form a cyclic structure.

A substituted amino group may be any of $R^1$ to $R^5$, and for example, $R^1$ and $R^2$, $R^1$ and $R^3$, $R^1$ and $R^4$, $R^1$ and $R^5$, $R^2$ and $R^3$, $R^2$ and $R^4$, $R^1$ and $R^2$ and $R^3$, $R^1$ and $R^2$ and $R^4$, $R^1$ and $R^2$ and $R^5$, $R^1$ and $R^3$ and $R^4$, $R^1$ and $R^3$ and $R^5$, $R^2$ and $R^3$ and $R^4$, $R^1$ and $R^2$ and $R^3$ and $R^4$, $R^1$ and $R^2$ and $R^3$ and $R^5$, $R^1$ and $R^2$ and $R^4$ and $R^5$, and $R^1$ and $R^2$ and $R^3$ and $R^4$ and $R^5$ each may be a substituted amino group. A cyano group may be any of $R^1$ to $R^5$, and for example, $R^1$, $R^2$, $R^3$, $R^9$ and $R^2$, $R^1$ and $R^3$, $R^1$ and $R^4$, $R^1$ and $R^5$, $R^2$ and $R^3$, $R^2$ and $R^4$, $R^1$ and $R^2$ and $R^3$, $R^1$ and $R^2$ and $R^4$, $R^1$ and $R^2$ and $R^5$, $R^1$ and $R^3$ and $R^4$, $R^1$ and $R^3$ and $R^5$, and $R^2$ and $R^3$ and $R^4$ each may be a cyano group.

$R^1$ to $R^5$ that are neither a cyano group nor a substituted amino group each represent a hydrogen atom or a substituent. As examples of the substituent, there is mentioned a substituent group A, including a hydroxy group, a halogen atom (e.g., fluorine atom, chlorine atom, bromine atom, iodine atom), an alkyl group (for example, having 1 to 40 carbon atoms), an alkoxy group (for example, having 1 to 40 carbon atoms), an alkylthio group (for example, having 1 to 40 carbon atoms), an aryl group (for example, having 6 to 30 carbon atoms), an aryloxy group (for example, having 6 to 30 carbon atoms), an arylthio group (for example, having 6 to 30 carbon atoms), a heteroaryl group (in which the number of the ring skeleton constituting carbon atoms is, for example, 5 to 30), a heteroaryloxy group (in which the number of the ring skeleton constituting carbon atoms is, for example, 5 to 30), a heteroarylthio group (in which the number of the ring skeleton constituting carbon atoms is, for example, 5 to 30), an acyl group (for example, having 1 to 40 carbon atoms), an alkenyl group (for example, having 1 to 40 carbon atoms), an alkynyl group (for example, having 1 to 40 carbon atoms), an alkoxycarbonyl group (for example, having 1 to 40 carbon atoms), an aryloxycarbonyl group (for example, having 1 to 40 carbon atoms), a heteroaryloxycarbonyl group (for example, having 1 to 40 carbon atoms), a silyl group (for example, a trialkylsilyl group having 1 to 40 carbon atoms), a nitro group, and groups listed herein and further substituted with one or more groups listed herein. Also as preferred examples of the substituent for the substituted aryl group of the diarylamino group, there is mentioned the substituent group A, and in addition, a cyano group and a substituted amino group are further mentioned.

Regarding the compound group and the specific examples of the compounds included in the general formula (7), reference may be made to WO2013/154064, paragraphs 0008 to 0048; WO2015/080183, paragraphs 0009 to 0030; WO2015/129715, paragraphs 0006 to 0019; JP 2017-119663 A, paragraphs 0013 to 0025; and JP 2017-119664, paragraphs 0013 to 0026. These patent publications are hereby incorporated as a part of this description by reference. Above all, in particular, the following compounds are listed as specific examples of preferred compounds. In the following structural formulae, Me represents a methyl group, a t-Bu represents a tert-butyl group, and pH represents a phenyl group. Unless otherwise specifically indicated, R represents a hydrogen atom or a substituent, and the substituent is a methyl group, a tert-butyl group, a phenyl group, or a carbazolyl group.
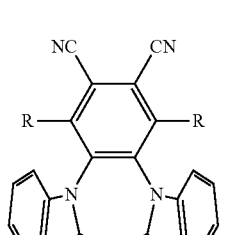
4CzPN: R = carbazolyl
2CzPN: R = H
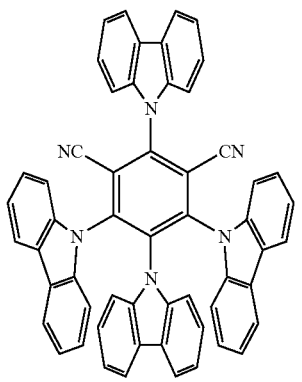
4CzIPN
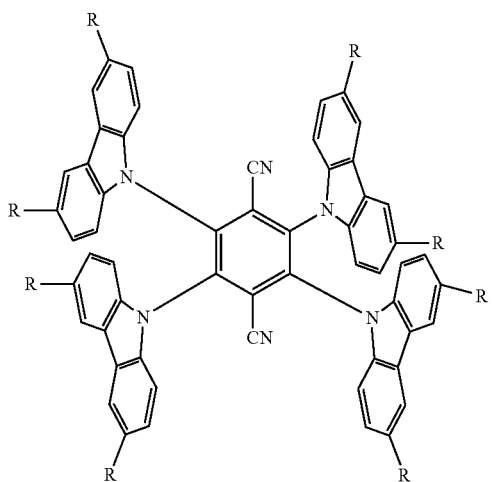
4CzTPN: R = H
4CzTPN-Me: R = Me
4CzTPN-Ph: R = Ph
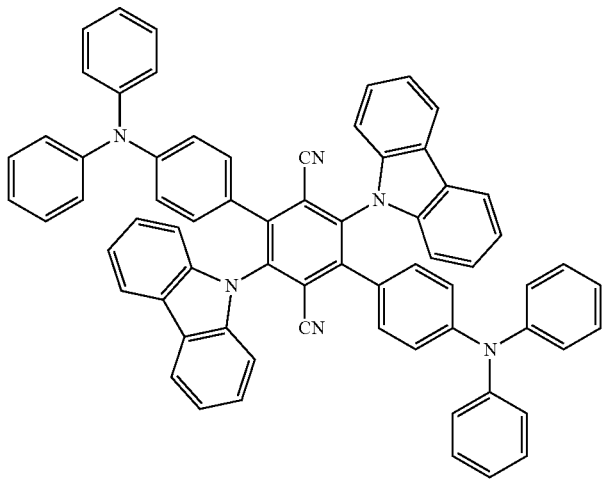
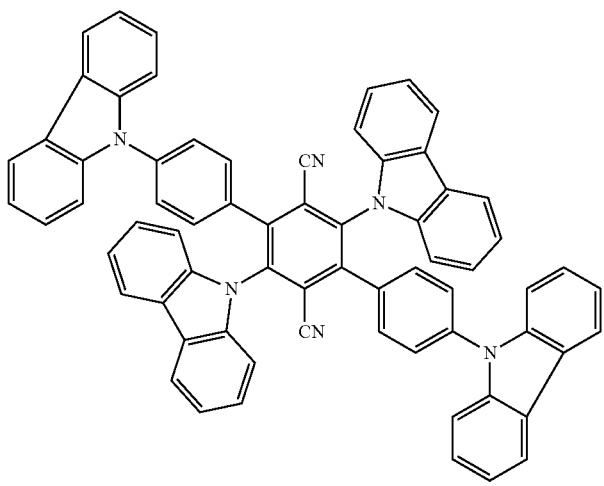

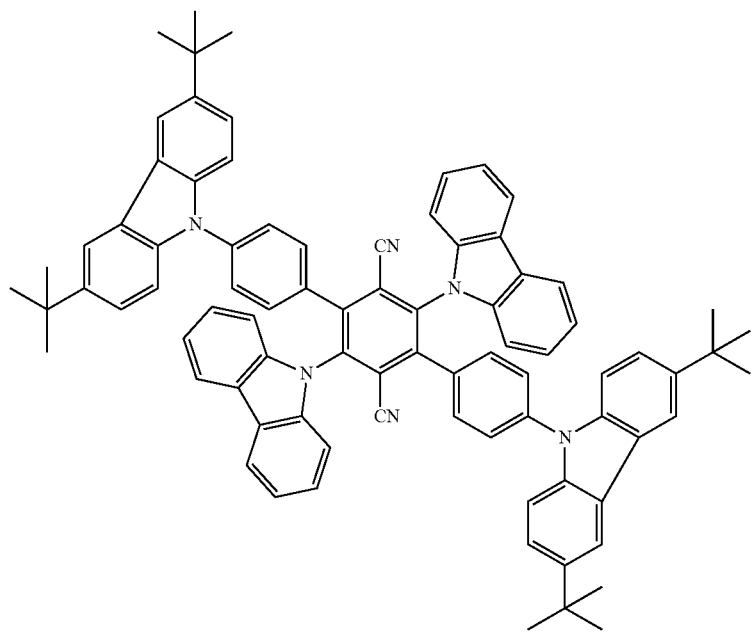
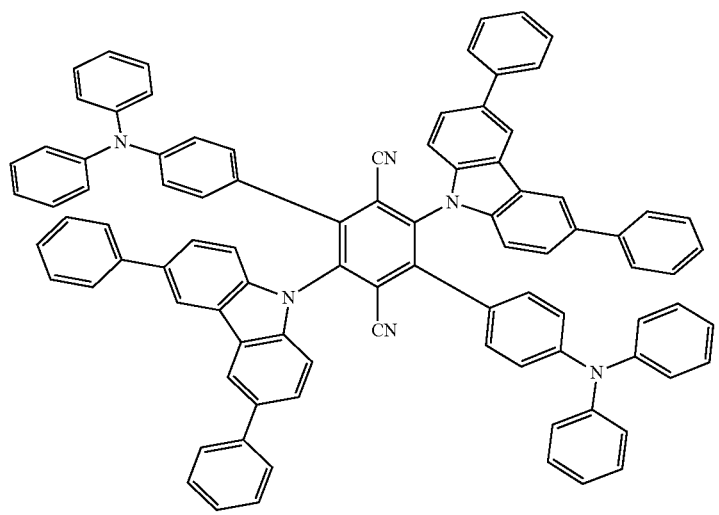
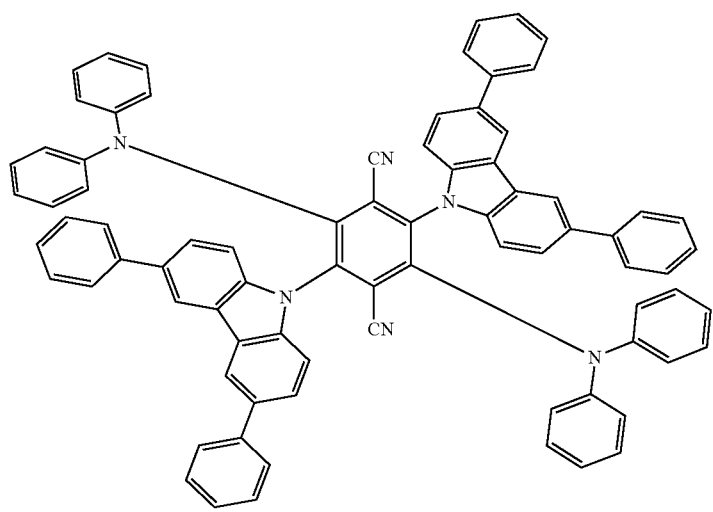

-continued
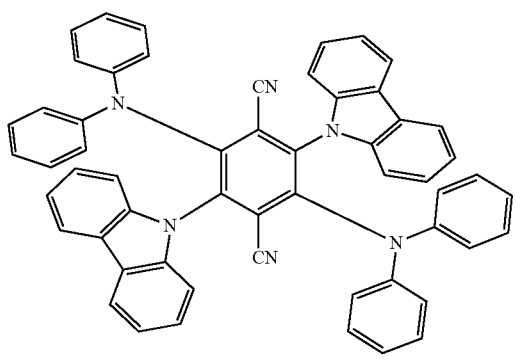
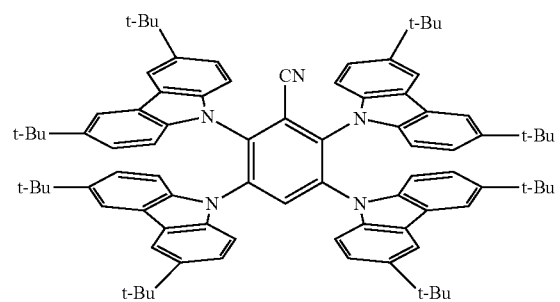
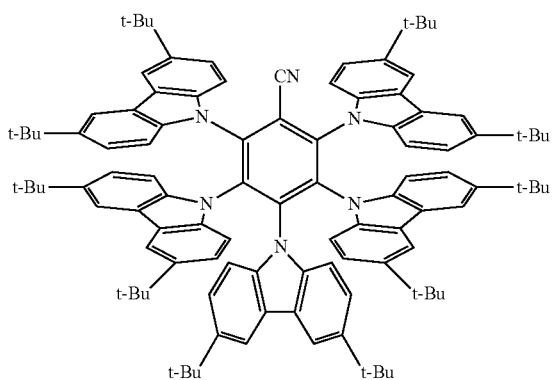
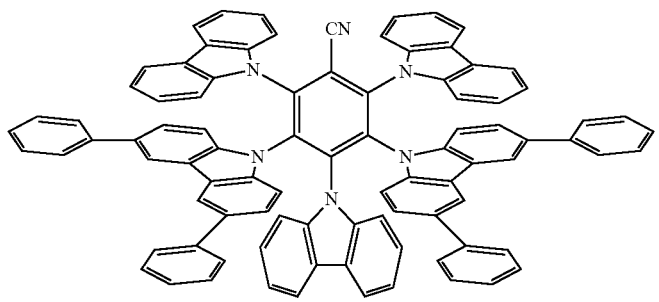
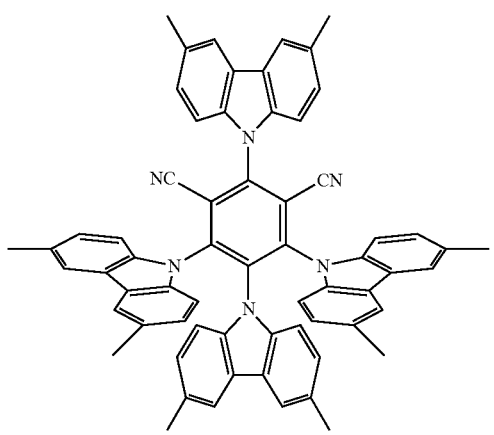
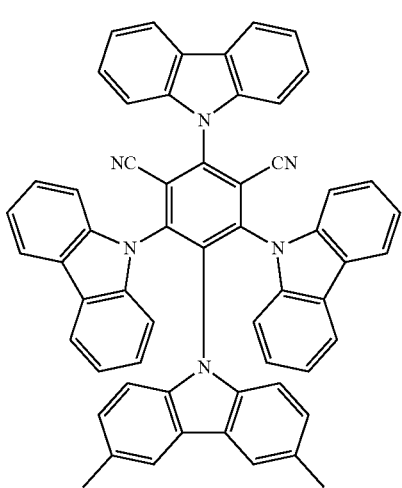

-continued
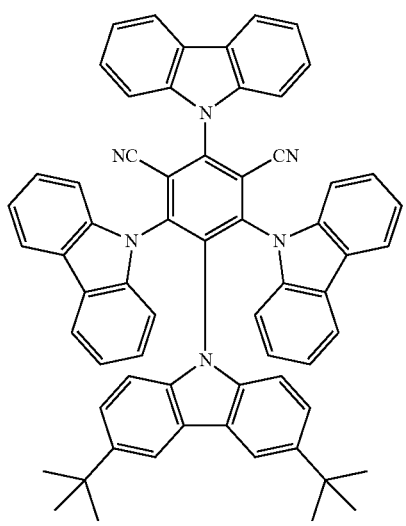
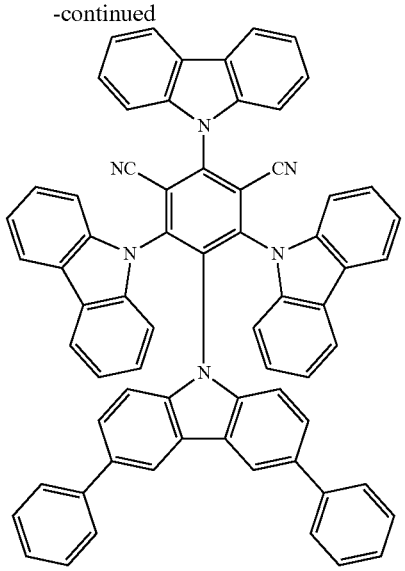
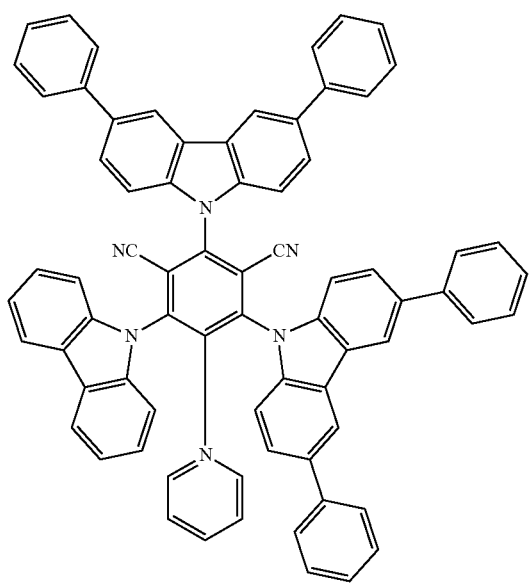
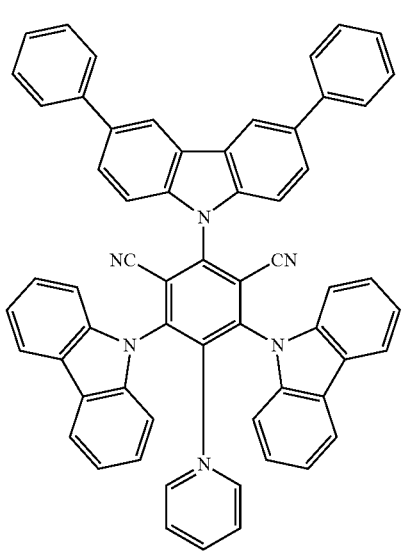
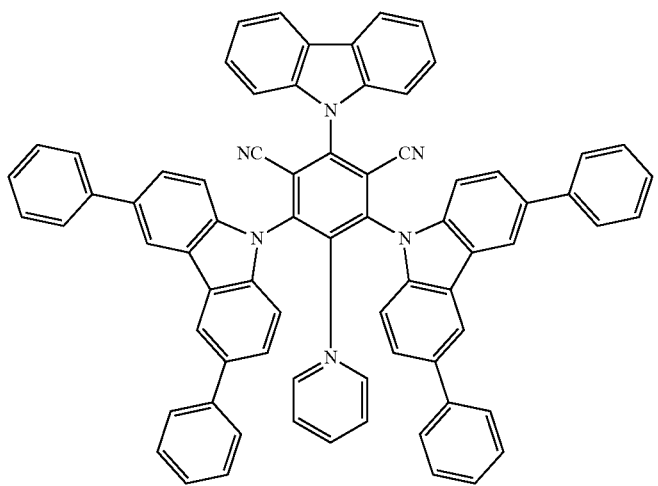

-continued
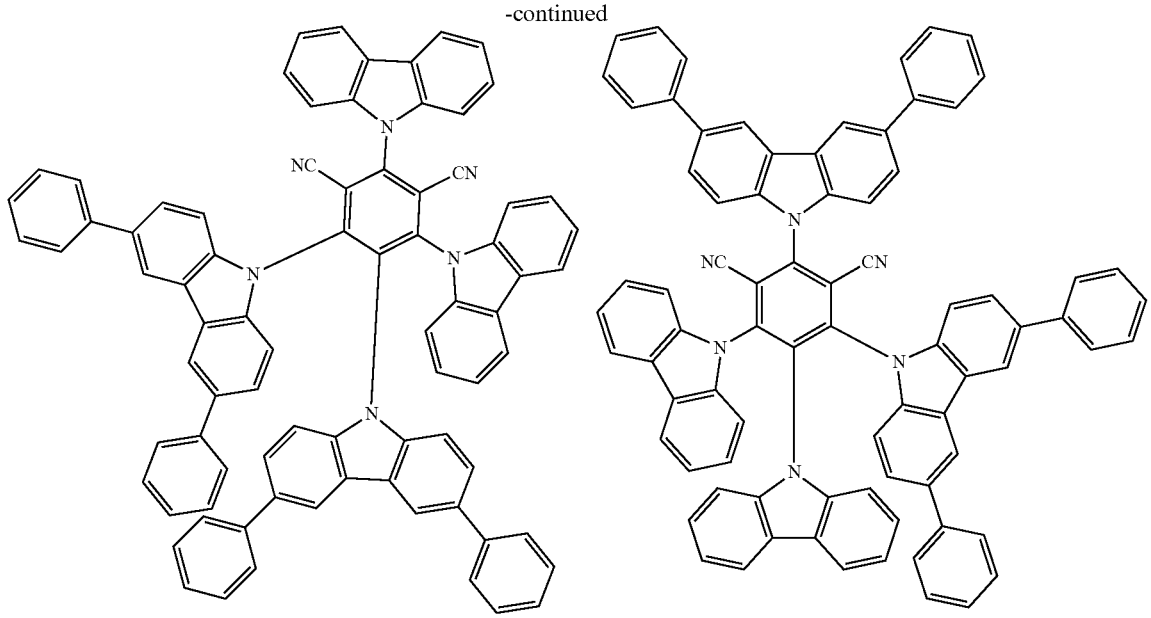
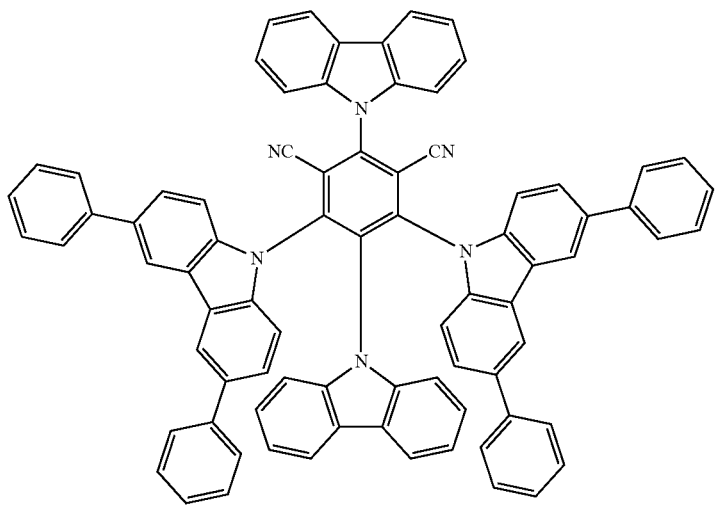
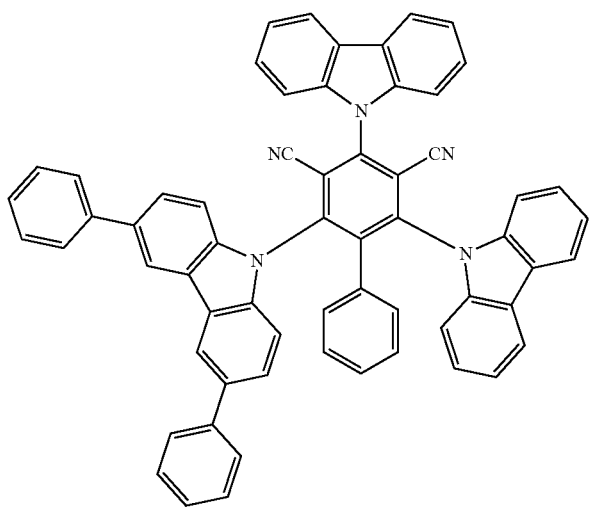

-continued
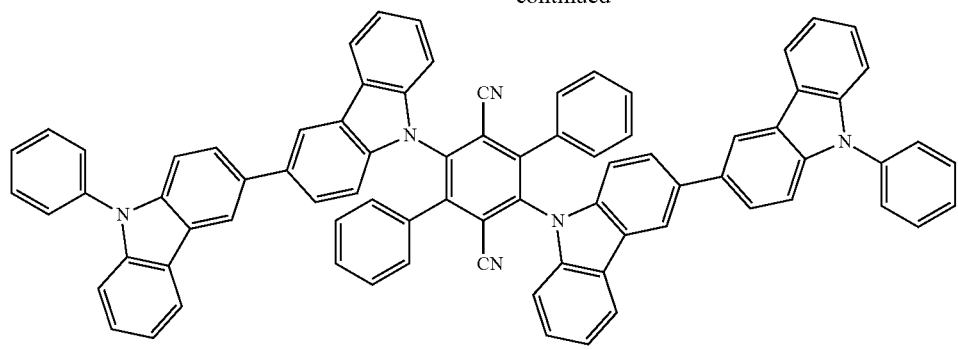
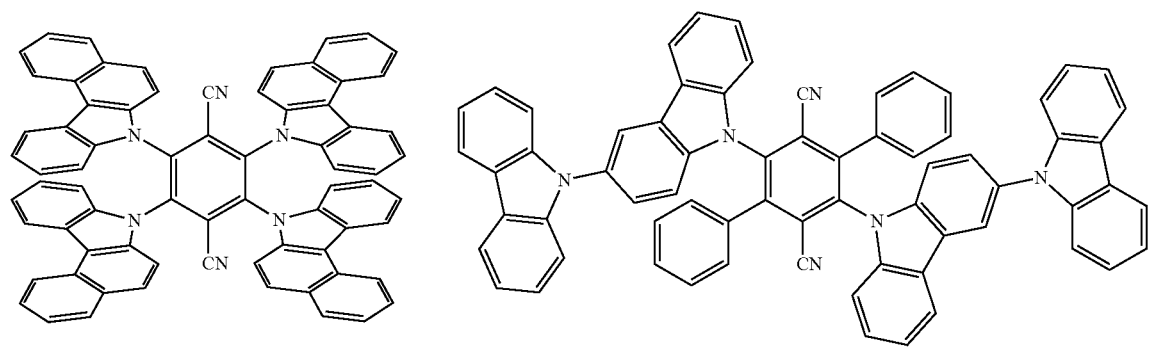
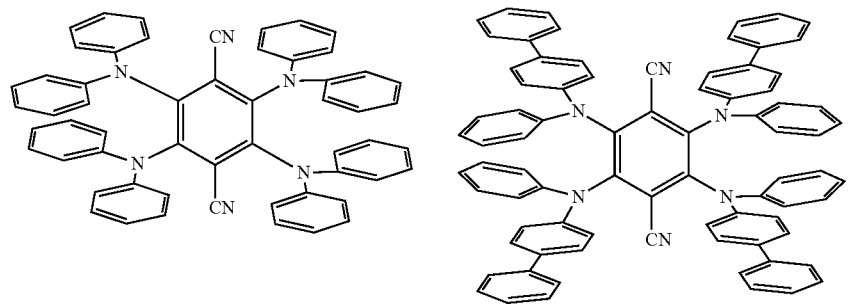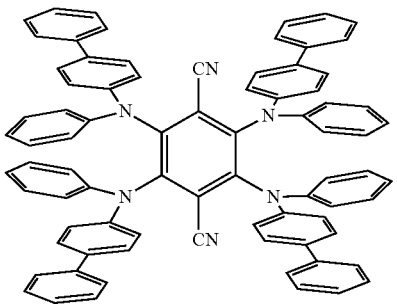
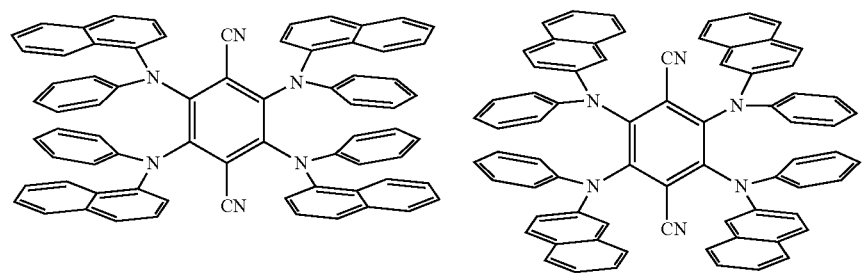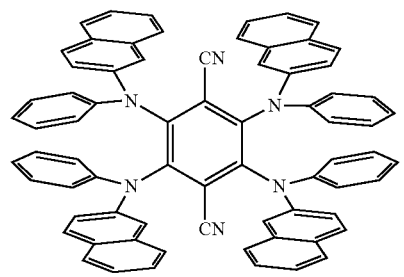
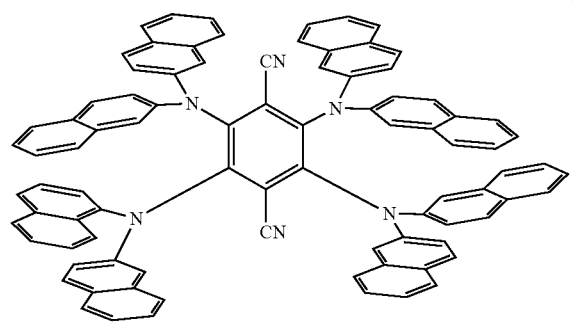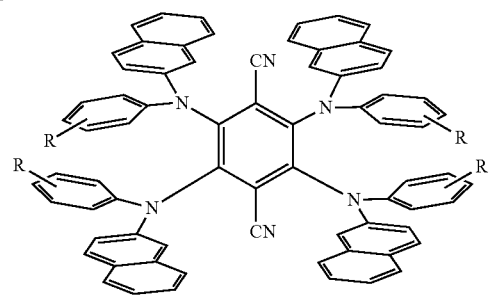

-continued
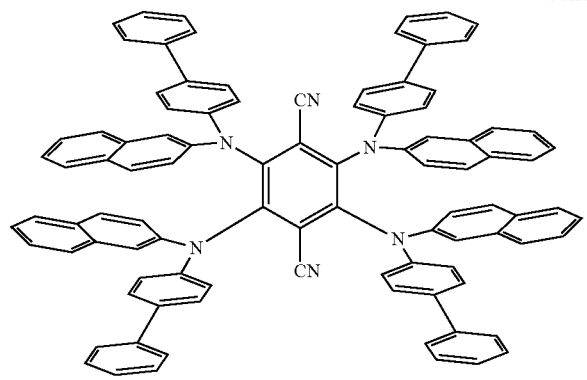
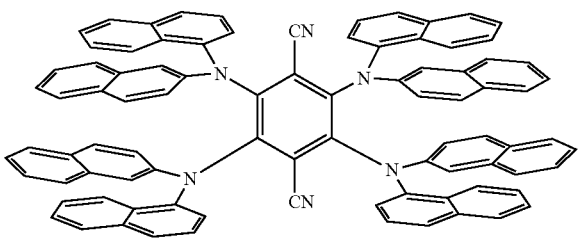
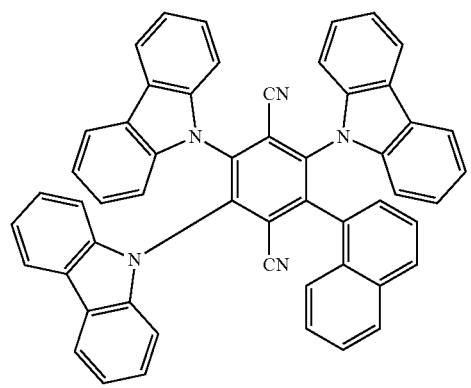
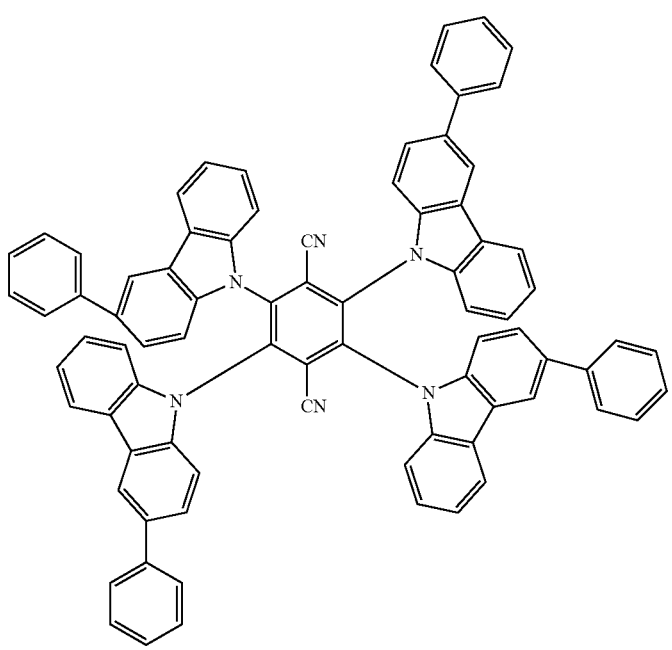
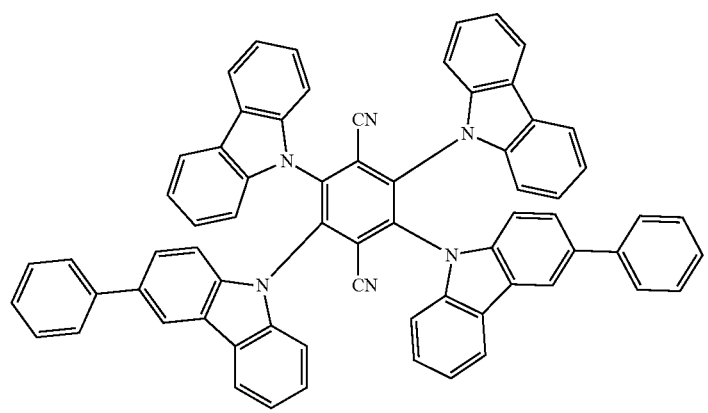

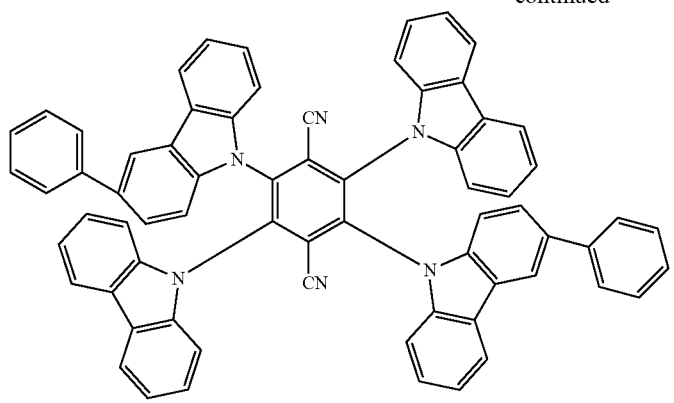
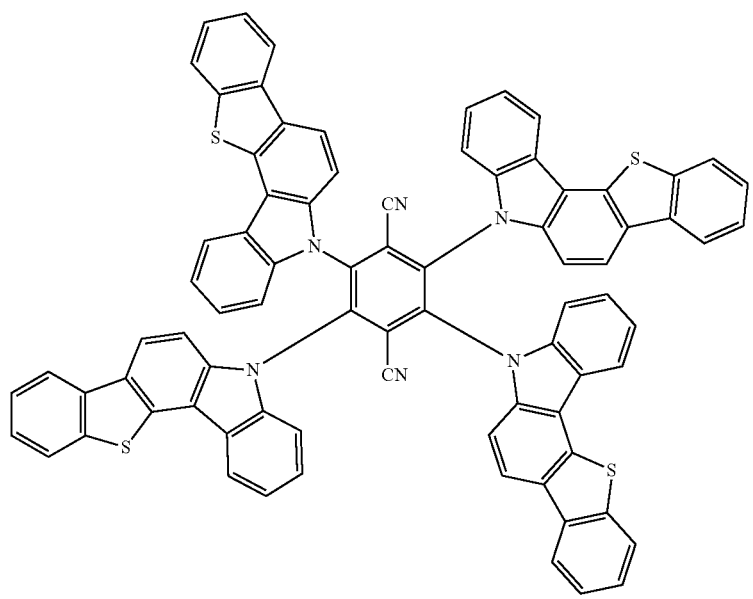
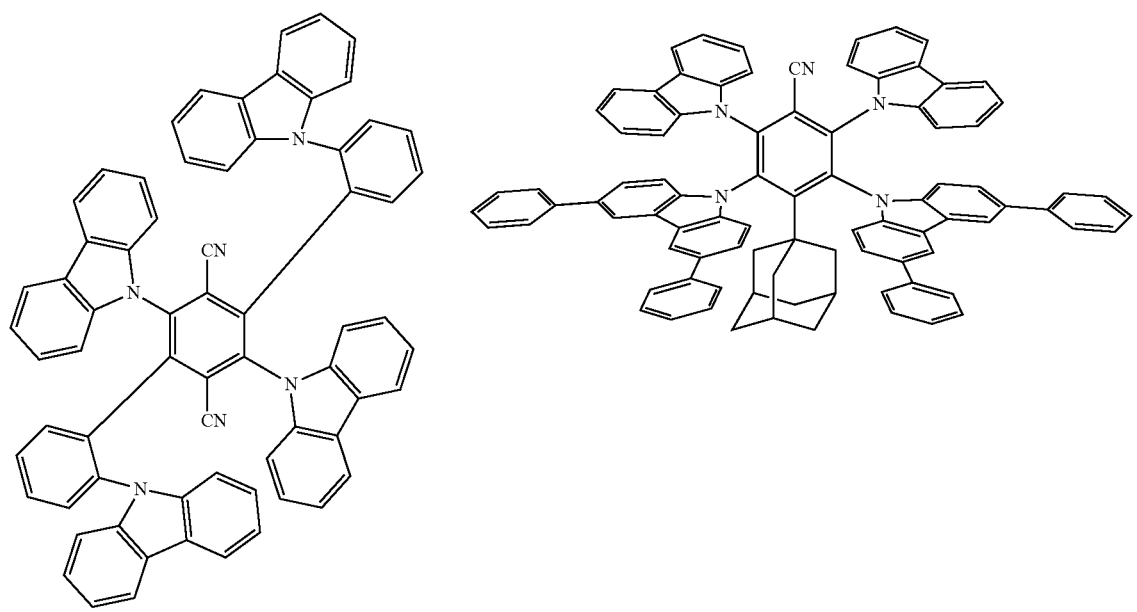

-continued
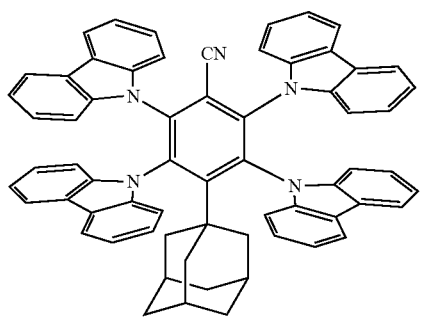
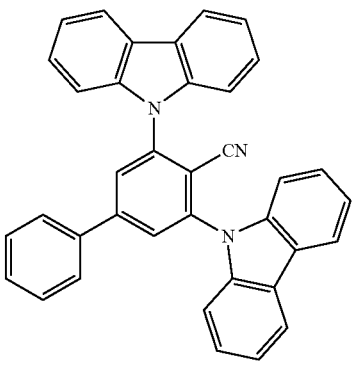
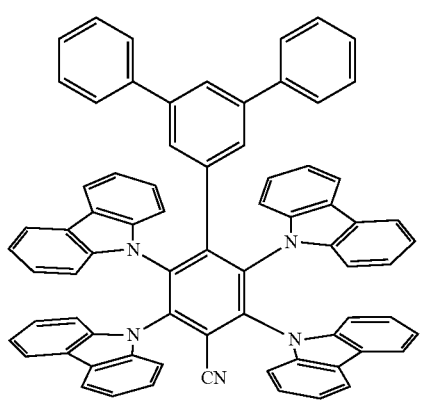
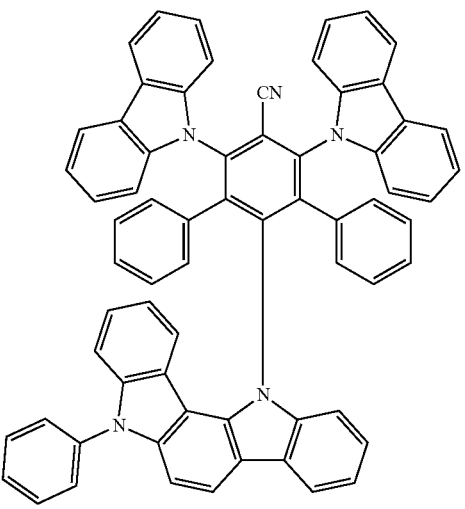
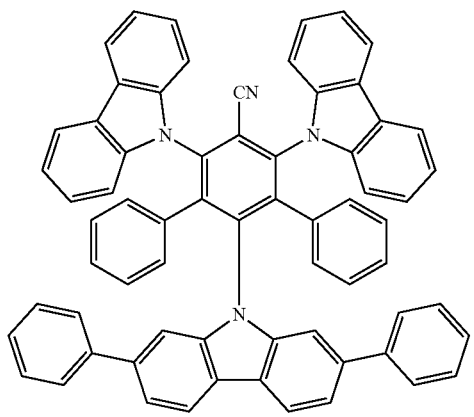
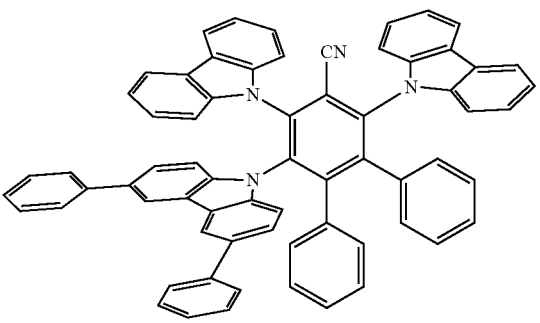
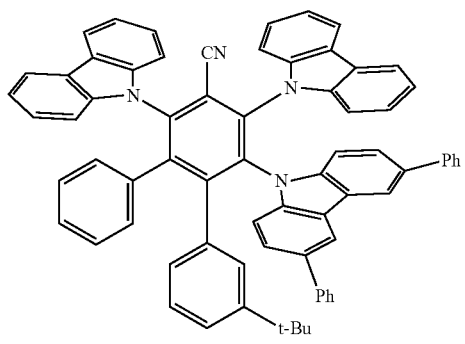
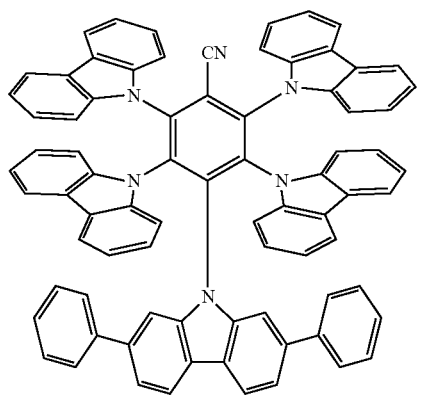

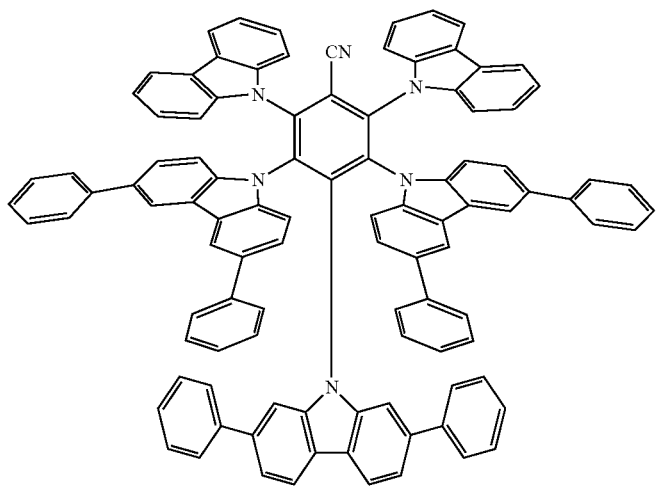
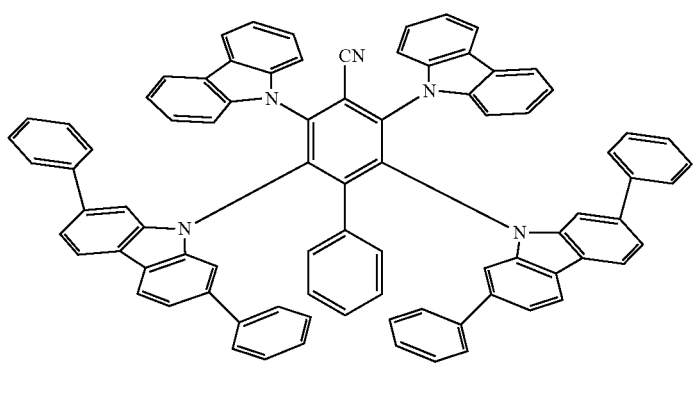
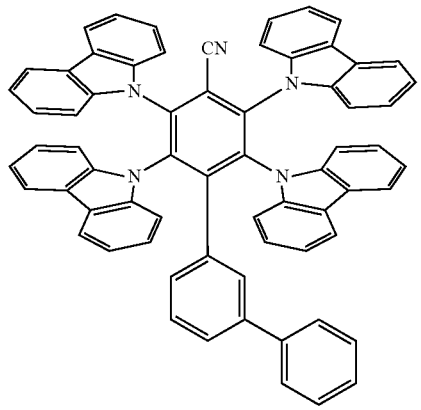
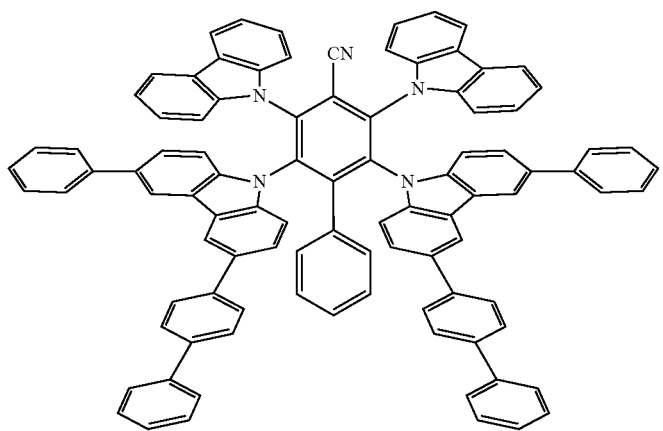

-continued
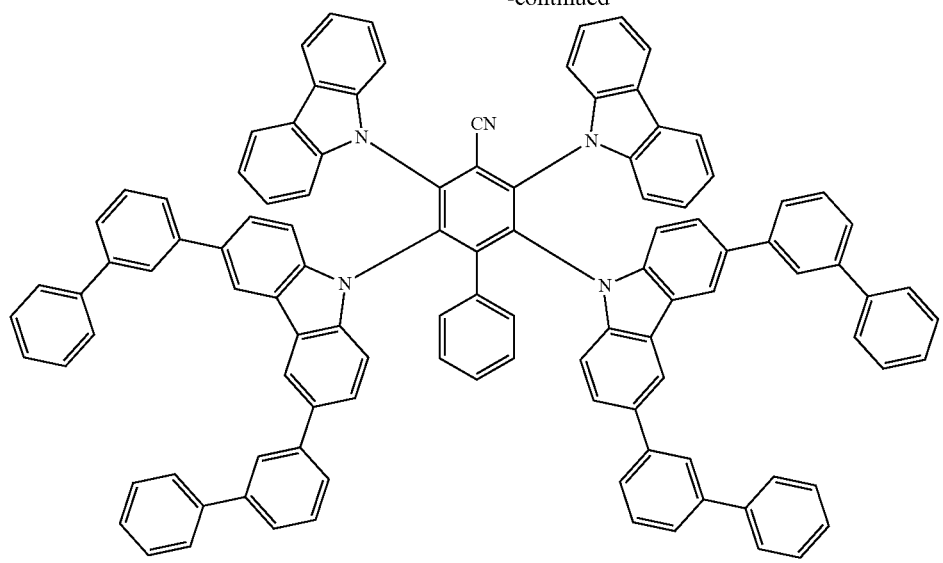
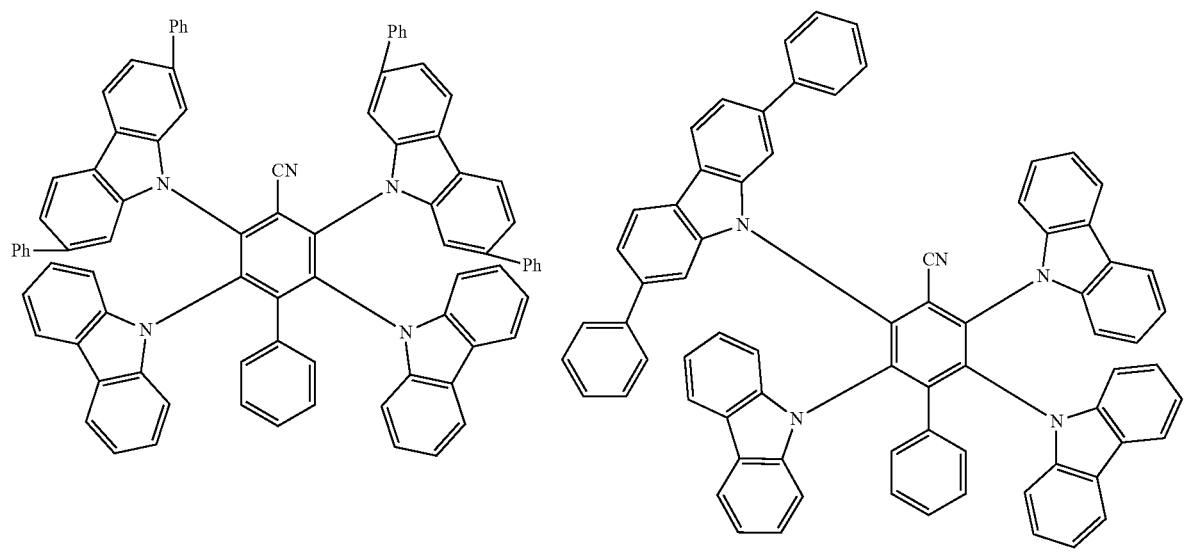
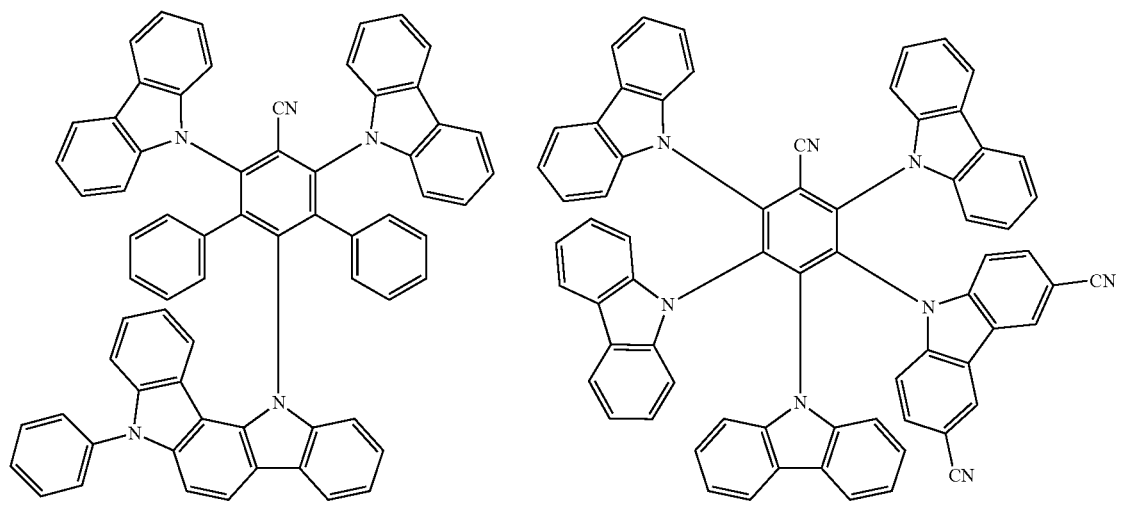

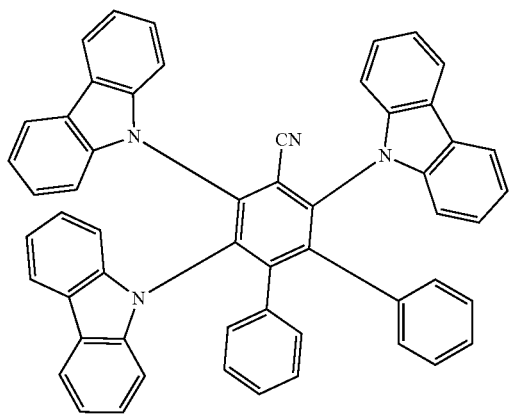
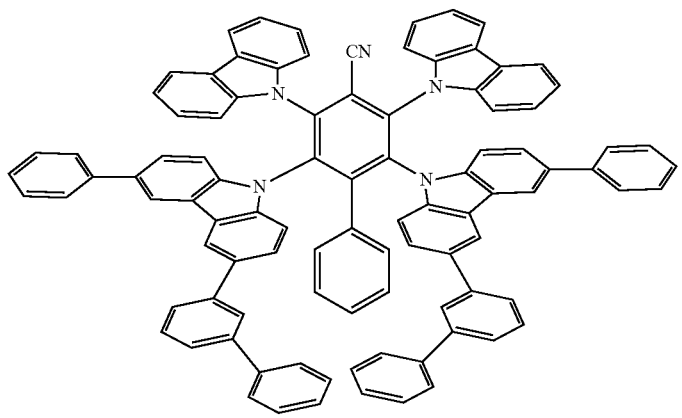
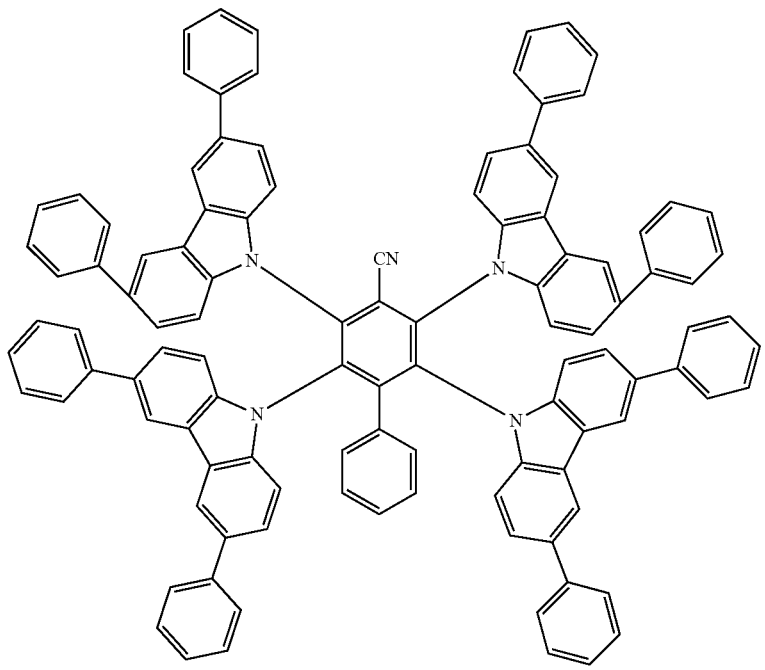

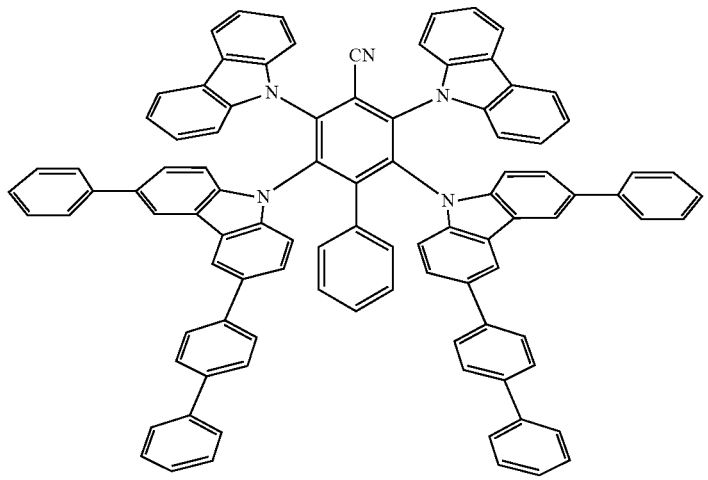
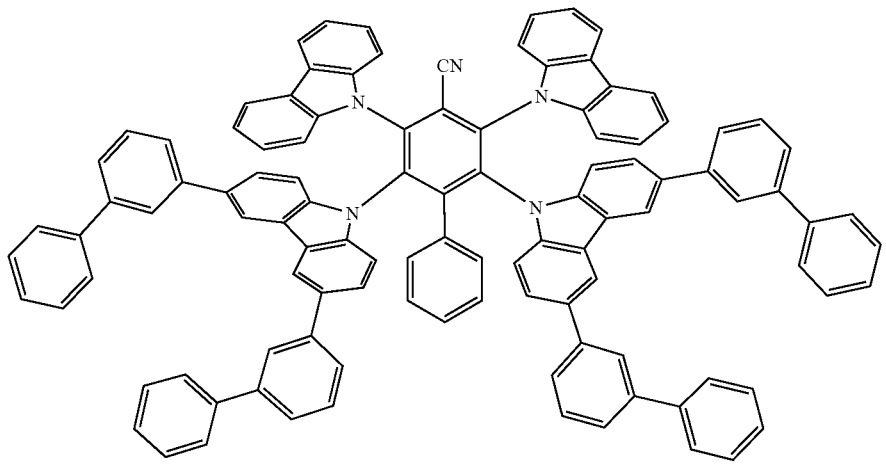
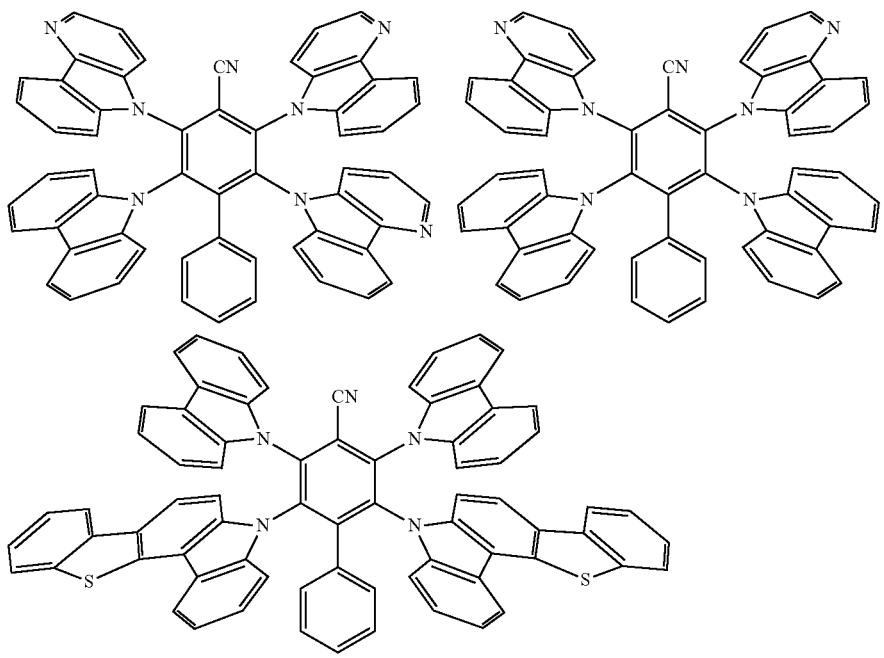

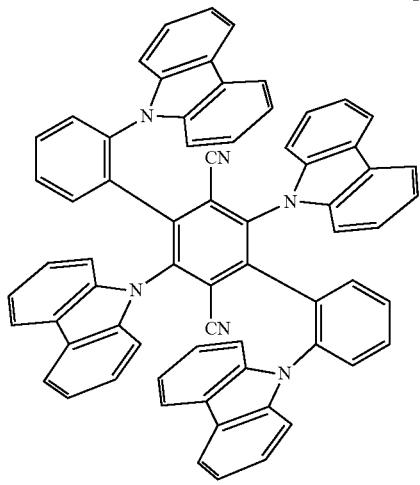
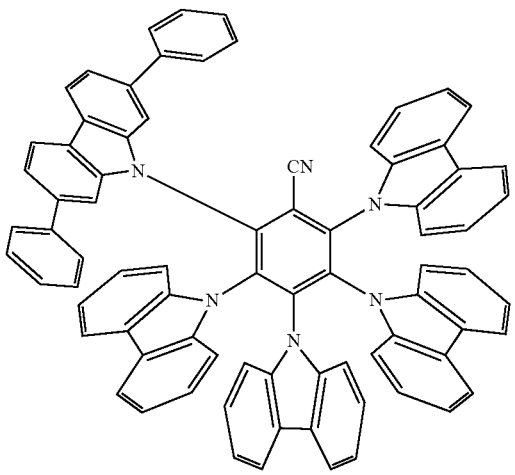
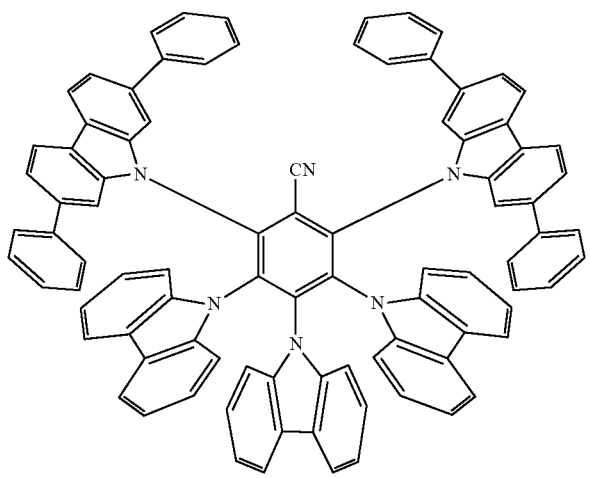
The following compounds are also preferred as the compound.
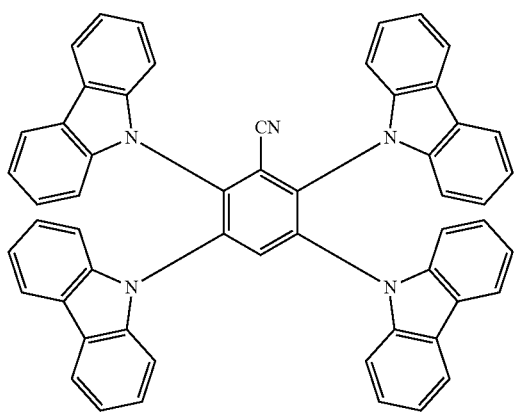
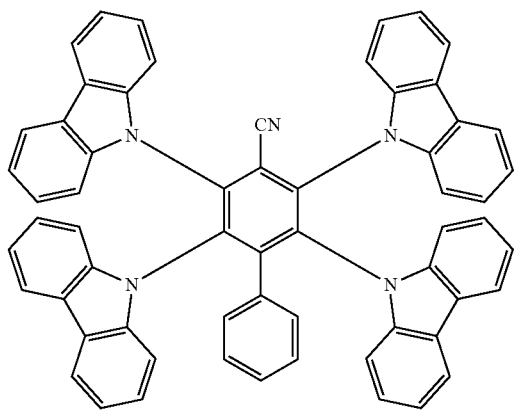

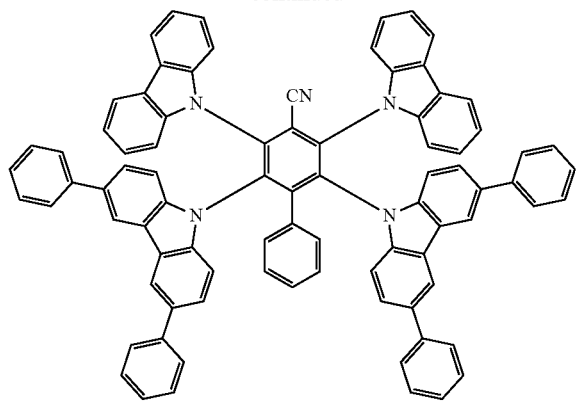

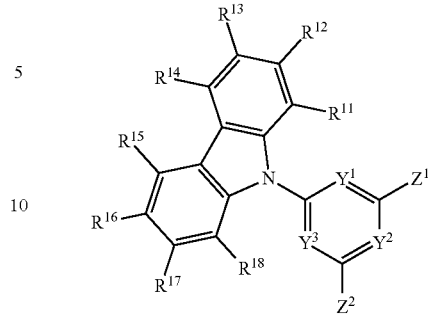

General Formula (8)

In the general formula (8), any two of $Y^1$, $Y^2$ and $Y^3$ are nitrogen atoms and the remaining one represents a methine group, or all of $Y^1$, $Y^2$ and $Y^3$ are nitrogen atoms. $Z^1$ and $Z^2$ each independently represent a hydrogen atom or a substituent. $R^{11}$ to $R^{18}$ each independently represent a hydrogen atom or a substituent, and at least one of $R^{11}$ to $R^{18}$ is preferably a substituted or unsubstituted arylamino group, or a substituted or unsubstituted carbazolyl group. The benzene ring to constitute the arylamino group, and the benzene ring to constitute the carbazolyl group each may form a single bond or a linking group along with any of $R^{11}$ to $R^{18}$. The compound represented by the general formula (8) contains at least 2 carbazole structures in the molecule. Examples of the substituent that $Z^1$ and $Z^2$ may have include the substituents of the above-mentioned substituent group A. Specific examples of the substituent that the arylamino group and the carbazolyl group may have include the substituents of the above-mentioned substituent group A, and a cyano group, a substituted arylamino group and a substituted alkylamino group. $R^{11}$ and $R^{12}$, $R^{12}$ and $R^{13}$, $R^{13}$ and $R^{14}$, $R^{15}$ and $R^{16}$, $R^{16}$ and $R^{17}$, and $R^{17}$ and $R^{18}$ each may bond to each other to form a cyclic structure.

Among the compounds represented by the general formula (8), compounds represented by the following general formula (9) are especially useful.

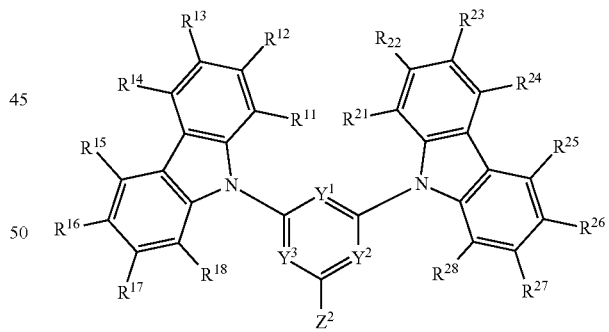

General Formula (9)

A compound capable of emitting delayed fluorescence and represented by the following general formula (8) is also especially preferably used as the delayed fluorescent material. In a preferred embodiment of the present invention, a compound represented by the general formula (8) can be employed both as the second organic compound and the third organic compound.

In the general formula (9), any two of $Y^1$, $Y^2$ and $Y^3$ are nitrogen atoms, and the remaining one represents a methine group, or all of $Y^1$, $Y^2$ and $Y^3$ are nitrogen atoms. $Z^2$ represents a hydrogen atom or a substituent. $R^{11}$ to $R^{18}$ and $R^{21}$ to $R^{28}$ each independently represent a hydrogen atom or a substituent. At least one of $R^{11}$ to $R^{18}$ and/or at least one of $R^{21}$ to $R^{28}$ each are preferably a substituted or unsubstituted aryl group, or a substituted or unsubstituted carbazolyl group. The benzene ring to constitute the arylamino group and the benzene ring to constitute the carbazolyl group each may form a single bond or a linking group along with any of $R^{11}$ to $R^{18}$ or $R^{21}$ to $R^{28}$. Examples of the substituent that $Z^2$ can represent include the substituents of the substituent group A mentioned above. Specific examples of the substituent that $R^{11}$ to $R^{18}$, $R^{21}$ to $R^{28}$, and the above-mentioned arylamino group and carbazolyl group can represent include the substituents of the substituent group A, and a cyano group, a substituted arylamino group, and a substituted alkylamino group. $R^{11}$ and $R^{12}$, $R^{12}$ and $R^{13}$, $R^{13}$ and $R^{14}$, $R^{15}$ and $R^{16}$, $R^{16}$ and $R^{17}$, $R^{17}$ and $R^{18}$, $R^{21}$ and $R^{22}$, $R^{22}$ and $R^{23}$, $R^{23}$ and $R^{24}$, $R^{25}$ and $R^{26}$, $R^{26}$ and $R^{27}$, and $R^{27}$ and $R^{28}$ each may bond to each other to form a cyclic structure.

Regarding the compound group included in the general formula (9) and specific examples of the compounds, reference may be made to the compounds described in WO2013/081088, paragraphs 0020 to 0062; and Appl. Phys .Let, 98, 083302 (2011) that are hereby incorporated as a part of this description by reference. Above all, specific examples of especially preferred compounds are the following compounds.

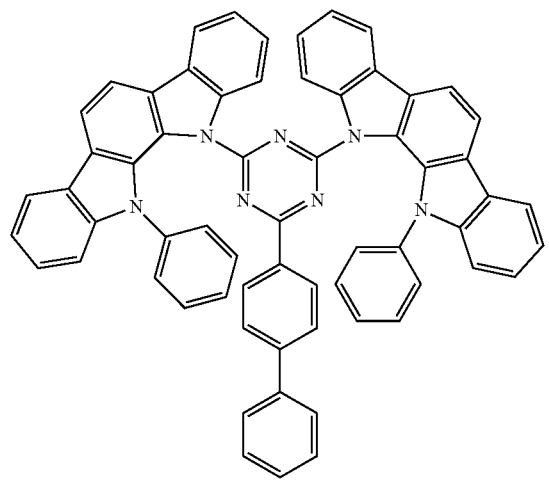

PIC-TRZ

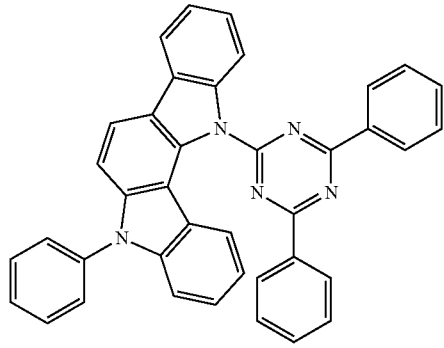

PIC-TRZ2

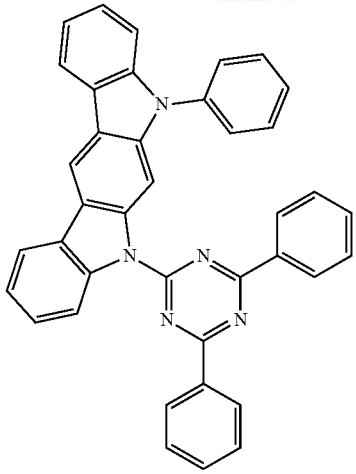

DIC-TRZ

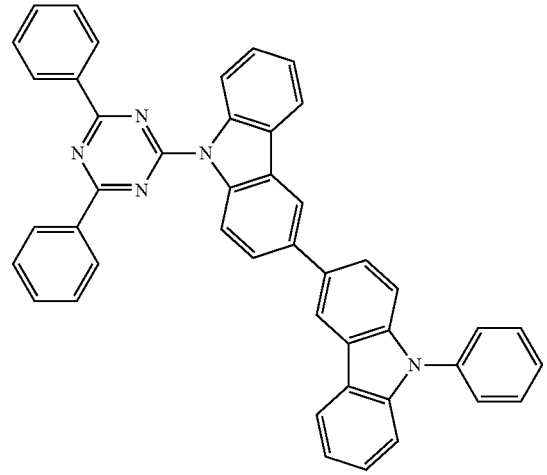

The following compounds are also usable as a delayed fluorescent material.

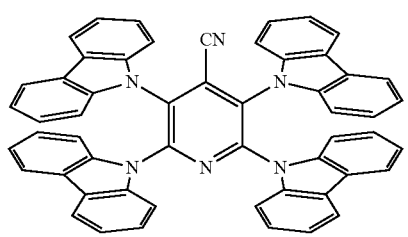
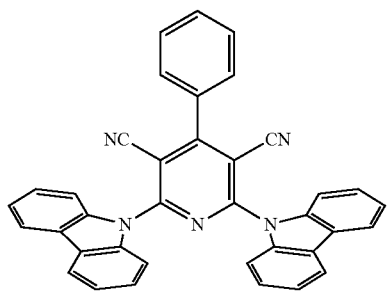
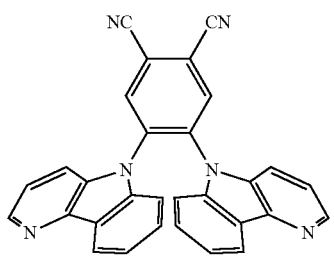

53
-continued
54
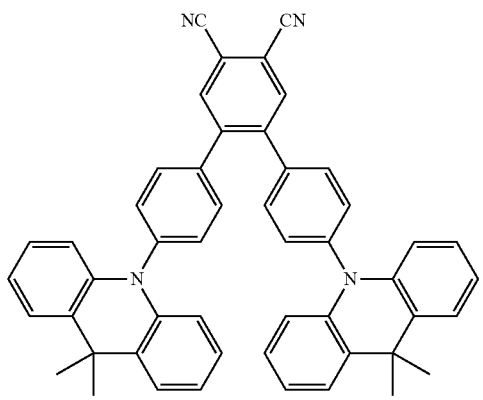
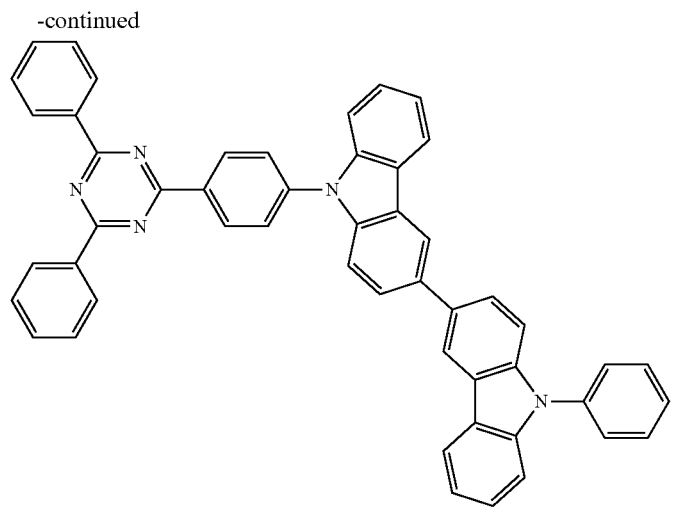
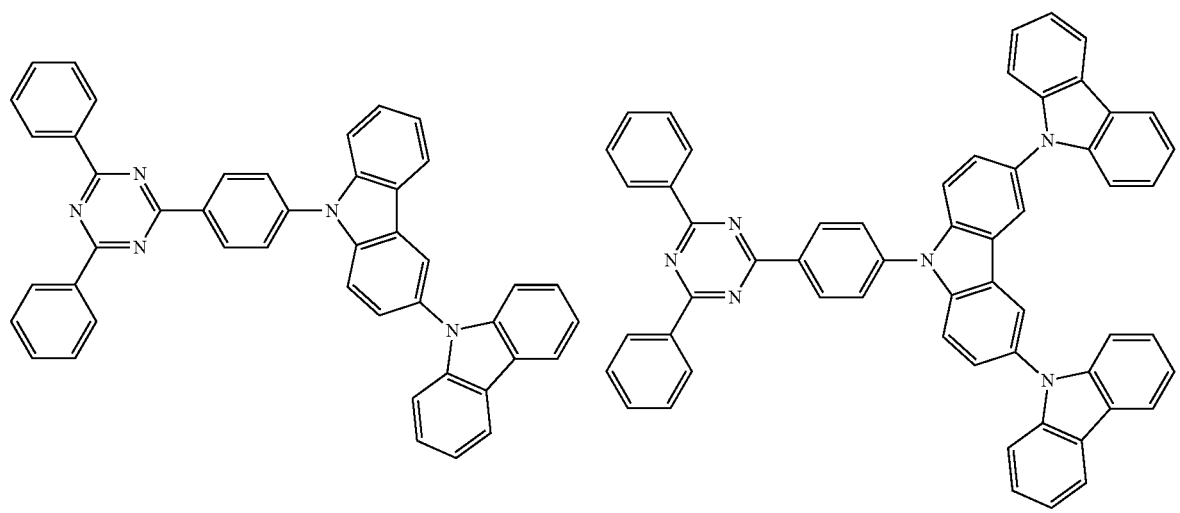
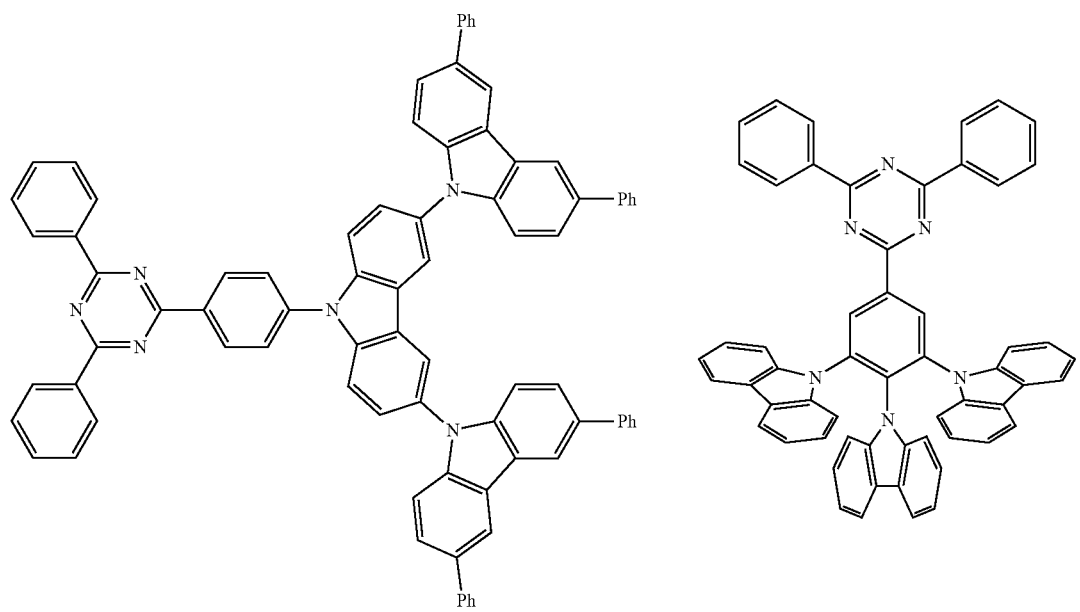

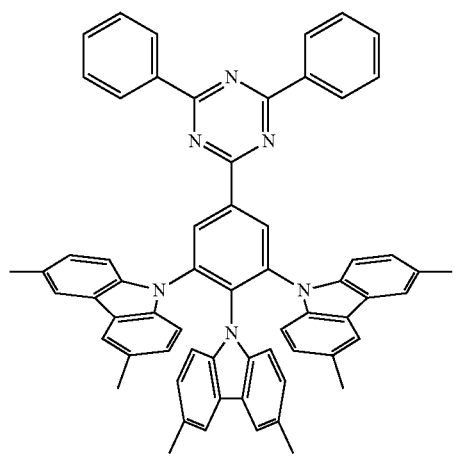
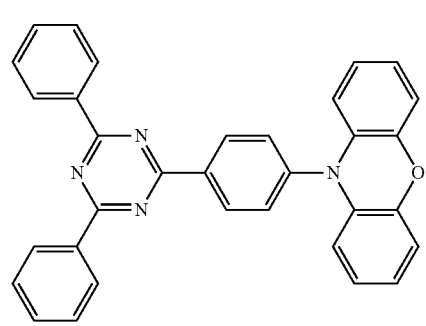
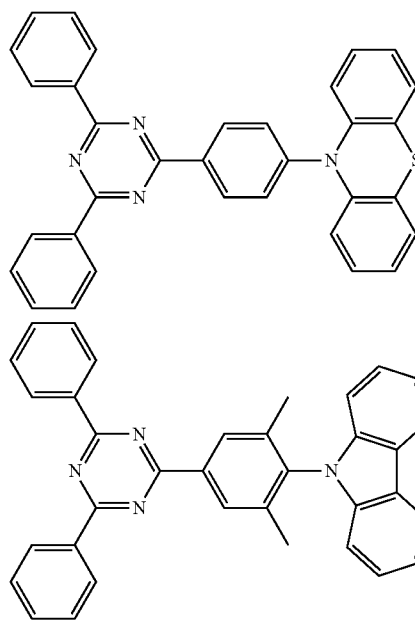
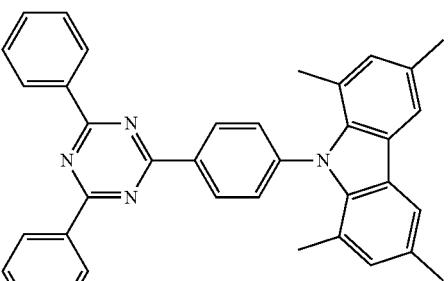
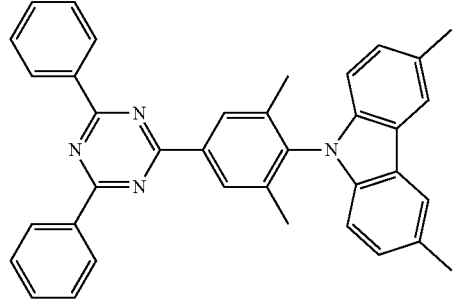
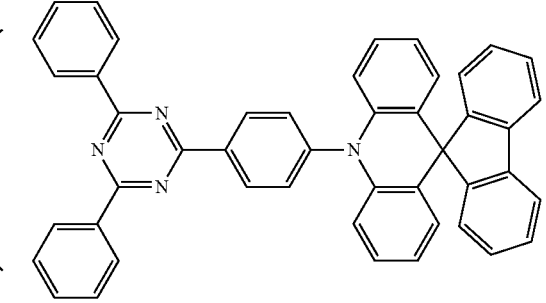
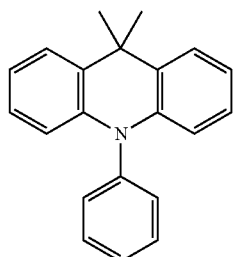
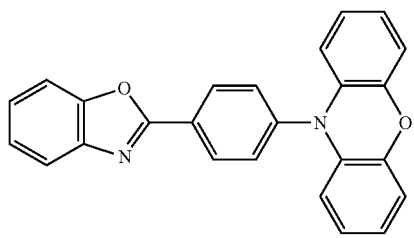
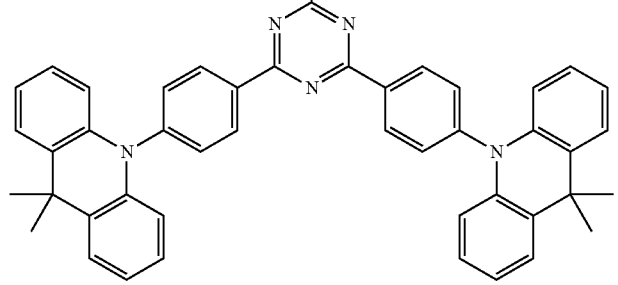

-continued
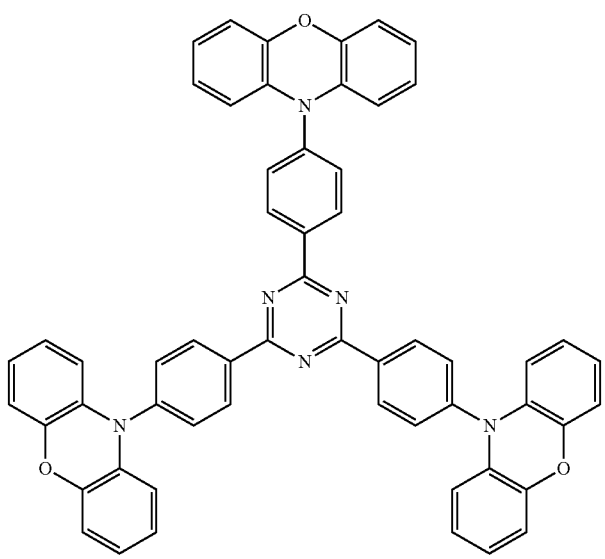
57
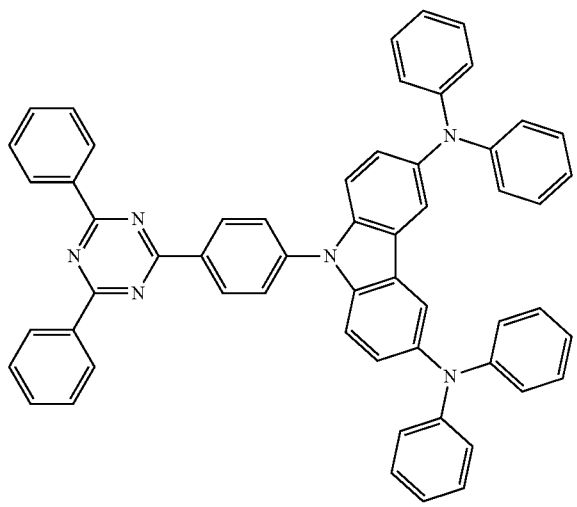
58
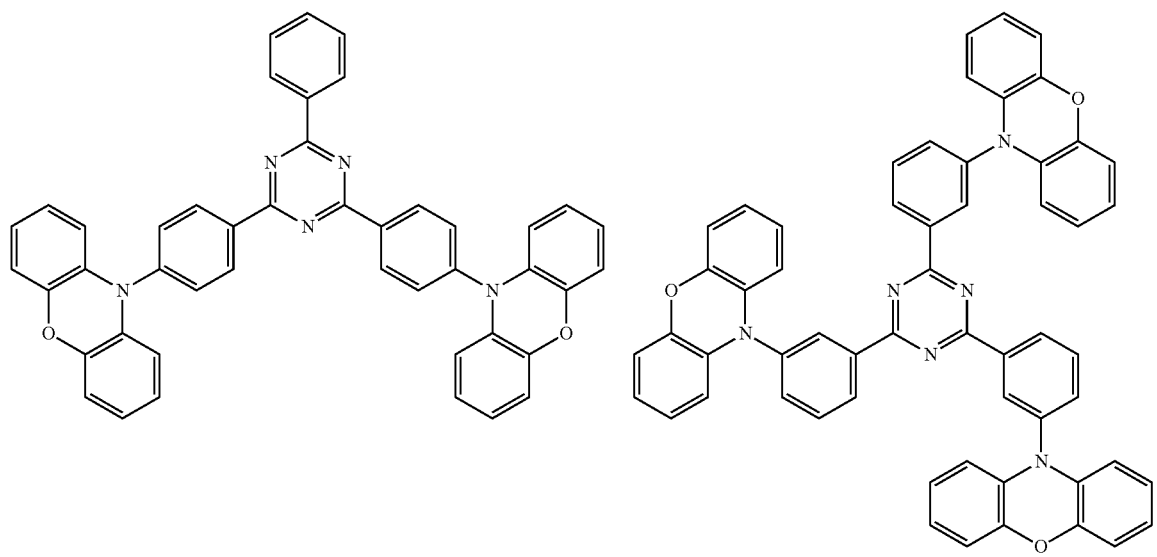
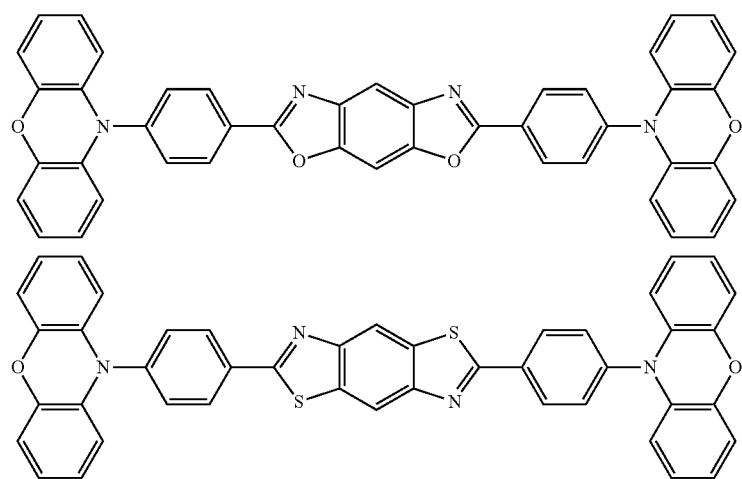

-continued
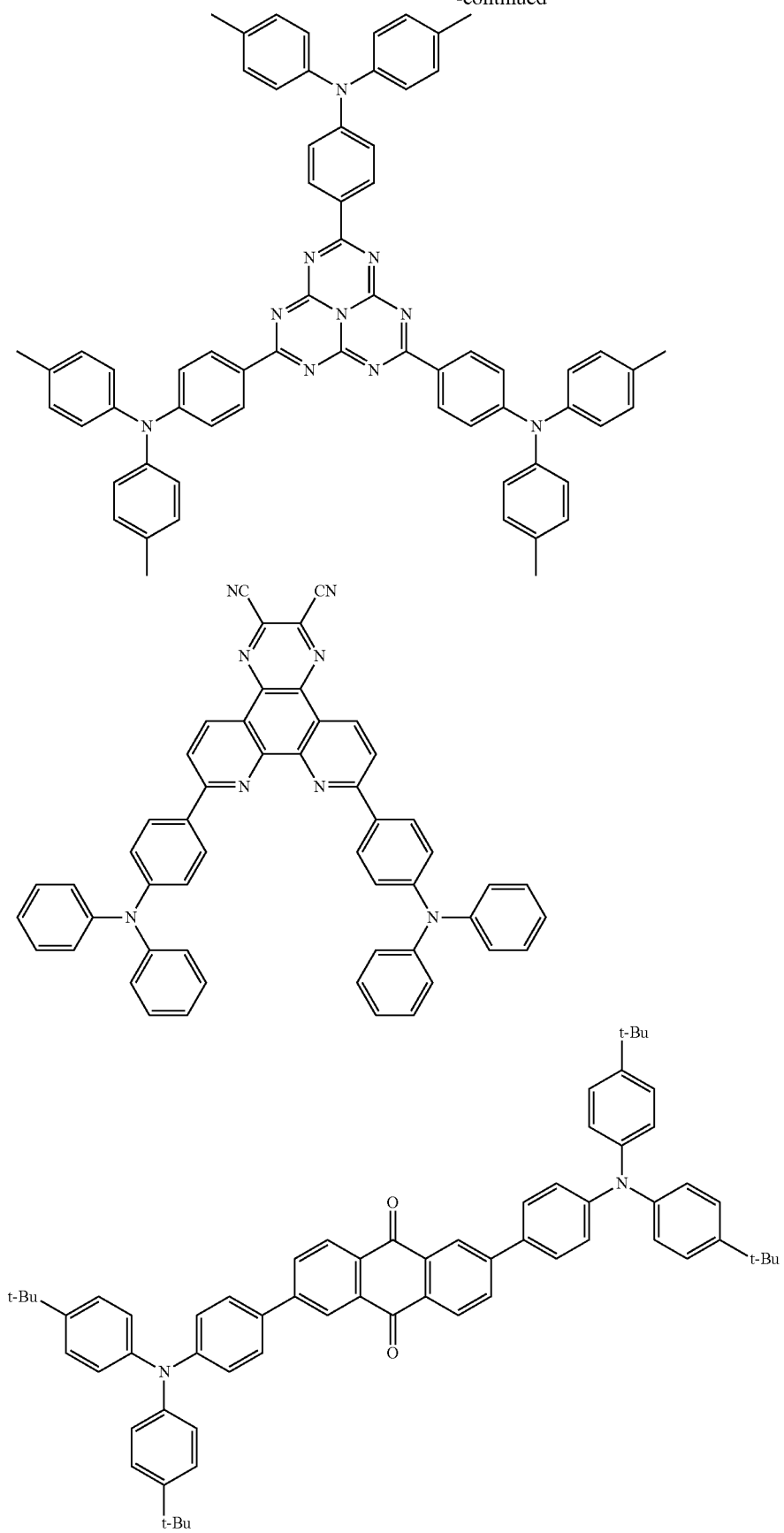

-continued
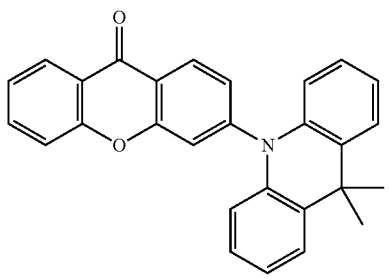
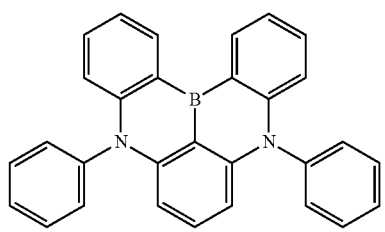
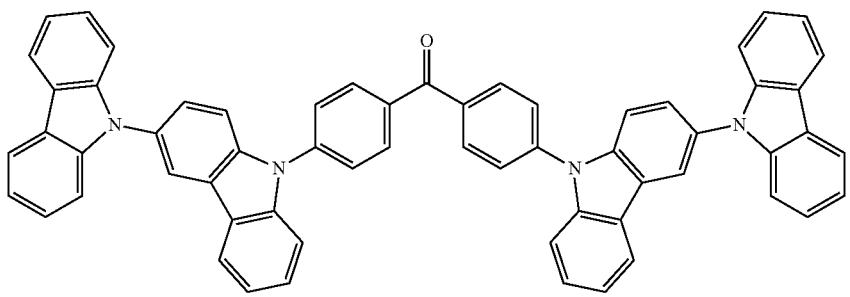
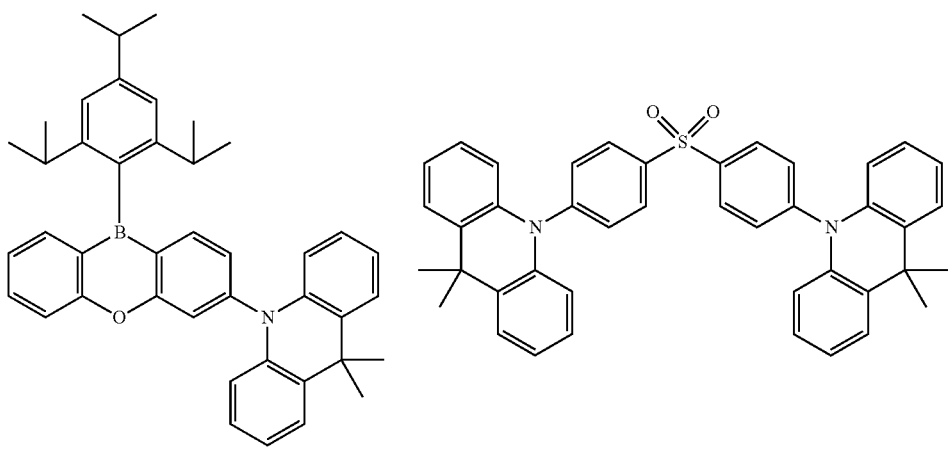
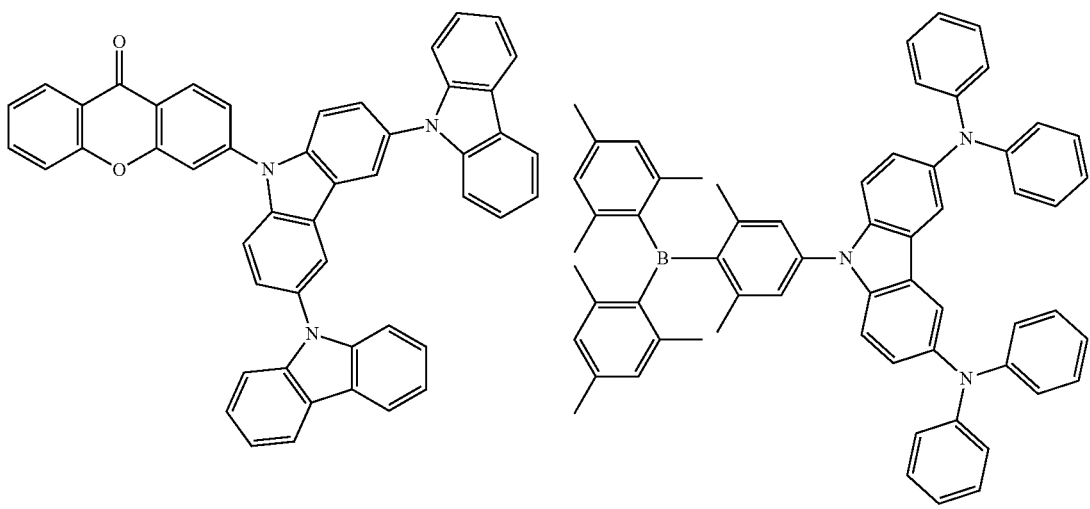

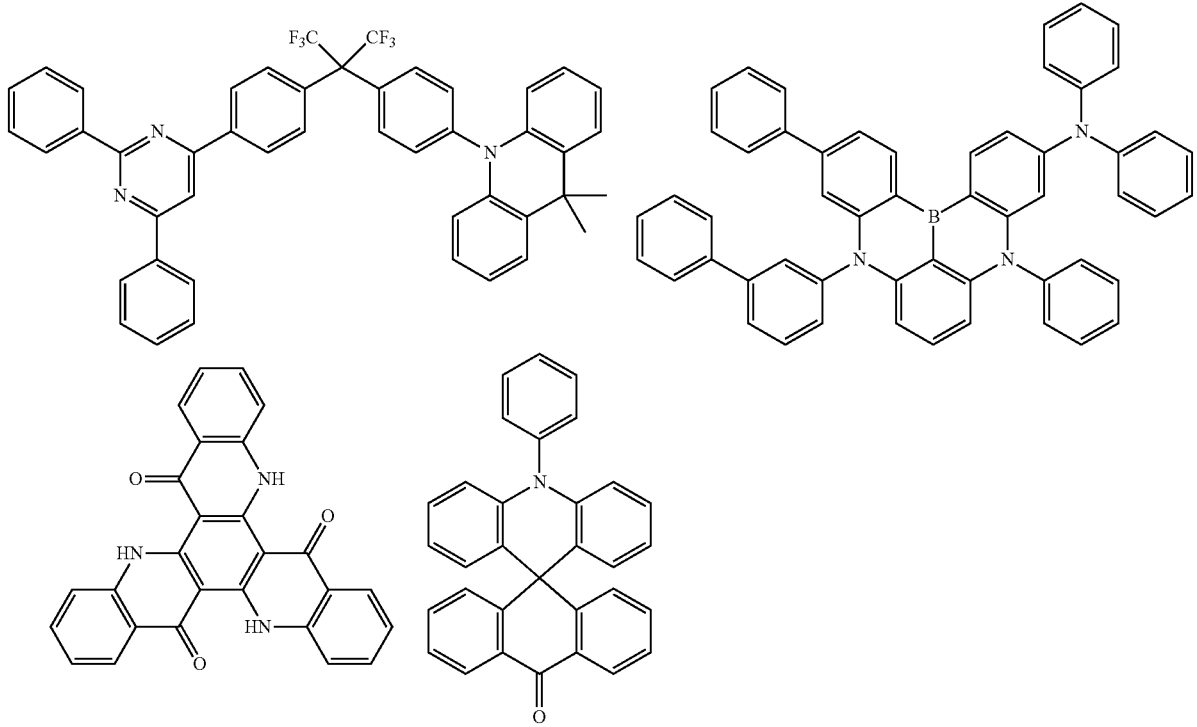

The maximum emission wavelength of the compounds that are usable as the third organic compound in the present invention is not specifically limited. Therefore, a delayed fluorescent material having a maximum emission wavelength in a visible region (380 to 780 nm) and a delayed fluorescent material having a maximum emission wavelength in an IR region (780 nm to 1 mm) can be appropriately selected and used. For example, a delayed fluorescent material having a maximum emission wavelength of 500 to 780 nm in a region of 380 to 780 nm can be selected and used. For example, a delayed fluorescent material having a maximum emission wavelength in a green region of 500 to 570 nm can be selected, or a delayed fluorescent material having a maximum emission wavelength in a red region of 650 to 780 nm can be selected. An example of the delayed fluorescent material having a maximum emission wavelength in a range of 500 to 780 nm is shown below. The organic mixed layer in the present invention can be designed so as not to contain a light-emitting material having a maximum emission wavelength in 400 to 490 nm.

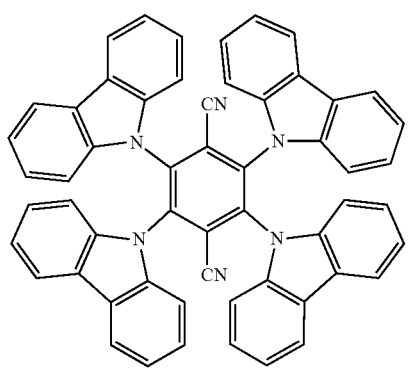

4CzTPN

The delayed fluorescent material for use as the second organic compound and the delayed fluorescent material for use as the second organic compound in the present invention are combined so as to satisfy the requirement (a). In one preferred embodiment of the present invention, the second organic compound and the third organic compound are selected from a group of delayed fluorescent materials having the same basic skeleton. For example, the second organic compound and the third organic compound to be used can be selected from the delayed fluorescent materials represented by the general formula (1). Also the second organic compound and the third organic compound to be used can be selected from the delayed fluorescent materials represented by the general formula (2).

(Fourth Organic Compound)

The first organic light-emitting device can further contain any other organic compound than the first organic compound to the third organic compound in the organic mixed layer. The organic compound that the organic mixed layer can further contain includes a light emitting material having a smaller lowest excited singlet energy than the first organic compound, the second organic compound and the third organic compound (hereinafter this may be referred to as "the fourth organic compound"). The fourth organic compound receives energy from the first organic compound, the second organic compound and the third organic compound in an excited singlet state and from the second organic compound and the third organic compound having become in an excited singlet state through reverse intersystem crossing from an excited triplet state, and thus transits to an excited singlet state, and when thereafter returning back to a ground state, the fourth organic compound emits light. The light-emitting material to be used as the fourth organic compound is not specifically limited so far as it receives energy from the first organic compound to the third organic compound to emit light, and light emission may be any of fluorescence, delayed fluorescence or phosphorescence.

Above all, the light-emitting material to be used as the fourth organic compound is preferably one capable of emitting fluorescence when returning back from the lowest excited singlet energy level to the ground energy level. As the fourth organic compound, two or more kinds of light-emitting materials having a smaller excited lowest singlet energy than the first organic compound, the second organic compound and the third organic compound can be used. For example, by combining two or more kinds of fourth organic compounds that differ in the emission color, it is possible to emit light of a desired color.

The fourth organic compound includes an anthracene derivative, a tetracene derivative, a naphthacene derivative, a pyrene derivative, a perylene derivative, a chrysene derivative, a rubrene derivative, a coumarin derivative, a pyran derivative, a stilbene derivative, a fluorene derivative, an anthryl derivative, a pyrromethene derivative, a terphenyl derivative, a terphenylene derivative, a fluoranthene derivative, an amine derivative, a quinacridone derivative, an oxadiazole derivative, a malononitrile derivative, a pyran derivative, a carbazole derivative, a julolidine derivative, a thiazole derivative, and a derivative having a metal (Al, Zn), as well as mother compounds thereof (compounds before converted into derivatives). Specifically, the ring skeleton of these derivatives listed herein may have a substituent, or may not have a substituent. The fourth organic compound may contain two or more kinds of ring skeletons. Regarding specific examples of the light-emitting material, reference may be made to "Preferred Compounds Usable as Eighth Organic Compound" given in the following section of (Eighth Organic Compound).

(Organic Mixed Layer)

The organic mixed layer in the organic light-emitting device of the present invention contains a first organic compound and a second organic compound and a third organic compound satisfying the requirement (a). The organic mixed layer can be designed so as not to contain any other compound and metal element to give or receive charges or energy, than the first organic compound and the second organic compound and the third organic compound. The organic mixed layer may be composed of the first organic compound and the second organic compound and the third organic compound alone. Further, the organic mixed layer can be composed of compounds alone each formed of atoms selected from the group consisting of a carbon atom, a hydrogen atom, a nitrogen atom, an oxygen atom and a sulfur atom. Or the organic mixed layer can be composed of compounds alone each formed of atoms selected from the group consisting of a carbon atom, a hydrogen atom and a nitrogen atom.

The content of the first organic compound contained in the organic mixed layer is preferably 1% by weight or more of the organic mixed layer, and can be, for example, 10% by weight or more, 20% by weight or more, 30% by weight or more, 50% by weight or more, or 80% by weight or more. Also preferably, the content is 99% by weight or less of the organic mixed layer, and can be, for example, 90% by weight or less, as the case may be, 70% by weight or less, 50% by weight or less, 30% by weight or less, or 20% by weight or less.

The content of the second organic compound contained in the organic mixed layer is preferably 1% by weight or more of the organic mixed layer, more preferably 10% by weight or more, even more preferably 15% by weight or more, further more preferably 20% by weight or more. Also the content can be 25% by weight or more 45% by weight or more, or 50% by weight or more. Also preferably, the content is 95% by weight or less of the organic mixed layer, and can be, for example, 80% by weight or less, 60% by weight or less, as the case may be, 50% by weight or less, 30% by weight or less, or 20% by weight or less.

The content of the third organic compound contained in the organic mixed layer is preferably 0.01% by weight or more of the organic mixed layer, and can be, for example, 0.1% by weight or more, 1% by weight or more. Also preferably, the content is 30% by weight or less of the organic mixed layer, and can be, for example 20% by weight or less, 10% by weight or less, or 5% by weight or less.

Based on the inclination of the concentration quenching speed constant of the third organic compound as a parameter, the organic mixed layer can be defined. Also based on the inclination of the concentration quenching speed constant of the second organic compound as a parameter, the organic mixed layer can be defined.

Preferably, the content of the second organic compound is larger than the content of the third organic compound in the organic mixed layer. Also preferably, the content of the first organic compound is larger than the content of the third organic compound in the organic mixed layer. The content of the second organic compound may be larger than, or may be smaller than, or may be the same as the content of the first organic compound in the organic mixed layer.

For example, the composition of the organic mixed layer can be so controlled that the first organic compound accounts for 10 to 70% by weight, the second organic compound accounts for 10 to 80% by weight, and the third organic compound accounts for 0.1 to 30% by weight. Also the composition of the organic mixed layer can be so controlled that the first organic compound accounts for 20 to 45% by weight, the second organic compound accounts for 50 to 75% by weight, and the third organic compound accounts for 5 to 20% by weight.

Preferably, the kind and the content of the first organic compound, the second organic compound and the third organic compound in the organic mixed layer are to satisfy specific requirements. For example, when the total weight of the first organic compound, the second organic compound and the third organic compound contained in the organic mixed layer is 100% by weight, the content of the second organic compound therein is A % by weight, and the content of the third organic compound therein is B % by weight, preferably, A and B are so defined as to satisfy the following requirements in the present invention. The wavelength of the excitation light for use for photoexcitation to be described below is preferably 300 nm or more, and can be, for example, 337 nm. For minimizing measurement deviation, preferably, the measurement is carried out in a film thickness satisfying a sufficient absorbance, and, for example, the film thickness can be 50 nm.

(1) The emission quantum yield $\phi_{PL2}(A)$ by photoexcitation of a co-deposited film of the second organic compound and the first organic compound (content of the second organic compound in the co-deposited film=A % by weight), and the emission quantum yield $\phi_{PL3}(A)$ by photoexcitation of a co-deposited film of the third organic compound and the first organic compound (content of the third organic compound in the co-deposited film=A % by weight) satisfy the following relational formula:

$$\phi_{PL2}(A) > \phi_{PL3}(A)$$

(2) The emission quantum yield $\phi_{PL3}(B)$ by photoexcitation of a co-deposited film of the third organic compound and the first organic compound (content of the third organic compound in the co-deposited film=B % by weight), and the emission quantum yield $\phi_{PL3}(100)$ by photoexcitation of a single film of the third organic compound satisfy the following relational formulae:

$\phi_{PL3}(B) > X\%$ $\phi_{PL3}(100) < X\%$

In the above (1), A is preferably selected from a range of 15 to 75% by weight, and the lower limit can be 15% by weight or more, 20% by weight or more, 25% by weight or more, or 30% by weight or more in embodiments. The upper limit can be 75% by weight or less, 60% by weight or less, 50% by weight or less, or 40% by weight or less in embodiments. B is preferably selected from a range of 0.01 to 30% by weight, and the lower limit can be 0.01% by weight or more, 0.1% by weight or more, 0.5% by weight or more, 1% by weight or more, 5% by weight or more, 10% by weight or more, or 15% by weight or more in embodiments. The upper limit can be 20% by weight or less, 25% by weight or less, or 30% by weight or less in embodiments. X can be 20 to 100%, 30 to 100%, or 40 to 100% in embodiments, preferably 50 to 100%, 60 to 100%, 70 to 100%, or 80 to 100% in embodiments. $\$_{PL3}(100)$ can be less than 30%, less than 25%, less than 20%, less than 15%, or less than 10% in embodiments.

By forming the organic mixed layer in which the kind and the content of the first organic compound, the second organic compound and the third organic compound are selected so as to satisfy the above relational formulae (1) and (2), the lifetime of the resultant organic light-emitting device can effectively prolonged. A combination of the first organic compound, the second organic compound and the third organic compound in that manner is, for example, a combination of mCBP, 4CzIPN-Me, and 4CzTPN. In this case, the emission quantum yield $\phi_{PL3}(100)$ by photoexcitation of the single film of the third organic compound alone is 8%, and the emission quantum yield $\phi_{PL3}(5)$ by photoexcitation of the co-deposited film of the third organic compound and the first organic compound (content of the third organic compound=5% by weight) is 52%. The emission quantum yield $\phi_{PL2}(50)$ by photoexcitation of the co-deposited film of the second organic compound and the first organic compound (content of the second organic compound=50% by weight) is larger than the emission quantum yield $\phi_{PL3}(50)$ by photoexcitation of the co-deposited film of the third organic compound and the first organic compound (content of the third organic compound=50% by weight). Another example satisfying the above relations (1) and (2) is a combination of mCBP, 4CzIPN, and 4CzTPN.

The organic mixed layer can be formed by co-evaporation of the first organic compound, the second organic compound and the third organic compound, or can be formed by a coating method using a solution prepared by dissolving the first organic compound, the second organic compound and the third organic compound. In the case where the organic mixed layer is formed by co-evaporation, two or more of the first organic compound, the second organic compound and the third organic compound may be previously mixed and put into a crucible or the like as an evaporation source, and using the evaporation source, the organic mixed layer may be formed by co-evaporation. For example, the second organic compound and the third organic compound are previously mixed to prepare one evaporation source, and using the evaporation source and another evaporation source of the first organic compound, an organic mixed layer can be formed by co-evaporation.

Second Embodiment of Organic Light-Emitting Device

The organic light-emitting device of the second embodiment of the present invention is an organic light-emitting device having an organic mixed layer that contains a fifth organic compound and a sixth organic compound and a seventh organic compound and an eighth organic compound. The fifth organic compound and the sixth organic compound and the seventh organic compound and the eighth organic compound satisfy the following requirement (b) and requirement (c).

Requirement(b) $E_{S1}(D) > E_{S1}(E)$, or $E_{S1}(D) > E_{S1}(F)$

Requirement(c) $E_{S1}(E) > E_{S1}(F) > E_{S1}(G)$ wherein $E_{S1}(D)$ represents a lowest excited singlet energy level of the fifth organic compound, $E_{S1}(E)$ represents a lowest excited singlet energy level of the sixth organic compound, $E_{S1}(F)$ represents a lowest excited singlet energy level of the seventh organic compound, $E_{S1}(G)$ represents a lowest excited singlet energy level of the eighth organic compound. In the following description, the organic light-emitting device of the second embodiment may be referred to as "the second organic light-emitting device".

The sixth organic compound is a delayed fluorescent material. The seventh organic compound is a delayed fluorescent material differing from the sixth organic compound in the structure. Regarding the definition of "delayed fluorescent material", reference may be made to the description in the section of the above <First Embodiment of Organic Light-Emitting Device>.

The sixth organic compound is preferably such that the difference $\Delta E_{st}$ between the lowest excited singlet energy level and the lowest excited triplet energy level at 77K is 0.3 eV or less, more preferably 0.25 eV or less, even more preferably 0.2 eV or less, further more preferably 0.15 eV or less, further more preferably 0.1 eV or less, further more preferably 0.07 eV or less, further more preferably 0.05 eV or less, further more preferably 0.03 eV or less, further more preferably 0.01 eV or less.

The seventh organic compound is preferably such that the difference $\Delta E_{st}$ between the lowest excited singlet energy level and the lowest excited triplet energy level at 77K is 0.3 eV or less, more preferably 0.25 eV or less, even more preferably 0.2 eV or less, further more preferably 0.15 eV or less, further more preferably 0.1 eV or less, further more preferably 0.07 eV or less, further more preferably 0.05 eV or less, further more preferably 0.03 eV or less, further more preferably 0.01 eV or less.

When $\Delta E_{st}$ is smaller, reverse intersystem crossing from an excited triplet state to an excited state state can more readily occur through thermal energy absorption, and therefore the material of the type can function as a thermal activation type delayed fluorescent material. A thermal activation type delayed fluorescent material can absorb heat generated by a device to relatively readily undergo reverse intersystem crossing from an excited triplet state to an excited singlet state, and can make the excited triplet energy efficiently contribute toward light emission. Regarding the measurement method for $\Delta E_{st}$, reference may be made to the description in the section of the above <First Embodiment of Organic Light-Emitting Device>.

(Fifth Organic Compound)

The fifth organic compound is an organic compound having a larger lowest excited singlet energy than the seventh organic compound. Preferably, the fifth organic compound is an organic compound having a larger lowest excited singlet energy than both the sixth organic compound and the seventh organic compound. The fifth organic compound has a function as a host material to take a role in carrier transport and also a function to trap the energy of the eighth organic compound in the compound. Accordingly, the eighth organic compound can efficiently convert the energy generated by recombination of holes and electrons in the molecule and the energy having received from the fifth organic compound, the sixth organic compound and the seventh organic compound into light emission, and an organic light-emitting device having a high light emission efficiency can be thereby realized.

The fifth organic compound is preferably an organic compound having a hole transport ability and an electron transport ability, capable of preventing the wavelength of light emission from being prolonged, and having a high glass transition temperature. In preferred embodiments of the present invention, the fifth organic compound is selected from compounds not emitting delayed fluorescence. Regarding the preferred compounds usable as the first organic compound, reference may be made to the examples of "preferred compounds usable as the first organic compound" listed in the section of the above <First Embodiment of Organic Light-Emitting Device>.

(Sixth Organic Compound and Seventh Organic Compound)

The sixth organic compound is a delayed fluorescent material having a larger lowest excited singlet energy than the seventh organic compound. The sixth organic compound may be any compound capable of emitting delayed fluorescence under some condition, and the second organic light-emitting device of the present invention is not essentially required to emit delayed fluorescent light derived from the sixth organic compound.

The lowest excited singlet energy of the sixth organic compound may be larger than, or may be smaller than, or may be the same as that of the fifth organic compound, but is smaller than the latter. With that, in the second organic light-emitting device of the present invention, the sixth organic compound can receive energy from the fifth organic compound in an excited singlet state to transit to an excited singlet state. The sixth organic compound may also transit to an excited triplet state, after having received energy from the first organic compound in an excited triplet state. The sixth organic compound has a small $\Delta E_{ST}$, and therefore the sixth organic compound in an excited triplet state can readily undergo reverse intersystem crossing to the sixth organic compound in an excited singlet state. The sixth organic compound in an excited singlet state having occurred through the route gives energy to the seventh organic compound to transit the seventh organic compound to an excited singlet state.

The seventh organic compound is a delayed fluorescent material having a smaller lowest excited singlet energy than the fifth organic compound and the sixth organic compound. The seventh organic compound may be any compound capable of emitting delayed fluorescence under some condition, and the second organic light-emitting device of the present invention is not essentially required to emit delayed fluorescent light derived from the seventh organic compound. The seventh organic compound receives energy from the fifth organic compound and the sixth organic compound in an excited singlet state and from the sixth organic compound having become in an excited singlet state through reverse intersystem crossing from the excited triplet state, and thus transits to an excited singlet state. The seventh organic compound has a small $\Delta E_{ST}$, and therefore the seventh organic compound in an excited triplet state can readily undergo reverse intersystem crossing to the seventh organic compound in an excited singlet state. The seventh organic compound having become in an excited singlet state through the routes thereafter gives energy to the eighth organic compound so as to transit the eighth organic compound to an excited singlet state. The eighth organic compound in the excited singlet state emits fluorescence thereafter when returning back to a ground state.

Not specifically limited, the delayed fluorescent material for use as the seventh organic compound may be any one capable of receiving energy from the firth organic compound and the sixth organic compound to emit light. In preferred embodiments of the present invention, the sixth organic compound and the seventh organic compound are appropriately selected and combined in such a manner that the emission wavelength region of the sixth organic compound and the absorption wavelength region of the seventh organic compound can overlap. Especially preferably, the edge on the long wavelength side of the emission spectrum of the sixth organic compound overlaps with the edge on the short wavelength side of the absorption spectrum of the seventh organic compound.

For the sixth organic compound and the seventh organic compound, known delayed fluorescent materials can be used. Even unknown delayed fluorescent materials can also be used for those compounds. Regarding compound examples of the delayed fluorescent material usable as the sixth organic compound and the seventh organic compound, reference may be made to the compound examples of the delayed fluorescent material listed in the section of the above (Second Organic Compound and Third Organic Compound).

The delayed fluorescent material for use as the second organic compound and the delayed fluorescent material for use as the seventh organic compound in the present invention are combined so as to satisfy the requirement (c). In one preferred embodiment of the present invention, the sixth organic compound and the seventh organic compound are selected and combined from delayed fluorescent materials having the same basic skeleton. For example, the sixth organic compound and the seventh organic compound can be selected and used from delayed fluorescent materials having a benzonitrile structure represented by the above general formula (1). Also the sixth organic compound and the seventh organic compound can be selected and used from delayed fluorescent materials represented by the above general formula (2).

(Eighth Organic Compound)

The eighth organic compound is an organic compound having a smaller lowest excited singlet energy level than the fifth organic compound, the sixth organic compound and the seventh organic compound, and is preferably an organic compound having light-emitting performance (light-emitting material). In the case where the eighth organic compound is a light-emitting material, the organic light-emitting device emits light derived from the eighth organic compound. Light emission may include any of fluorescence, delayed fluorescence and phosphorescence, but preferably the major part of emission from the organic light-emitting device is emission from the eighth organic compound.

Not specifically limited, the light-emitting material for use as the eighth organic compound may be any one capable of emitting light after having received energy from the fifth organic compound, the sixth organic compound and the seventh organic compound, and may be any of a fluorescent material, a delayed fluorescent material and a phosphorescent material. In the case where the eighth organic compound is a fluorescent material, the eighth organic compound receives energy from the fifth organic compound, the sixth organic compound and the seventh organic compound in an excited singlet state and from the sixth organic compound and the seventh organic compound having been in an excited singlet state through reverse intersystem crossing from an excited triplet state, and thus transits to an excited singlet state. The resultant excited singlet state emits fluorescence when thereafter returning back to a ground state. Also in the case where the eighth organic compound is a delayed fluorescent material or a phosphorescent material, the eighth organic compound can emit light, utilizing the energy having received from the fifth organic compound, the sixth organic compound and the seventh organic compound. Two or more kinds of compounds satisfying the requirement (c) can be used as the eighth organic compound. For example, by combining two or more kinds of eighth organic compounds that differ in the emission color, it is possible to emit light of a desired color. In the case where two or more kinds of eighth organic compounds are combined and used, the eighth organic compounds may have the same or different lowest excited singlet energy level, but preferably they differ.

Examples of the eighth organic compound include an anthracene derivative, a tetracene derivative, a naphthacene derivative, a pyrene derivative, a perylene derivative, a chrysene derivative, a rubrene derivative, a coumarin derivative, a pyran derivative, a stilbene derivative, a fluorene derivative, an anthryl derivative, a pyrromethene derivative, a terphenyl derivative, a terphenylene derivative, a fluoranthene derivative, an amine derivative, a quinacridone derivative, an oxadiazole derivative, a malononitrile derivative, a pyran derivative, a carbazole derivative, a julolidine derivative, a thiazole derivative, and a derivative having a metal (Al, Zn), as well as mother compounds thereof (compounds before converted into derivatives). Specifically, the ring skeleton of these derivatives listed herein may have a substituent, or may not have a substituent. The eighth organic compound may contain two or more kinds of ring skeletons.

In the present invention, the maximum emission wavelength of the compounds that are usable as the eighth organic compound is not specifically limited. Therefore, a light-emitting material having a maximum emission wavelength in a visible region (380 to 780 nm) and a light-emitting material having a maximum emission wavelength in an IR region (780 nm to 1 mm) can be appropriately selected and used. For example, a light-emitting material having a maximum emission wavelength of 500 to 780 nm in a region of 380 to 780 nm can be selected and used. For example, a light-emitting material having a maximum emission wavelength in a green region of 500 to 570 nm can be selected, or a light-emitting material having a maximum emission wavelength in a red region of 650 to 780 nm can be selected.

Preferred examples of compounds usable as the eighth organic compound are shown below. In the structural formulae of the following exemplary compounds, Et represents an ethyl group, and i-Pr represents an isopropyl group.

(1) Green-Emitting Compounds

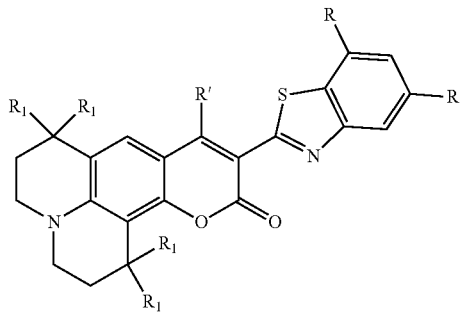

$R_1 = R = R' = H$,
$R_1 = CH_3, R = R' = H$,
$R_1 = CH_3, R = H; R' = CH_3$,
$R_1 = CH_3, R = t\text{-butyl}; R' = H'$

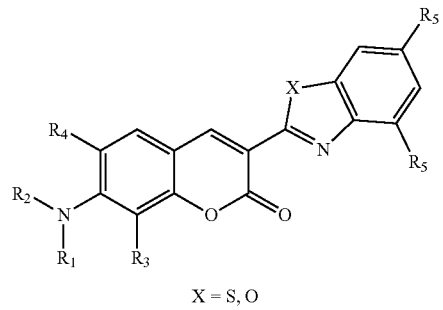

X = S, O

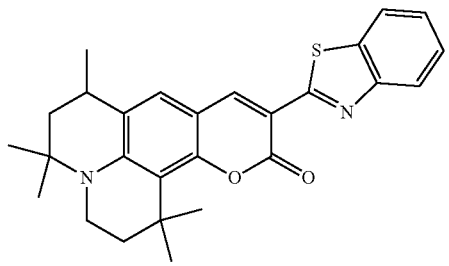

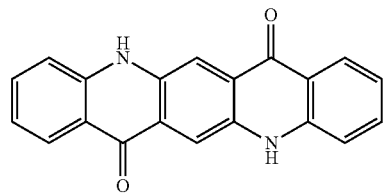

73
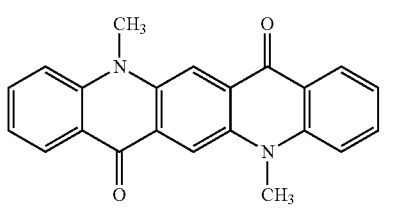
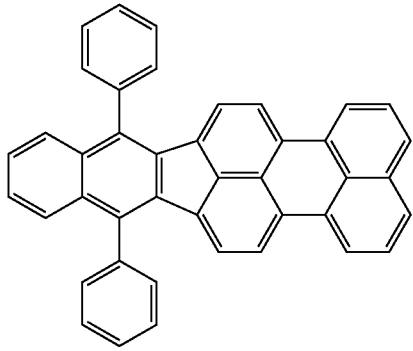
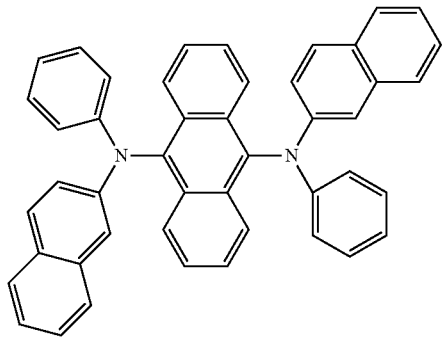
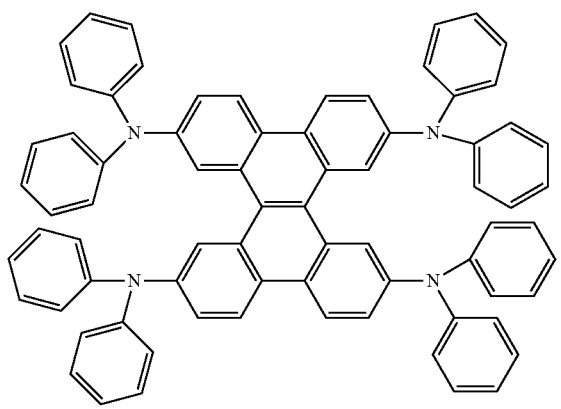
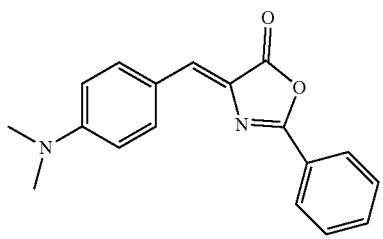
-continued
74
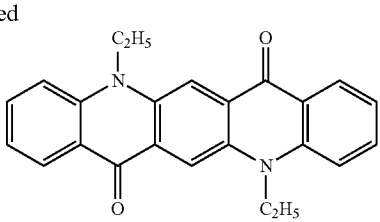
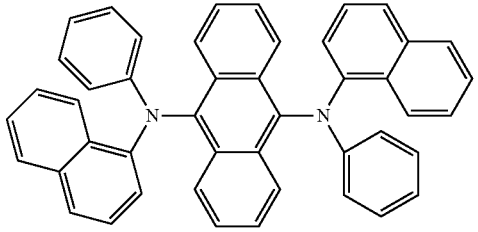
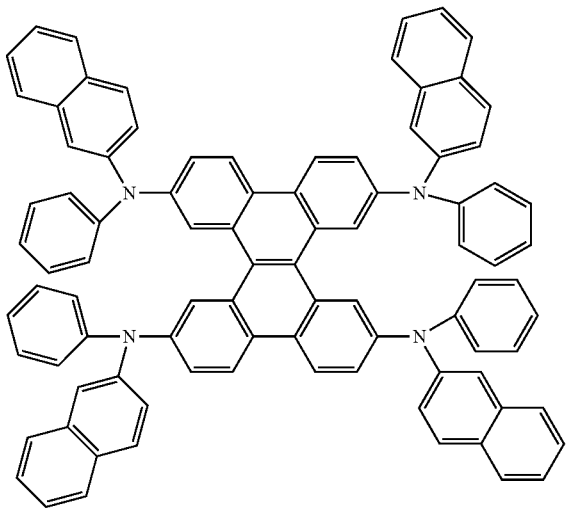
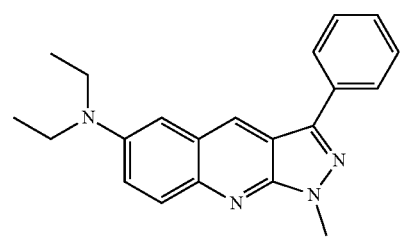
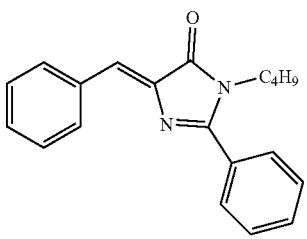

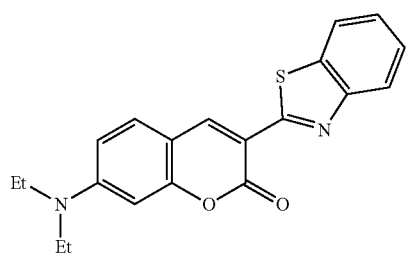
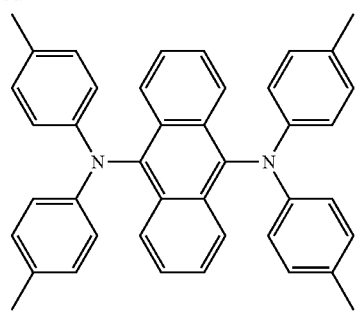
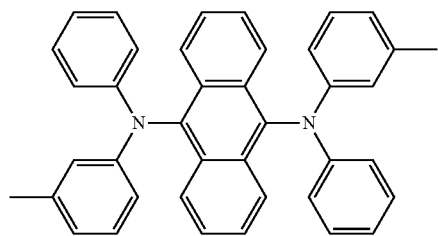
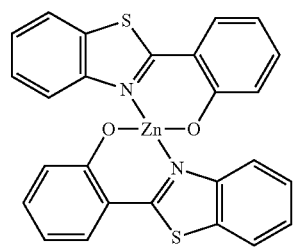
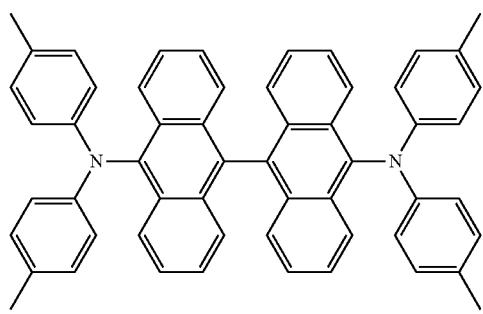
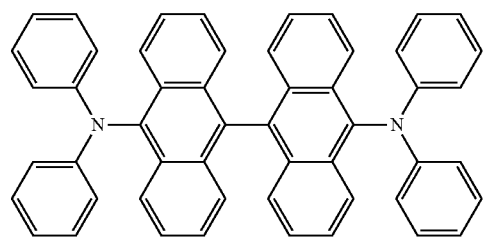
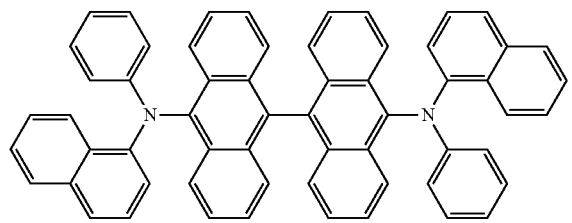
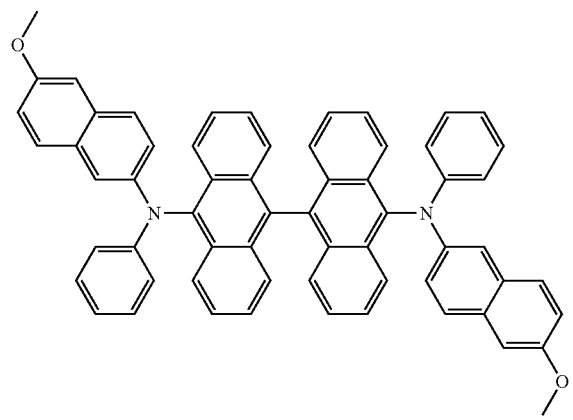
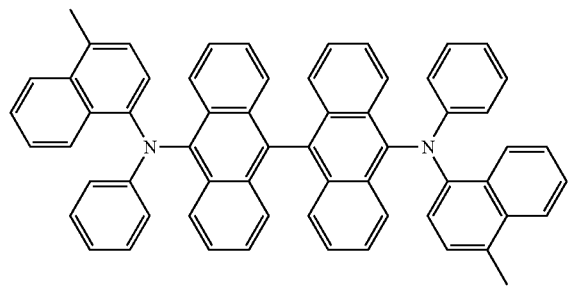
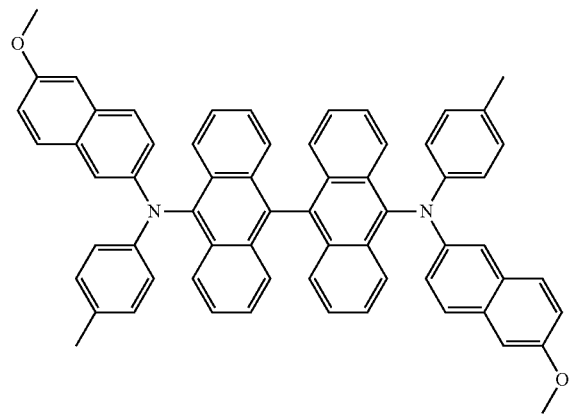

-continued
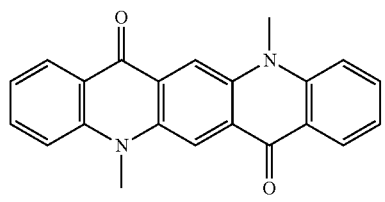
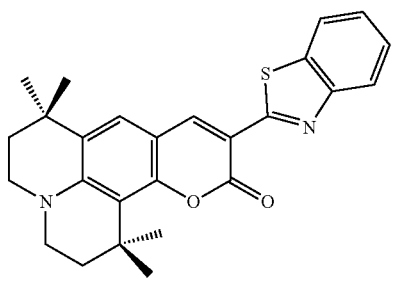
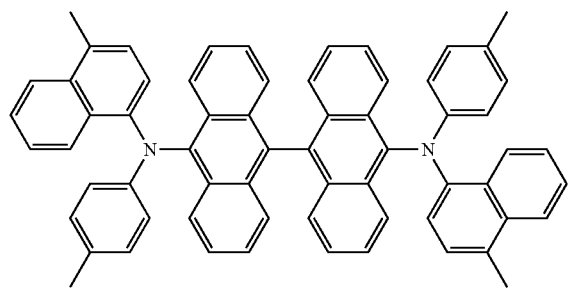
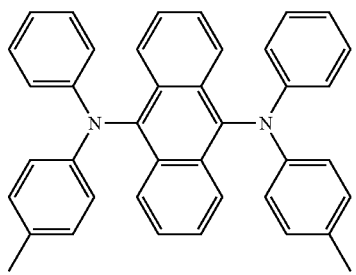
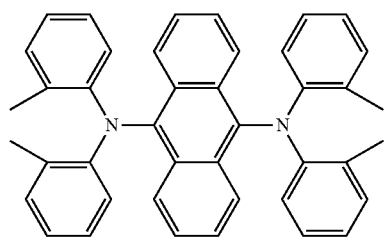
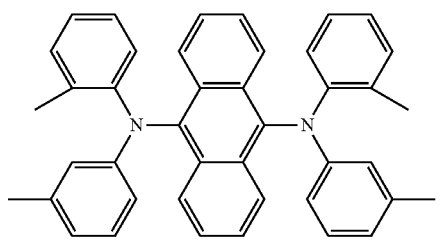
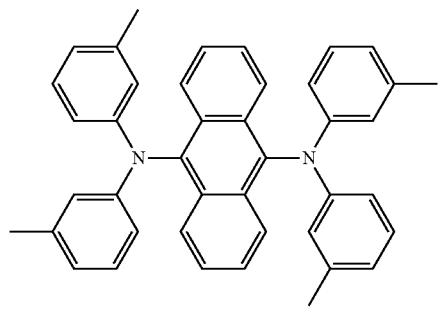
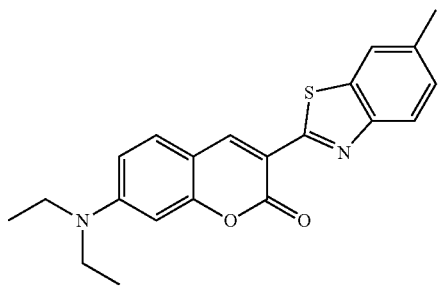
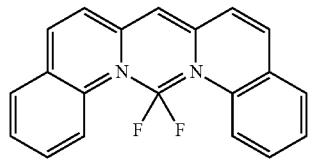
(2) Red- Emitting Compounds
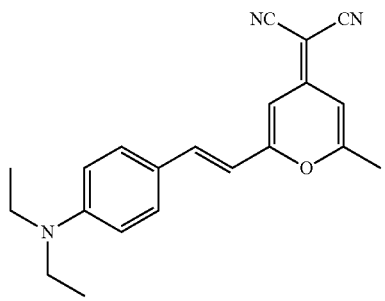
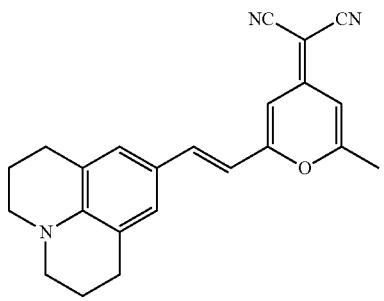

79
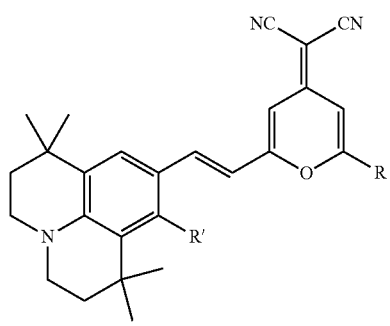
R = t-butyl; R' = H,
R = i-Pr; R' = H,
R = t-butyl; R' = OCH$_3$
80
-continued
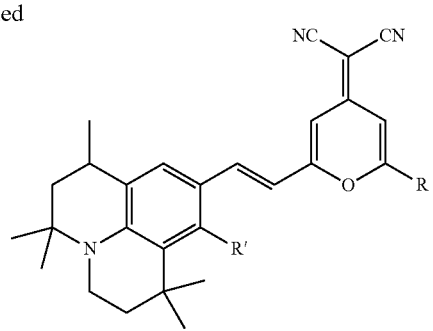
R = CH$_3$, C$_2$H$_5$, iso-propyl, t-butyl
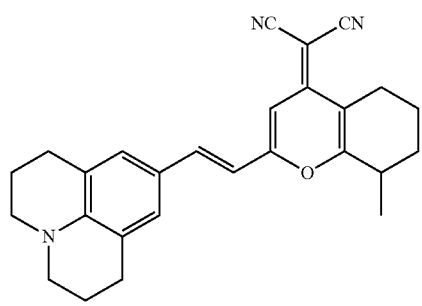
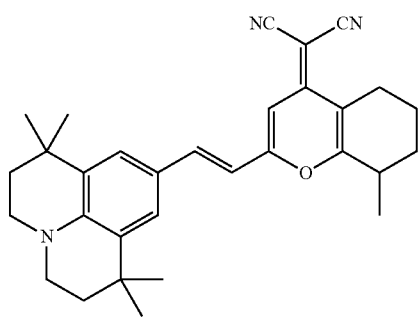
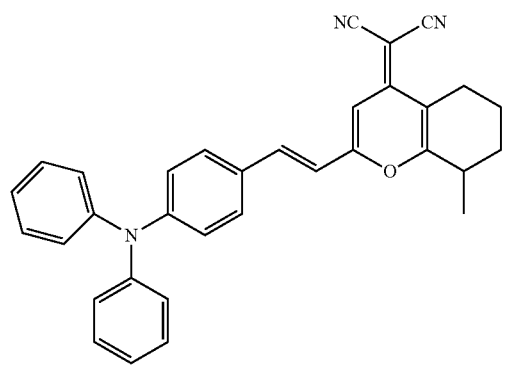
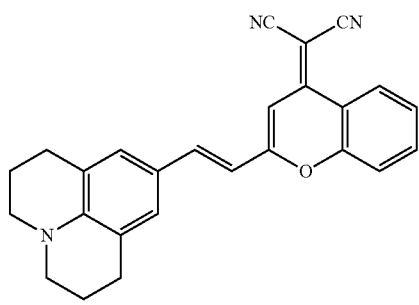
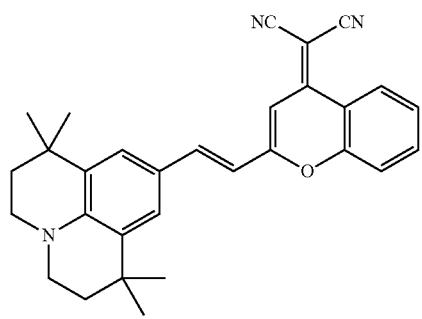
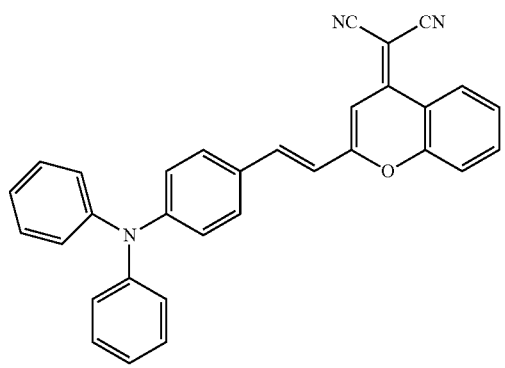

81
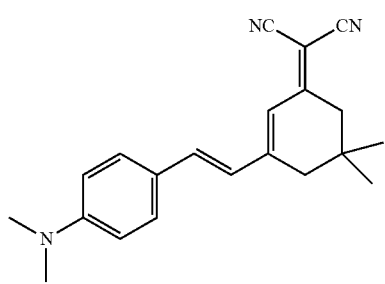
82
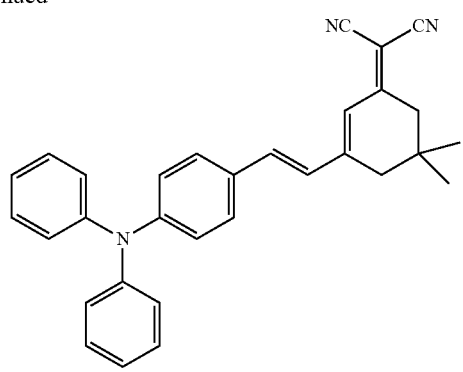
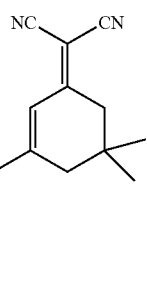
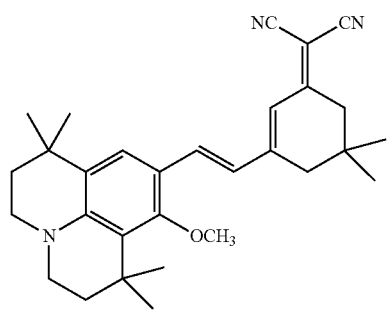
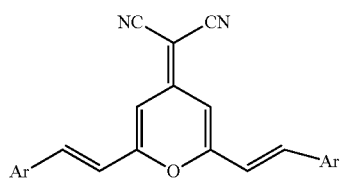
Ar =
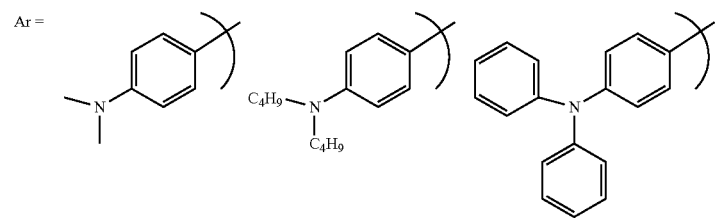
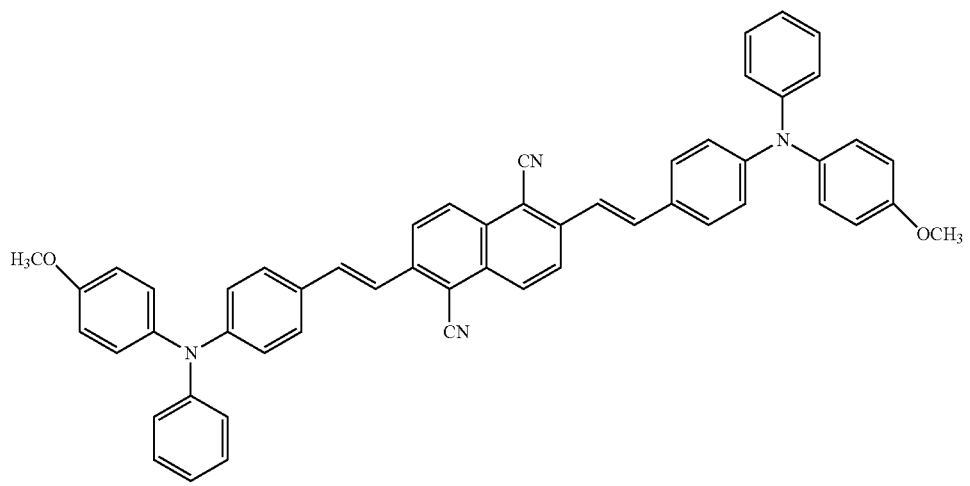

-continued
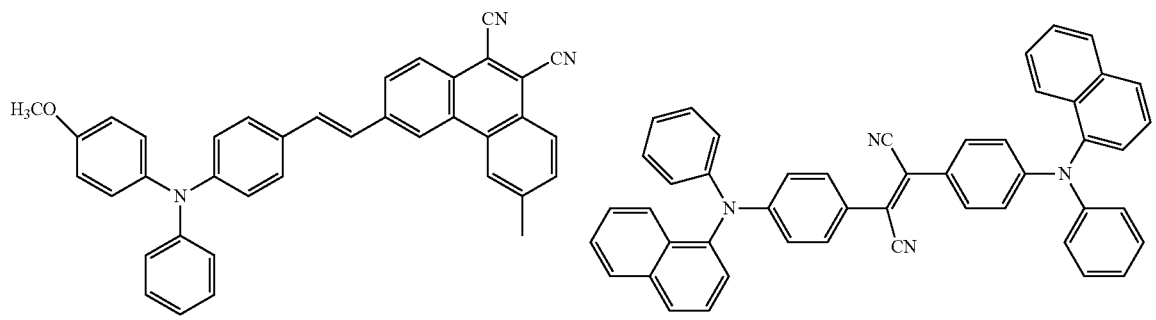
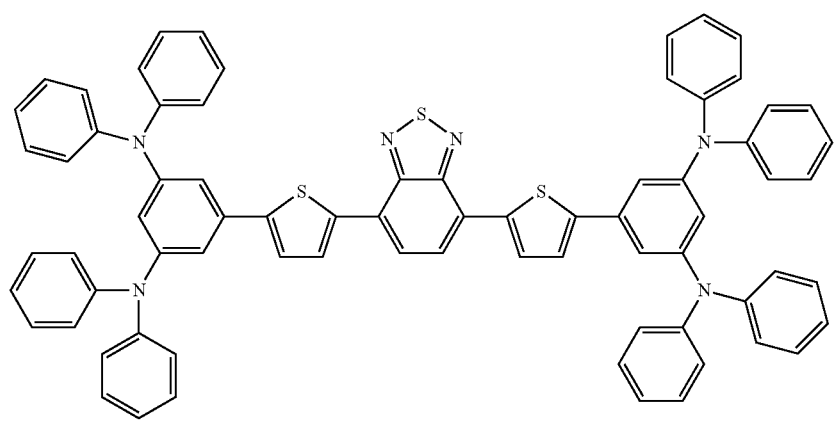
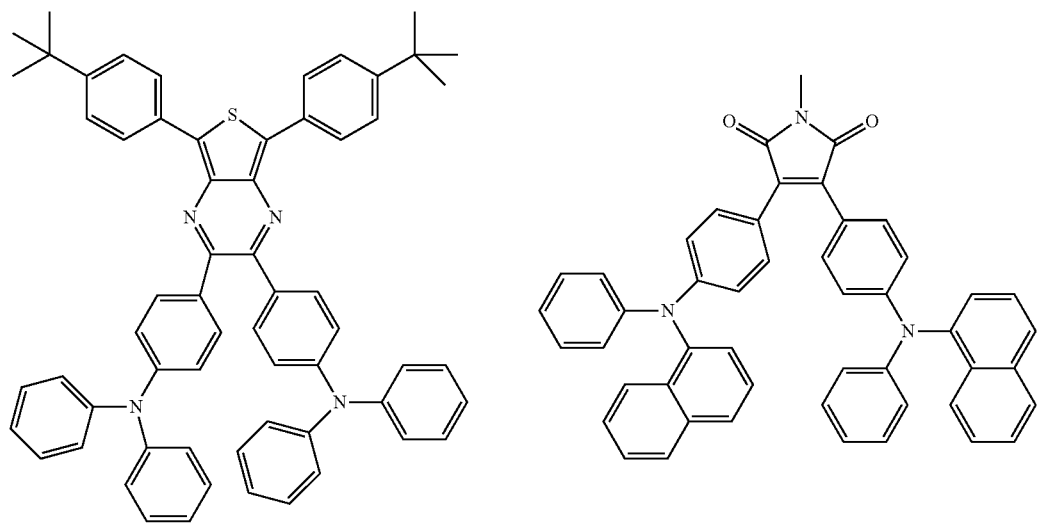
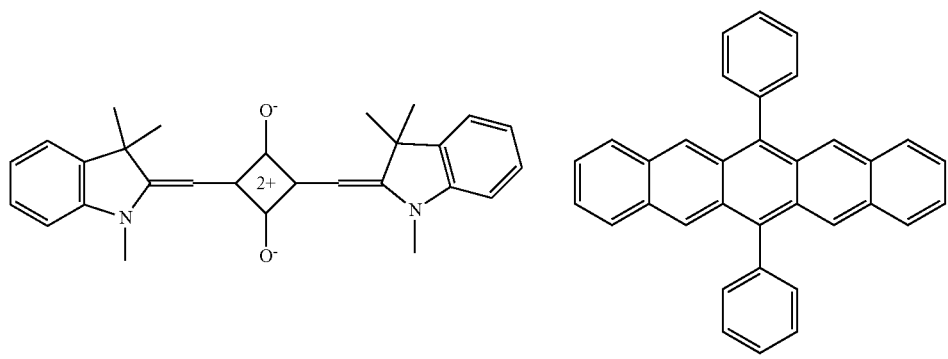

-continued
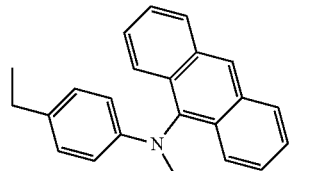
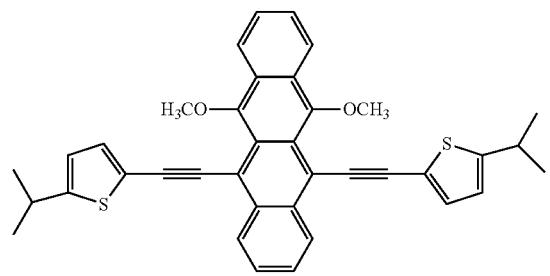
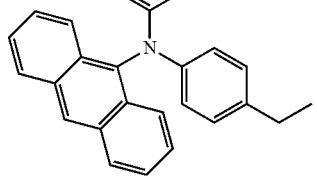
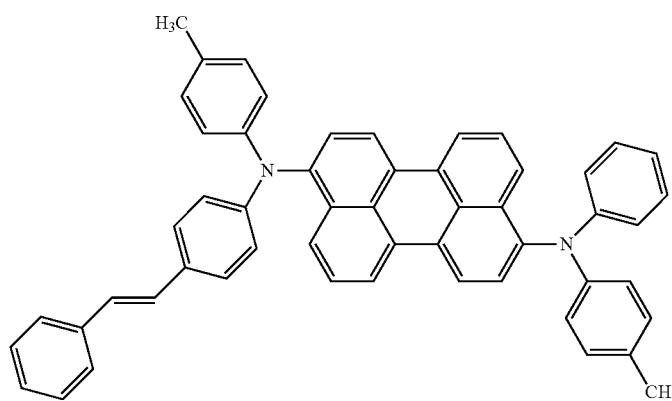
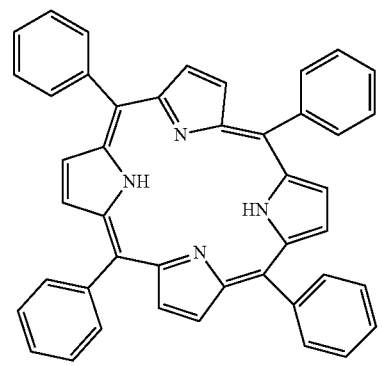
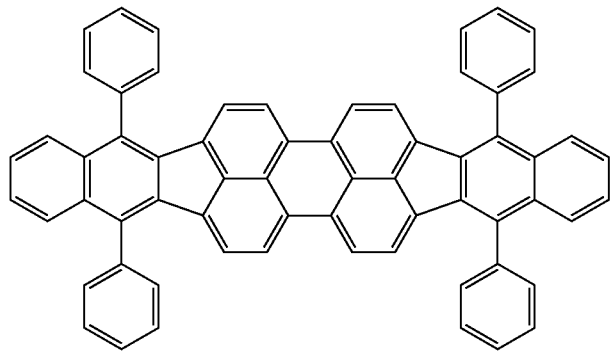
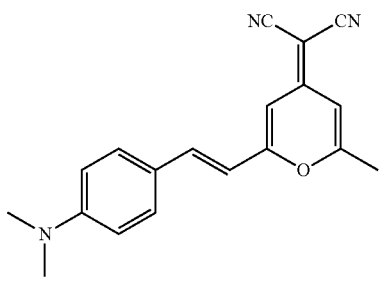
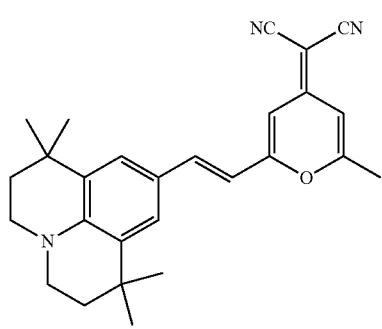
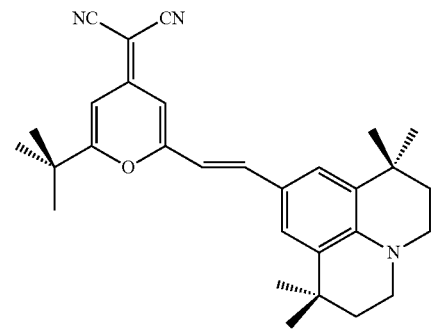

-continued
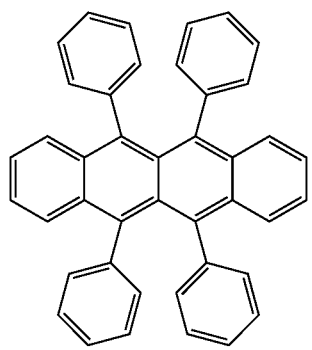
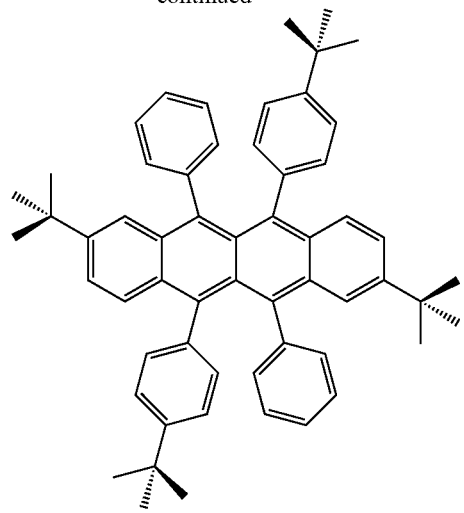
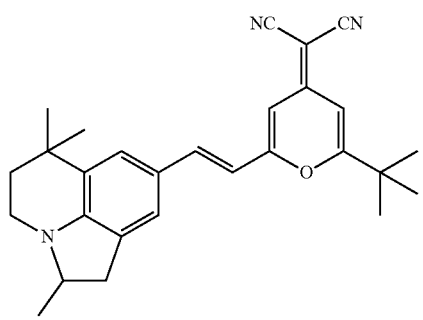
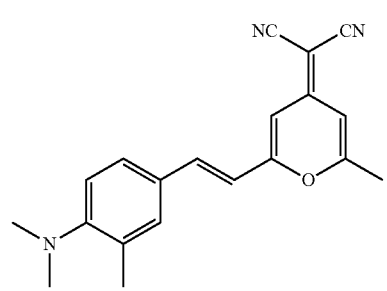
Blue-Emitting Compounds
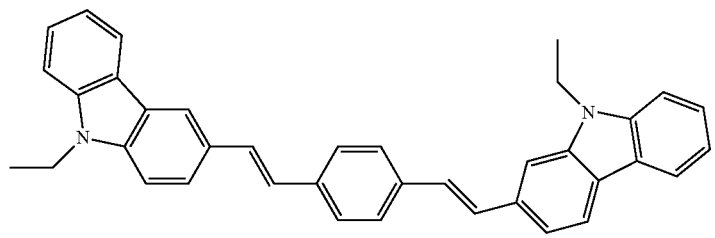
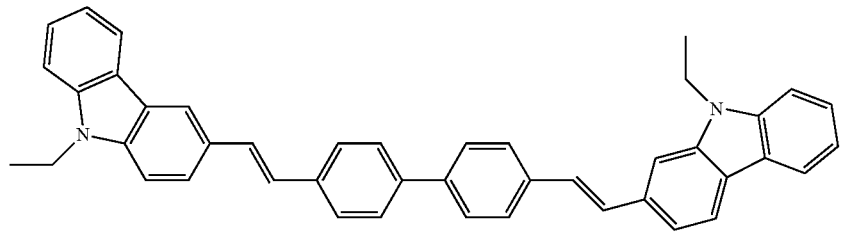
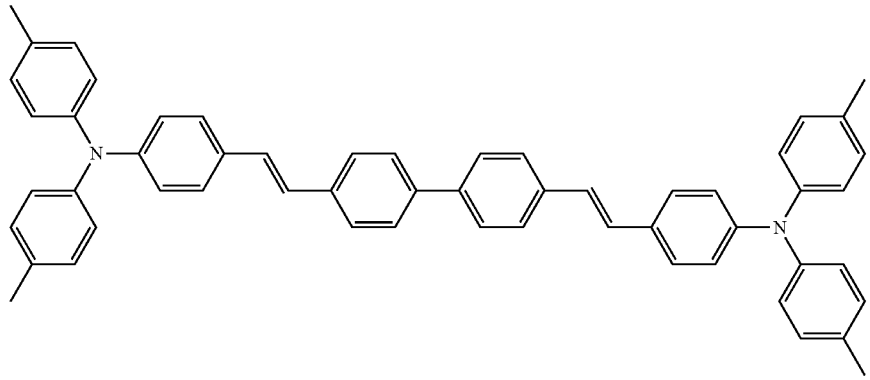
(3)

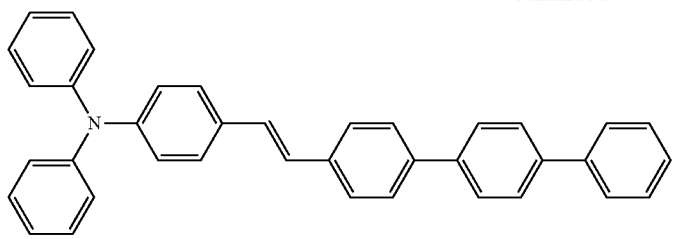
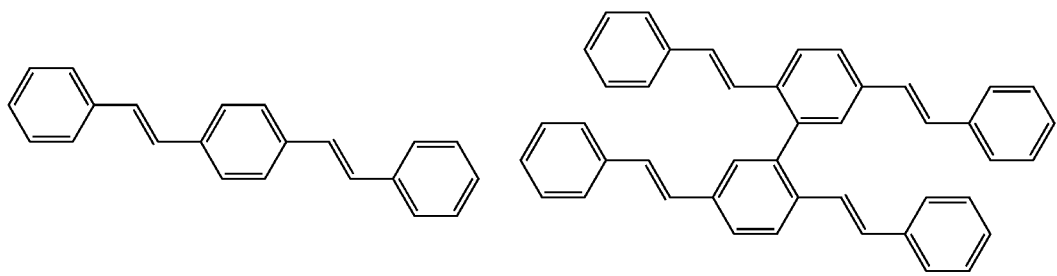
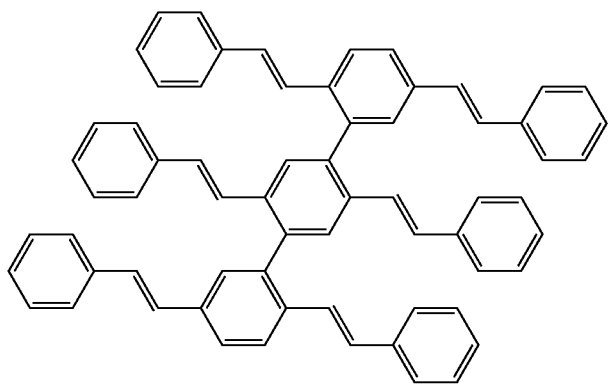
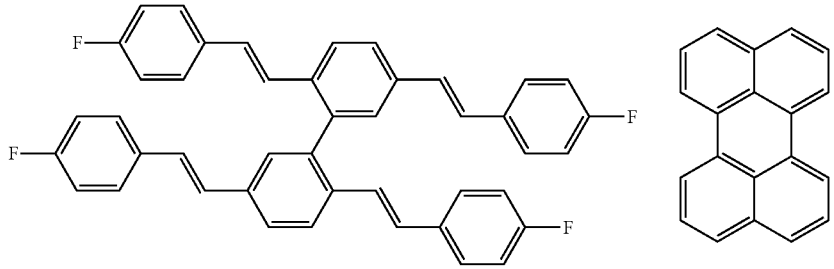
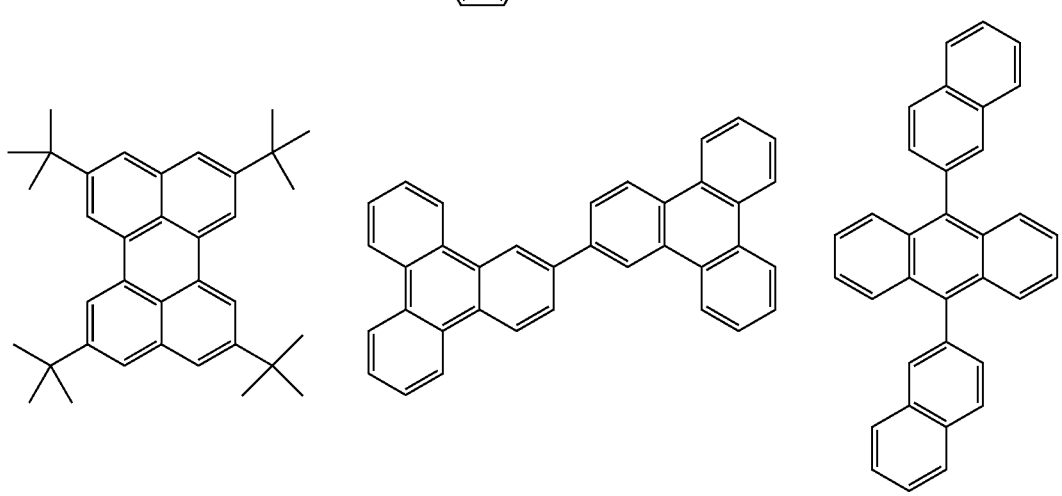

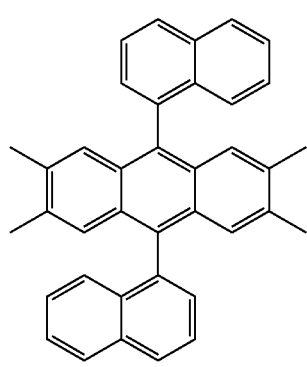

93
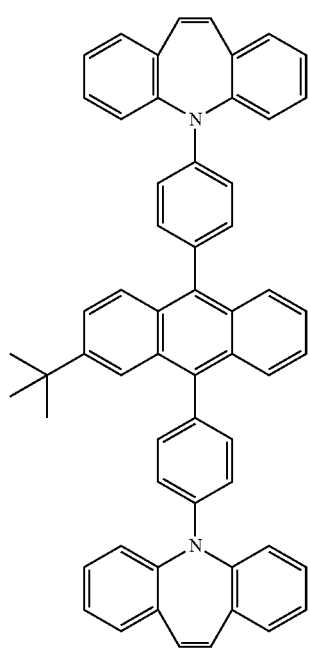
-continued
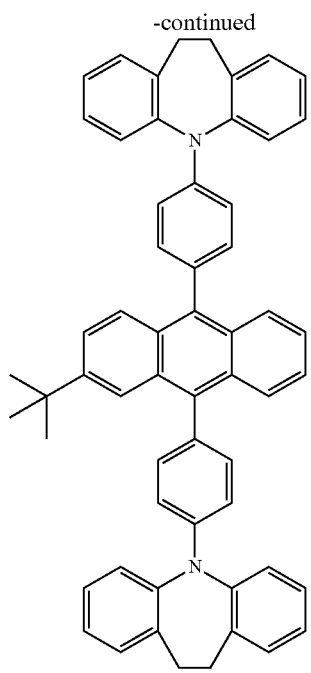
94
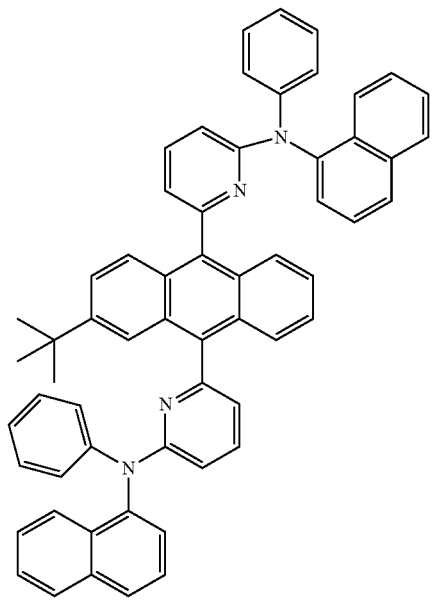
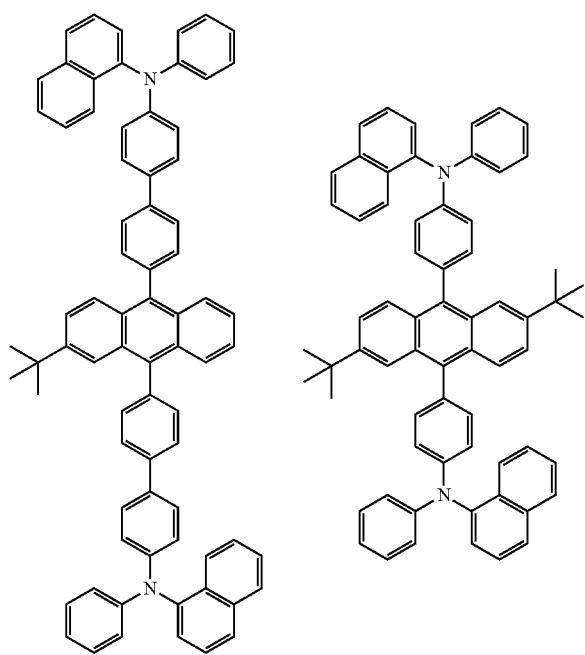

95 96
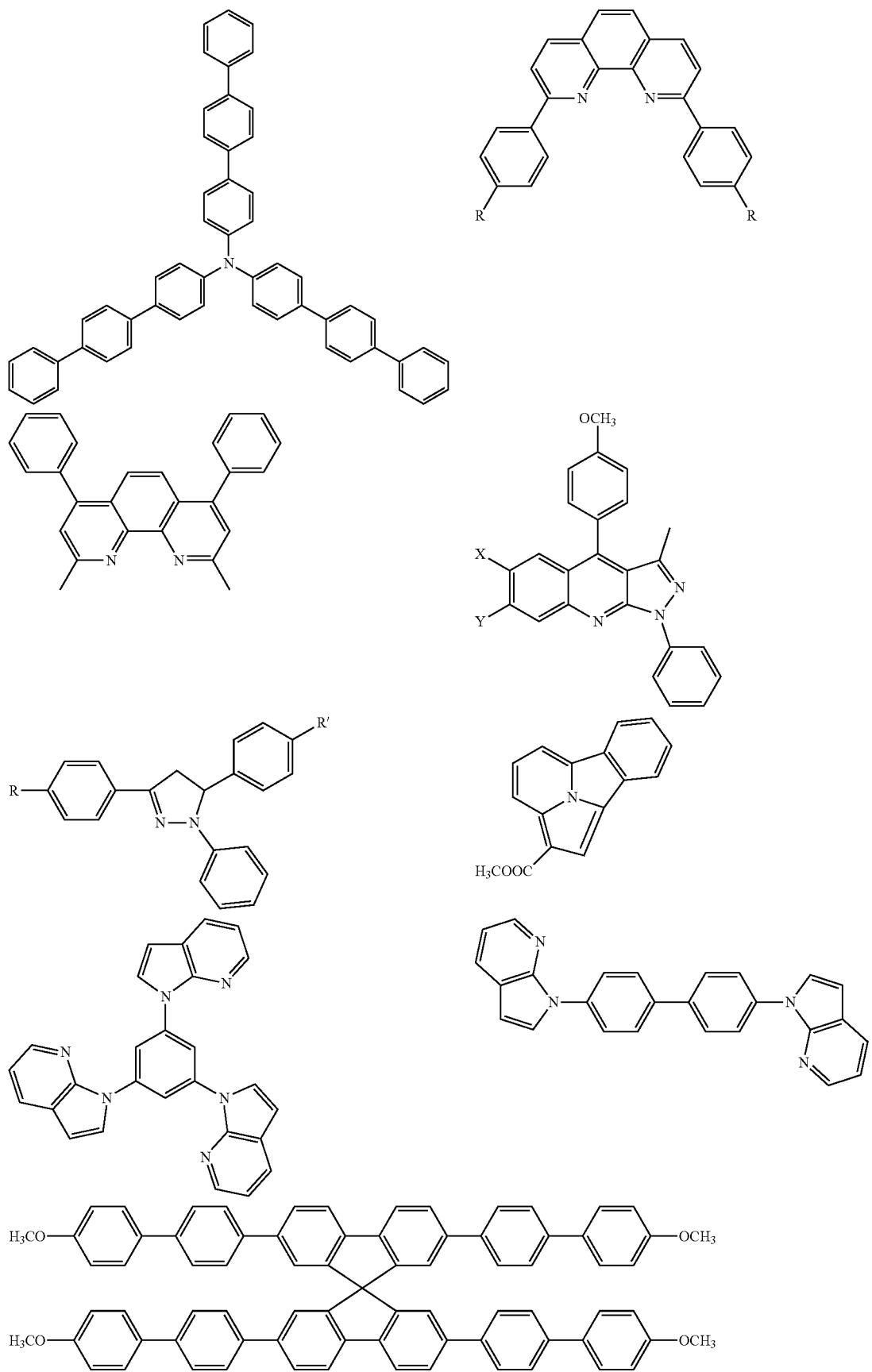

-continued
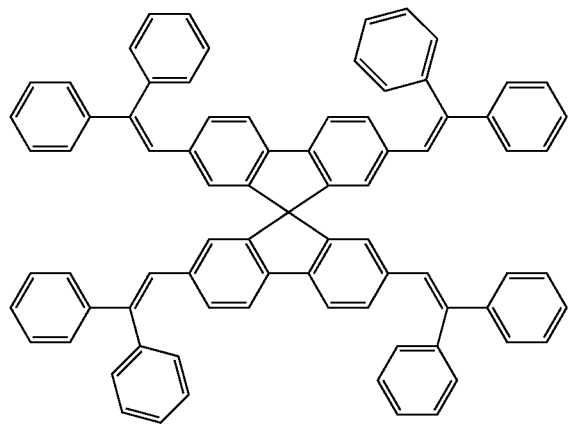
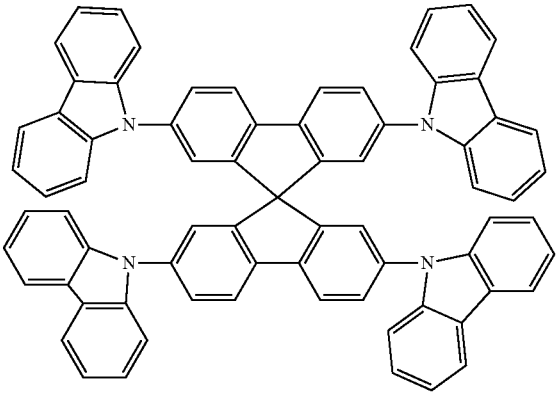
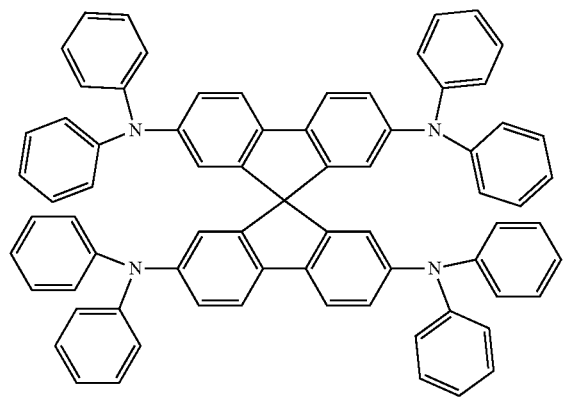
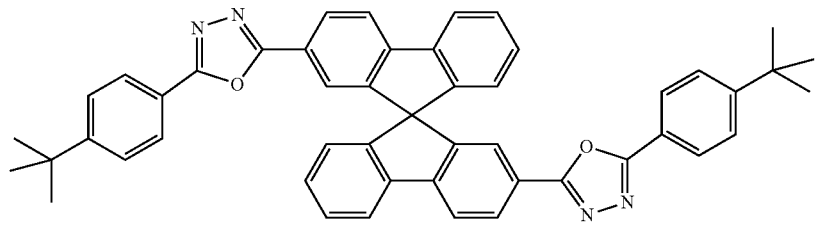
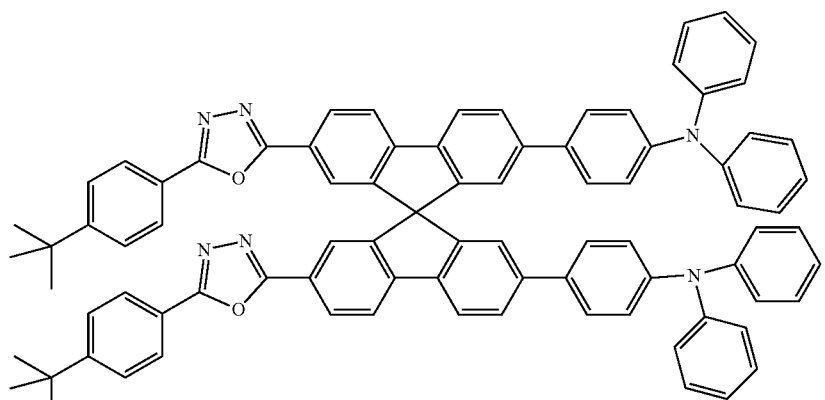
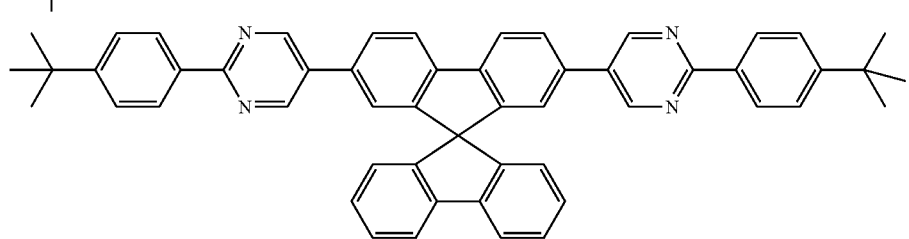

99
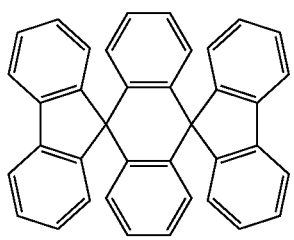
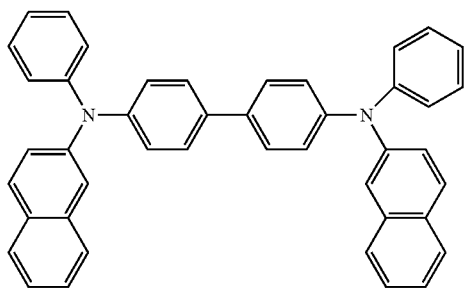
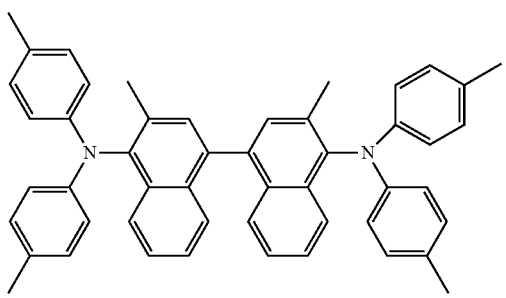
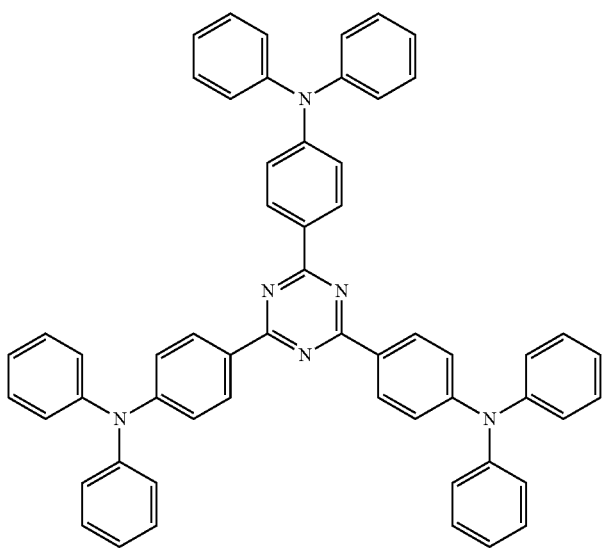
100
-continued
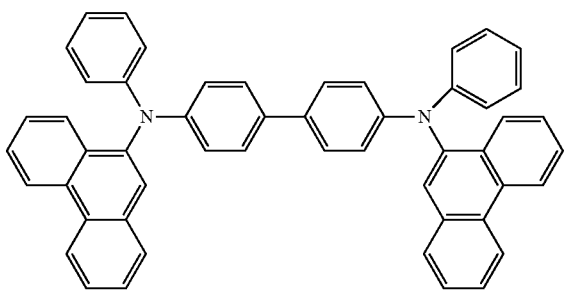
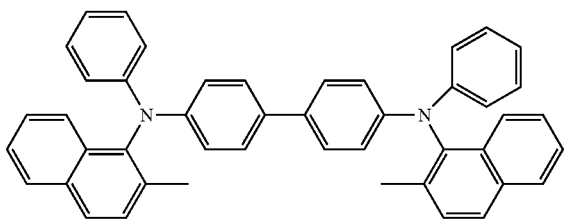
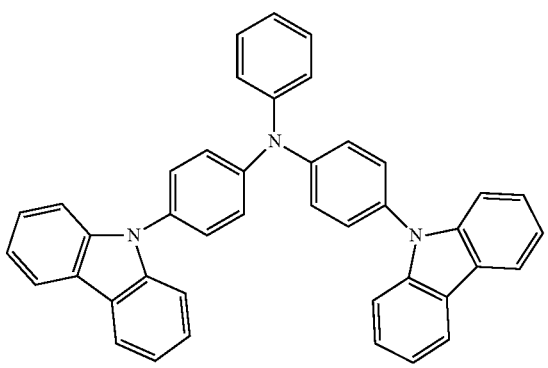
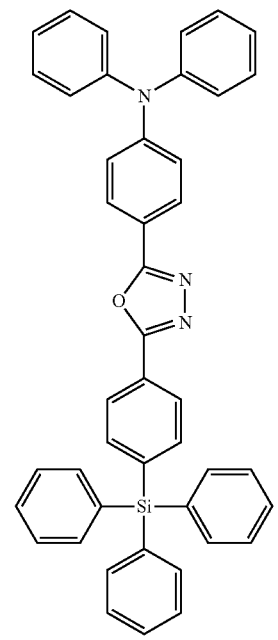

101
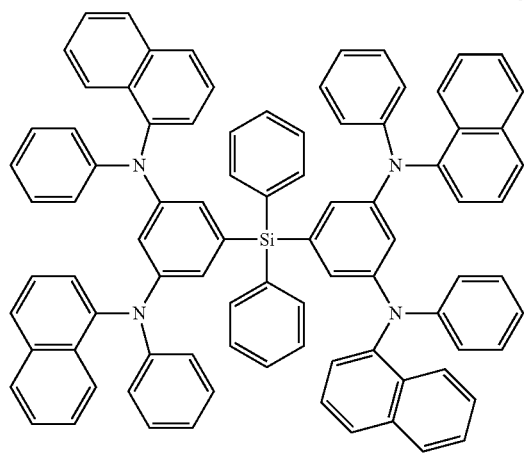
102
-continued
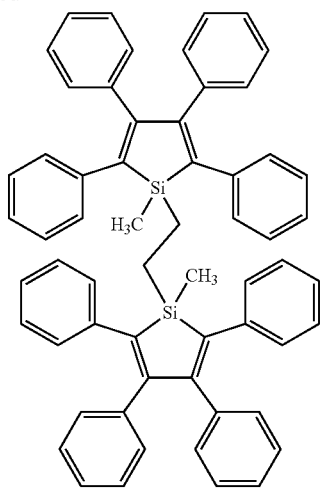
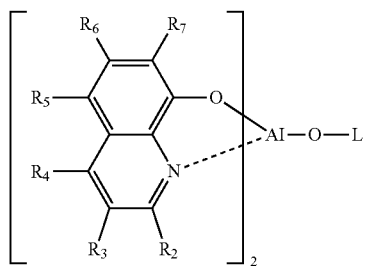
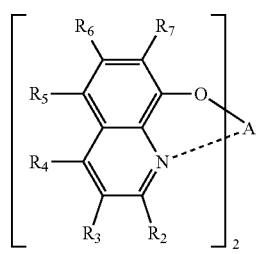
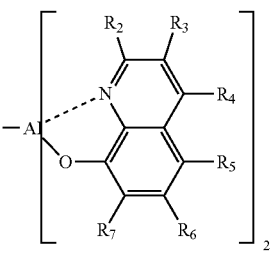
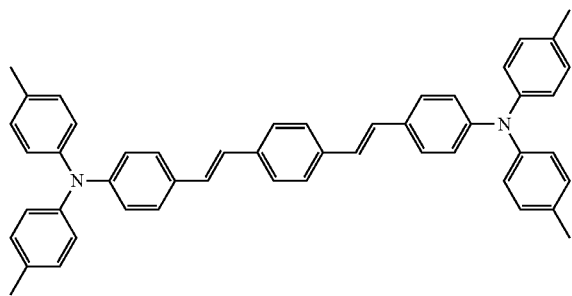
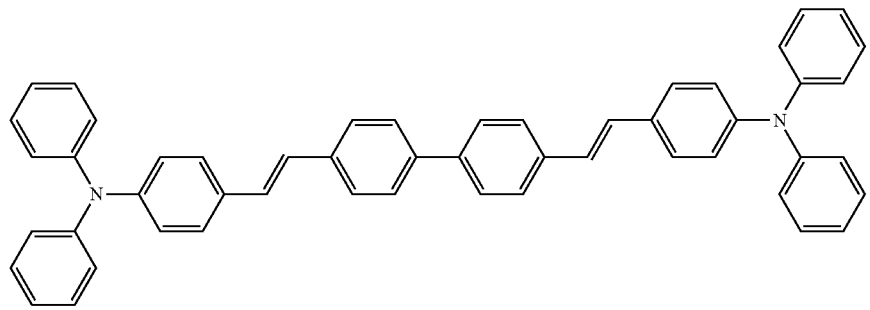
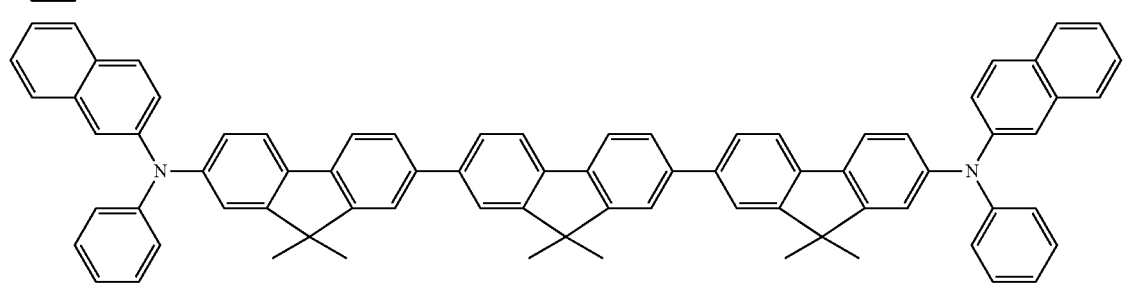

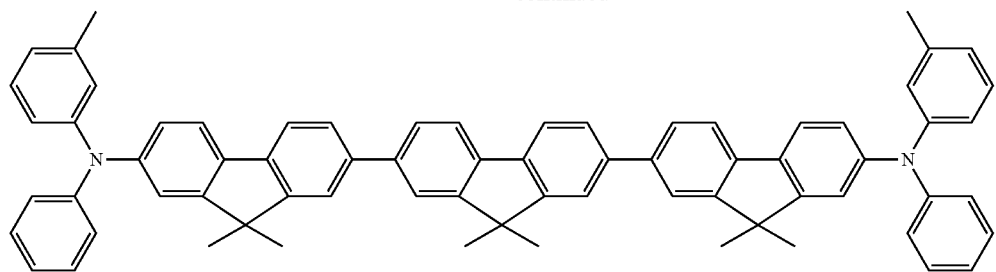
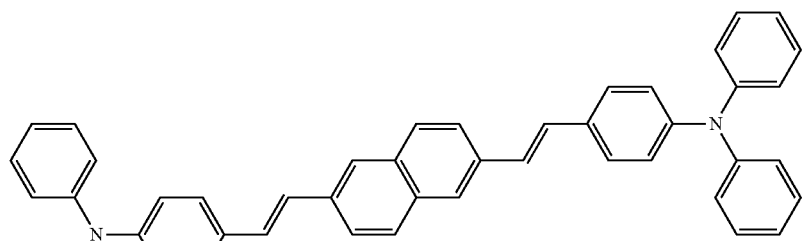
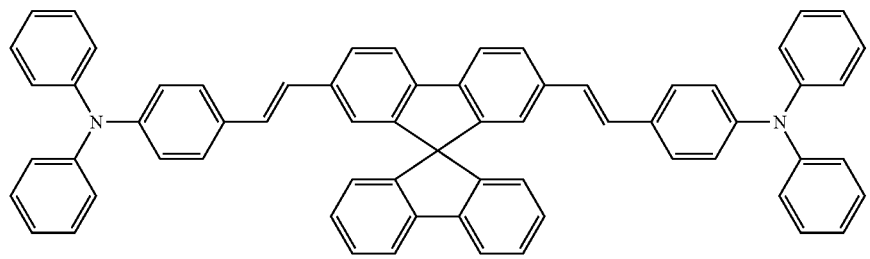
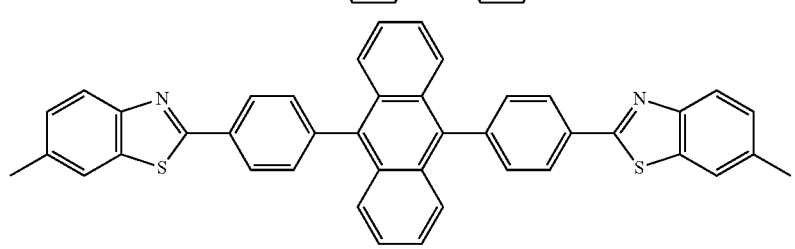
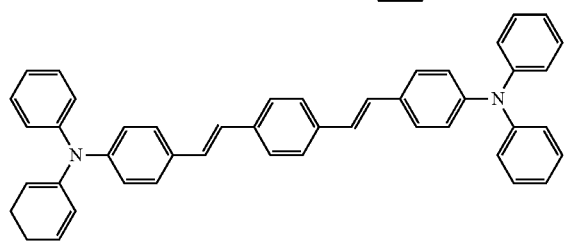
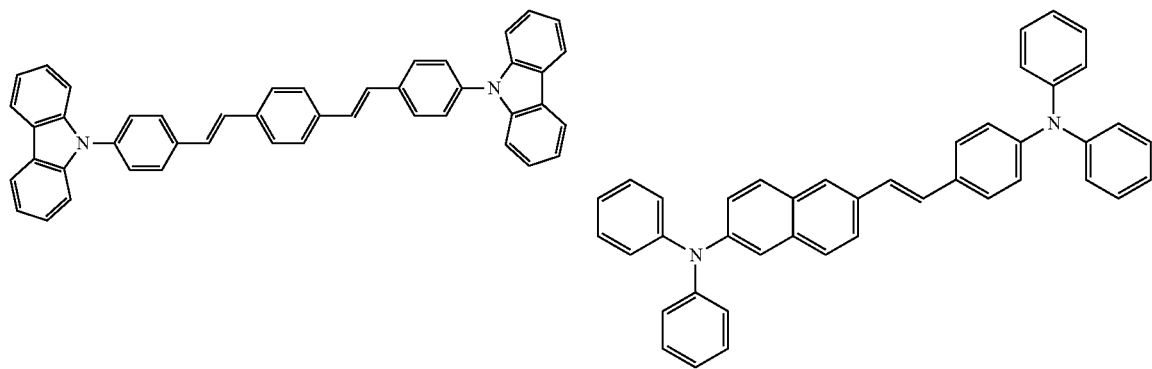

105
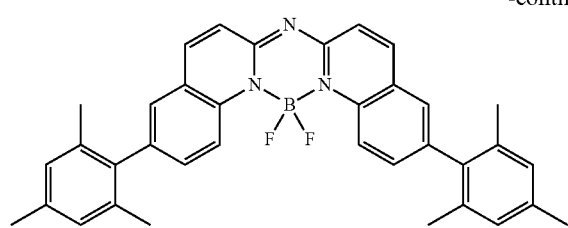
106
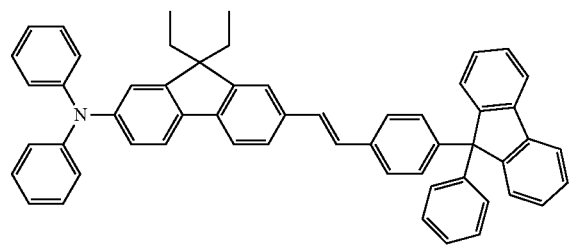
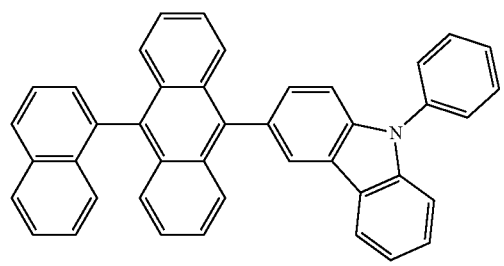
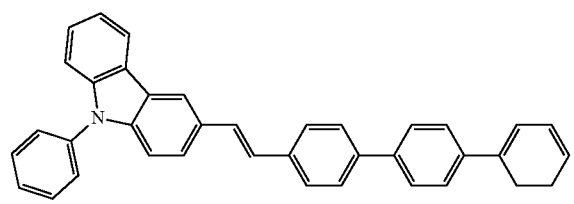
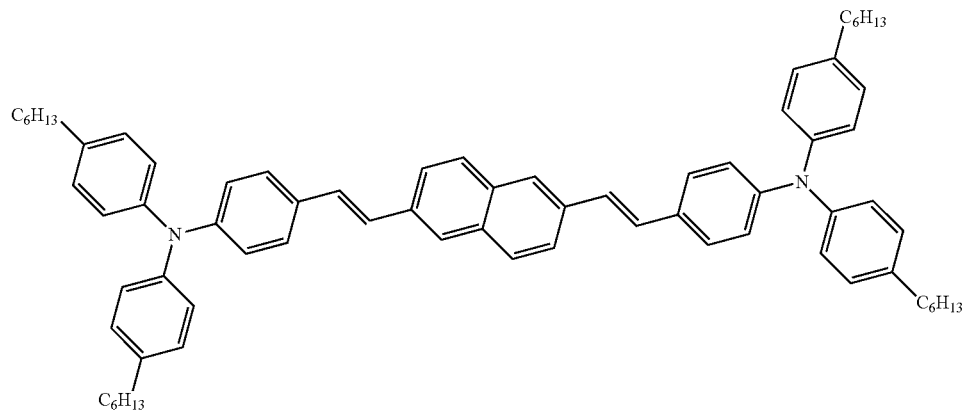
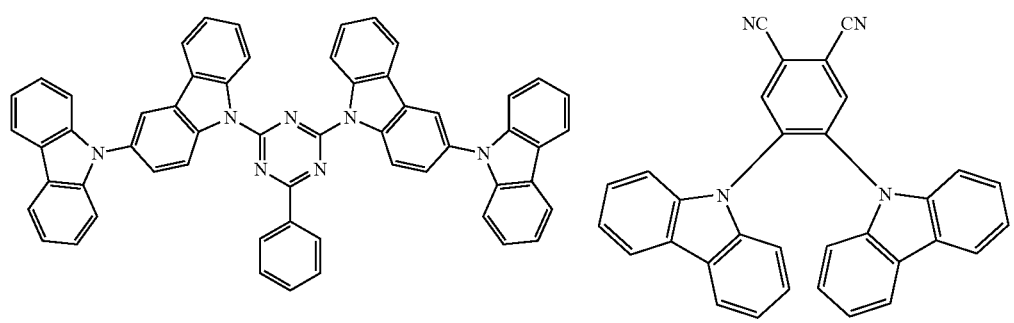

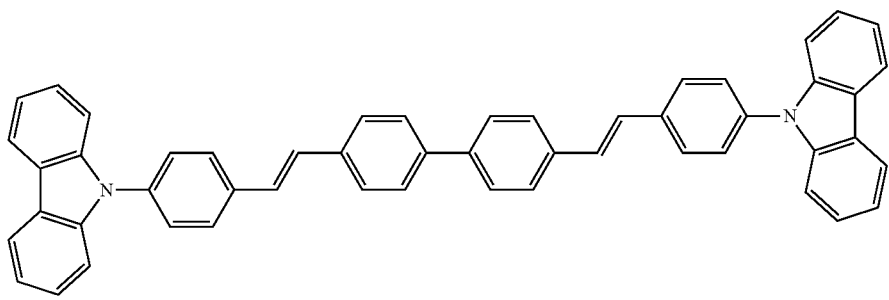

Yellow-Emitting Compound

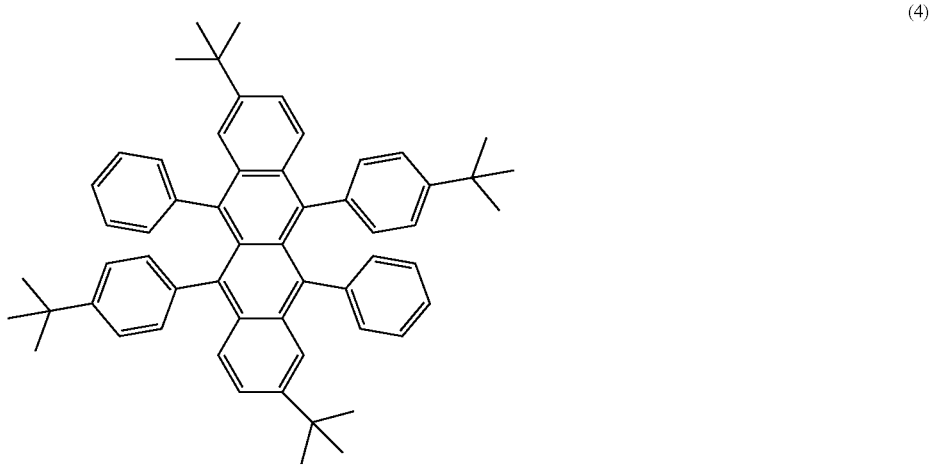

(4)

In addition to the above-mentioned light-emitting compounds, the following compounds can also be used as the eighth organic compound.

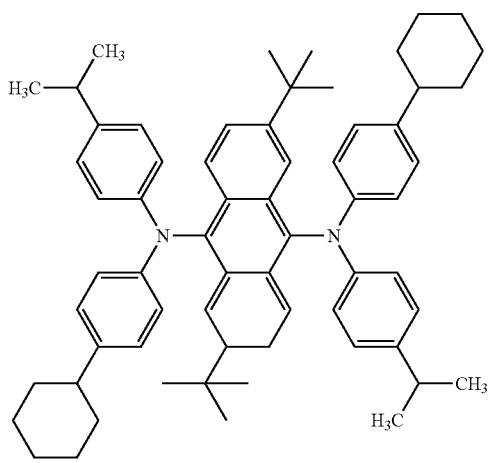

-continued

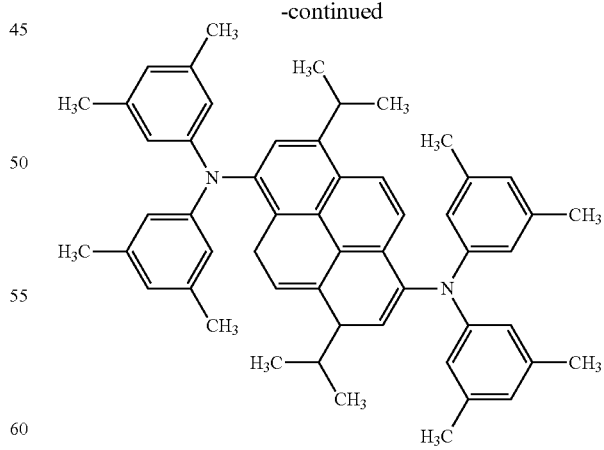

(Organic Mixed Layer)

The organic mixed layer in the second organic light-emitting device of the present invention contains a fifth organic compound and a sixth organic compound and a seventh organic compound and an eighth organic compound satisfying the requirement (b) and the requirement (c). The organic mixed layer can be designed so as not to contain any other compound and metal element to give or receive charges or energy, than the fifth organic compound and the sixth organic compound and the seventh organic compound and the eighth organic compound. The organic mixed layer may be composed of four compounds of the fifth organic compound and the sixth organic compound and the seventh organic compound and the eighth organic compound alone. Further, the organic mixed layer can be composed of compounds alone each formed of atoms selected from the group consisting of a carbon atom, a hydrogen atom, a nitrogen atom, an oxygen atom and a sulfur atom. Or the organic mixed layer can be composed of compounds alone each formed of atoms selected from the group consisting of a carbon atom, a hydrogen atom and a nitrogen atom.

The content of the fifth organic compound contained in the organic mixed layer is preferably 1% by weight or more of the organic mixed layer, and can be, for example, 10% by weight or more, 20% by weight or more, 30% by weight or more, 50% by weight or more, or 80% by weight or more. Also preferably, the content is 99% by weight or less of the organic mixed layer, and can be, for example, 90% by weight or less, as the case may be, 70% by weight or less, 50% by weight or less, 30% by weight or less, or 20% by weight or less.

The content of the sixth organic compound contained in the organic mixed layer is preferably 1% by weight or more of the organic mixed layer, and can be, for example, 10% by weight or more, 25% by weight or more, 45% by weight or more, 50% by weight or more. Also preferably, the content is 95% by weight or less of the organic mixed layer, and can be, for example, 80% by weight or less, or 60% by weight or less, or as the case may be, 50% by weight or less, 30% by weight or less, or 20% by weight or less.

The content of the seventh organic compound contained in the organic mixed layer is preferably 0.1% by weight or more of the organic mixed layer, and can be, for example, 1% by weight or more, or 3% by weight or more. Also preferably, the content is 30% by weight or less of the organic mixed layer, and can be, for example 20% by weight or less, 10% by weight or less, or 5% by weight or less.

The content of the eighth organic compound contained in the organic mixed layer is preferably 0.01% by weight or more of the organic mixed layer, and can be, for example, 0.1% by weight or more, or 1% by weight or more. Also preferably, the content is 30% by weight or less of the organic mixed layer, and can be, for example 10% by weight or less, 5% by weight or less, or 1% by weight or less.

Based on the inclination of the concentration quenching speed constant of the seventh organic compound as a parameter, the organic mixed layer can be defined. Also based on the inclination of the concentration quenching speed constant of the sixth organic compound as a parameter, the organic mixed layer can be defined.

Preferably, the content of the sixth organic compound is larger than the content of the seventh organic compound in the organic mixed layer. Also preferably, the content of the fifth organic compound is larger than the content of the seventh organic compound in the organic mixed layer. The content of the sixth organic compound may be larger than, or may be smaller than, or may be the same as the content of the fifth organic compound in the organic mixed layer. The content of the eighth organic compound is preferably smaller than the content of the fifth organic compound, the content of the sixth organic compound and the content of the seventh organic compound in the organic mixed layer.

For example, the composition of the organic mixed layer can be so controlled that the fifth organic compound accounts for 10 to 70% by weight, the sixth organic compound accounts for 10 to 80% by weight, the seventh organic compound accounts for 0.1 to 30% by weight, and the eighth organic compound accounts for 0.01 to 10% by weight. Also the composition of the organic mixed layer can be so controlled that the fifth organic compound accounts for 20 to 40% by weight, the sixth organic compound accounts for 40 to 60% by weight, the seventh organic compound accounts for 1 to 10% by weight, and the eighth organic compound accounts for 0.01 to 30% by weight.

Preferably, the kind and the content of the fifth organic compound, the sixth organic compound and the seventh organic compound in the organic mixed layer are to satisfy specific requirements. For example, when the total weight of the fifth organic compound, the sixth organic compound and the seventh organic compound contained in the organic mixed layer is 100% by weight, the content of the sixth organic compound therein is A % by weight, and the content of the seventh organic compound therein is B % by weight, preferably, A and B are so defined as to satisfy the following requirements in the present invention. The wavelength of the excitation light for use for photoexcitation to be described below is preferably 300 nm or more, and can be, for example, 337 nm. For minimizing measurement deviation, preferably, the measurement is carried out in a film thickness satisfying a sufficient absorbance, and, for example, the film thickness can be 50 nm.

(1) The emission quantum yield $\phi_{PL2}(A)$ by photoexcitation of a co-deposited film of the sixth organic compound and the fifth organic compound (content of the sixth organic compound in the co-deposited film=A % by weight), and the emission quantum yield $\phi_{PL3}(A)$ by photoexcitation of a co-deposited film of the seventh organic compound and the fifth organic compound (content of the seventh organic compound in the co-deposited film=A % by weight) satisfy the following relational formula:

$\phi_{PL2}(A)>PLU(A)$ (2) The emission quantum yield $\phi_{PL3}(B)$ by photoexcitation of a co-deposited film of the seventh organic compound and the fifth organic compound (content of the seventh organic compound in the co-deposited film=B % by weight), and the emission quantum yield $\phi_{PL3}(100)$ by photoexcitation of a single film of the seventh organic compound satisfy the following relational formulae:

$\phi_{PL3}(B)>X\%$ $\phi_{PL3}(100)<X\%$

In the above (1), A is preferably selected from a range of 15 to 75% by weight, and the lower limit can be 15% by weight or more, 20% by weight or more, 25% by weight or more, or 30% by weight or more in embodiments. The upper limit can be 75% by weight or less, 60% by weight or less, 50% by weight or less, or 40% by weight or less in embodiments. B is preferably selected from a range of 0.01 to 30% by weight, and the lower limit can be 0.01% by weight or more, 0.1% by weight or more, 0.5% by weight or more, 1% by weight or more, 5% by weight or more, 10% by weight or more, or 15% by weight or more in embodiments. The upper limit can be 20% by weight or less, 25% by weight or less, or 30% by weight or less in embodiments. X can be 20 to 100%, 30 to 100%, or 40 to 100% in embodiments, preferably 50 to 100%, 60 to 100%, 70 to 100%, or 80 to 100% in embodiments. $\phi_{PL3}(100)$ can be less than 30%, less than 25%, less than 20%, less than 15%, or less than 10% in embodiments.

By forming the organic mixed layer in which the kind and the content of the fifth organic compound, the sixth organic compound and the seventh organic compound are selected so as to satisfy the above relational formulae (1) and (2), the lifetime of the resultant organic light-emitting device can be effectively prolonged. A combination of the fifth organic compound, the sixth organic compound and the seventh organic compound in that manner is, for example, a combination of mCBP, 4CzIPN-Me, and 4CzTPN. In this case, the emission quantum yield $\phi_{PL3}(100)$ by photoexcitation of the single film of the seventh organic compound alone is 8%, and the emission quantum yield $\phi_{PL3}(5)$ by photoexcitation of the co-deposited film of the seventh organic compound and the fifth organic compound (content of the seventh organic compound=5% by weight) is 52%. The emission quantum yield $\phi_{PL2}(50)$ by photoexcitation of the co-deposited film of the sixth organic compound and the fifth organic compound (content of the sixth organic compound=50% by weight) is larger than the emission quantum yield $\phi_{PL3}(50)$ by photoexcitation of the co-deposited film of the seventh organic compound and the fifth organic compound (content of the seventh organic compound=50% by weight). Another example satisfying the above relations (1) and (2) is a combination of mCBP, 4CzIPN, and 4CzTPN.

The organic mixed layer can be formed by co-evaporation of the fifth organic compound, the sixth organic compound, the seventh organic compound and the eighth organic compound, or can be formed by a coating method using a solution prepared by dissolving the fifth organic compound, the sixth organic compound, the seventh organic compound and the eighth organic compound. In the case where the organic mixed layer is formed by co-evaporation, two or more of the fifth organic compound, the sixth organic compound, the seventh organic compound and the eighth organic compound may be previously mixed and put into a crucible or the like as an evaporation source, and using the evaporation source, the organic mixed layer may be formed by co-evaporation. For example, the sixth organic compound and the seventh organic compound are previously mixed to prepare one evaporation source, and using the evaporation source and another evaporation source of the fifth organic compound and another evaporation source of the eighth organic compound, an organic mixed layer can be formed by co-evaporation. Or the seventh organic compound and the eighth organic compound are previously mixed to prepare one evaporation source, and using the evaporation source and another evaporation source of the fifth organic compound and another evaporation source of the sixth organic compound, an organic mixed layer can be formed by co-evaporation. Or the sixth organic compound and the seventh organic compound and the eighth organic compound are previously mixed to prepare one evaporation source, and using the evaporation source and another evaporation source of the fifth organic compound, an organic mixed layer can be formed by co-evaporation.

<Layer Configuration of First Organic Light-Emitting Device and Second Organic Light-Emitting Device>

By forming an organic mixed layer that contains the first organic compound and the second organic compound and the third organic compound satisfying the requirement (a), there can be provided an excellent organic light-emitting device such as an organic photoluminescent device (organic PL device) and an organic electroluminescent device (organic EL device). Also by forming an organic mixed layer that contains the fifth organic compound and the sixth organic compound and the seventh organic compound and the eighth organic compound satisfying the requirement (b) and the requirement (c), there can be provided an excellent organic light-emitting device such as an organic photoluminescent device (organic PL device) and an organic electroluminescent device (organic EL device).

The organic mixed layer can be formed as a light-emitting layer of the organic light-emitting device, or can be formed as a layer neighboring to the light-emitting layer, such as an exciton generating layer or an exciplex layer, or can be formed via a layer adjacent to the light-emitting layer. In the present invention, by forming the organic mixed layer as a layer neighboring to the light-emitting layer, a long lifetime and a high light emission efficiency can be realized. The light-emitting layer as referred to herein is a layer that has a higher emission intensity than the organic mixed layer neighboring to the light-emitting layer, and in the case, the organic mixed layer may be a layer that does not emit light, or may be a layer that emits light. In the case where the organic mixed layer is an exciton generating layer, preferably, the light-emitting material in the light-emitting layer neighboring to the organic mixed layer has a lower lowest excited singlet energy level than the first organic compound and the second organic compound in the first organic light-emitting device, and has a lower lowest excited singlet energy level than the third organic compound. Also preferably, the light-emitting material in the light-emitting layer neighboring to the organic mixed layer has a lower lowest excited single energy level than the fifth organic compound and the sixth organic compound in the second organic light-emitting device, and has a lower lowest excited single energy level than the seventh organic compound. Accordingly, the excitons generated in the organic mixed layer can be efficiently transferred to the light-emitting layer. In the case where the organic mixed layer is formed as a light-emitting layer, the thickness thereof may be, for example, 1 to 15 nm, or may be 2 to 10 nm, or may be 3 to 7 nm. In the case where the organic mixed layer is formed as a layer different from a light-emitting layer, the thickness thereof may be for example, 1 to 60 nm, or may be 5 to 50 nm, or may be 10 to 40 nm. The light-emitting layer can be an organic mixed layer alone.

An organic photoluminescent device has a configuration that has at least a light-emitting layer formed a substrate. An organic electroluminescent device has a configuration that has at least an anode, a cathode, and an organic layer formed between the anode and the cathode. The organic layer contains at least a light-emitting layer, and can be a light-emitting layer alone, or can have any other one or more organic layers than a light-emitting layer. Such other organic layers include a hole transporting layer, a hole injection layer, an electron barrier layer, a hole barrier layer, an electron injection layer, an electron transporting layer, and an exciton barrier layer. The hole transporting layer may also be a hole injection and transporting layer having a hole injection function, and the electron transporting layer may also be an electron injection transporting layer having an electron injection function. A specific configuration example of an organic electroluminescent device is shown in FIG. 1. In FIG. 1, 1 is a substrate, 2 is an anode, 3 is a hole injection layer, 4 is a hole transporting layer, 5 is a light-emitting layer, 6 is an electron transporting layer, and 7 is a cathode.

In the case where the organic light-emitting device of the present invention is a multi-wavelength emission-type organic light-emitting device, the device can be so designed that shortest wavelength emission does not contain delayed fluorescence. In particular, as the first organic compound and the fifth organic compound, materials that are not delayed fluorescent materials can be selected, or as the light-emitting material in the light-emitting layer neighboring to the organic mixed layer, a light-emitting material having a lower lowest excited singlet energy level than the second organic compound, the sixth organic compound and the seventh organic compound can be selected.

In the following, the constituent members and the other layers than a light-emitting layer of the organic electroluminescent device are described. In the following description, the organic mixed layer is a light-emitting layer.

Substrate:

In some embodiments, the organic electroluminescent device of the invention is supported by a substrate, wherein the substrate is not particularly limited and may be any of those that have been commonly used in an organic electroluminescent device, for example those formed of glass, transparent plastics, quartz and silicon.

Anode:

In some embodiments, the anode of the organic electroluminescent device is made of a metal, an alloy, an electroconductive compound, or a combination thereof. In some embodiments, the metal, alloy, or electroconductive compound has a large work function (4 eV or more). In some embodiments, the metal is Au. In some embodiments, the electroconductive transparent material is selected from CuI, indium tin oxide (ITO), SnO2, and ZnO. In some embodiments, an amorphous material capable of forming a transparent electroconductive film, such as IDIXO ($In_2O_3$—ZnO), is used. In some embodiments, the anode is a thin film. In some embodiments, the thin film is made by vapor deposition or sputtering. In some embodiments, the film is patterned by a photolithography method. In some embodiments, where the pattern may not require high accuracy (for example, approximately 100 μm or more), the pattern may be formed with a mask having a desired shape on vapor deposition or sputtering of the electrode material. In some embodiments, when a material can be applied as a coating, such as an organic electroconductive compound, a wet film forming method, such as a printing method and a coating method is used. In some embodiments, when the emitted light goes through the anode, the anode has a transmittance of more than 10%, and the anode has a sheet resistance of several hundred Ohm per square or less. In some embodiments, the thickness of the anode is from 10 to 1,000 nm. In some embodiments, the thickness of the anode is from 10 to 200 nm. In some embodiments, the thickness of the anode varies depending on the material used.

Cathode:

In some embodiments, the cathode is made of an electrode material such as a metal having a small work function (4 eV or less) (referred to as an electron injection metal), an alloy, an electroconductive compound, or a combination thereof. In some embodiments, the electrode material is selected from sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. In some embodiments, a mixture of an electron injection metal and a second metal that is a stable metal having a larger work function than the electron injection metal is used. In some embodiments, the mixture is selected from a magnesium-silver mixture, a magnesium-aluminum mixture, a magnesium-indium mixture, an aluminum-aluminum oxide ($Al_2O_3$) mixture, a lithium-aluminum mixture, and aluminium. In some embodiments, the mixture increases the electron injection property and the durability against oxidation. In some embodiments, the cathode is produced by forming the electrode material into a thin film by vapor deposition or sputtering. In some embodiments, the cathode has a sheet resistance of several hundred Ohm per square or less. In some embodiments, the thickness of the cathode ranges from 10 nm to 5 μm. In some embodiments, the thickness of the cathode ranges from 50 to 200 nm. In some embodiments, for transmitting the emitted light, any one of the anode and the cathode of the organic electroluminescent device is transparent or translucent. In some embodiments, the transparent or translucent electroluminescent devices enhance the light emission luminance.

In some embodiments, the cathode is formed with an electroconductive transparent material, as described for the anode, to form a transparent or translucent cathode. In some embodiments, a device comprises an anode and a cathode, both being transparent or translucent.

Injection Layer:

An injection layer is a layer between the electrode and the organic layer. In some embodiments, the injection layer decreases the driving voltage and enhances the light emission luminance. In some embodiments, the injection layer includes a hole injection layer and an electron injection layer. The injection layer can be positioned between the anode and the light-emitting layer or the hole transporting layer, and between the cathode and the light-emitting layer or the electron transporting layer. In some embodiments, an injection layer is present. In some embodiments, no injection layer is present.

Preferred compound examples for use as a hole injection material are shown below.

$MoO_3$,

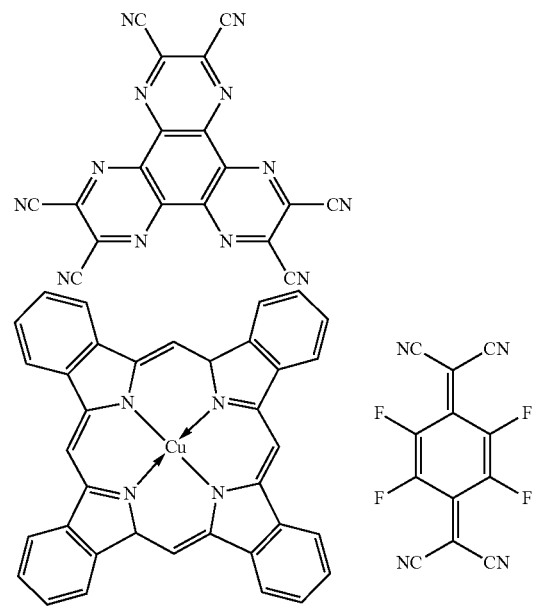

-continued

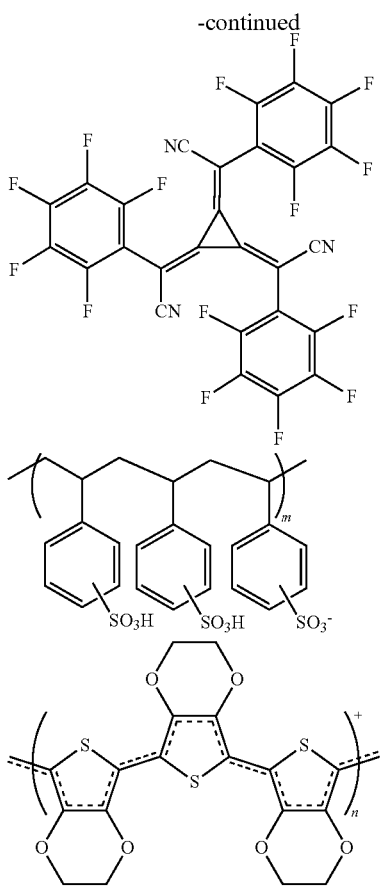

Next, preferred compound examples for use as an electron injection material are shown below.

LiF, CsF,

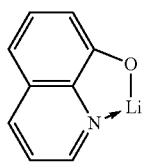

Barrier Layer:

A barrier layer is a layer capable of inhibiting charges (electrons or holes) and/or excitons present in the light-emitting layer from being diffused outside the light-emitting layer. In some embodiments, the electron barrier layer is between the light-emitting layer and the hole transporting layer, and inhibits electrons from passing through the light-emitting layer toward the hole transporting layer. In some embodiments, the hole barrier layer is between the light-emitting layer and the electron transporting layer, and inhibits holes from passing through the light-emitting layer toward the electron transporting layer. In some embodiments, the barrier layer inhibits excitons from being diffused outside the light-emitting layer. In some embodiments, the electron barrier layer and the hole barrier layer are exciton barrier layers. As used herein, the term "electron barrier layer" or "exciton barrier layer" includes a layer that has the functions of both electron barrier layer and of an exciton barrier layer.

Hole Barrier Layer:

A hole barrier layer acts as an electron transporting layer. In some embodiments, the hole barrier layer inhibits holes from reaching the electron transporting layer while transporting electrons. In some embodiments, the hole barrier layer enhances the recombination probability of electrons and holes in the light-emitting layer. The material for the hole barrier layer may be the same materials as the ones described for the electron transporting layer.

Preferred compound examples for use for the hole barrier layer are shown below.

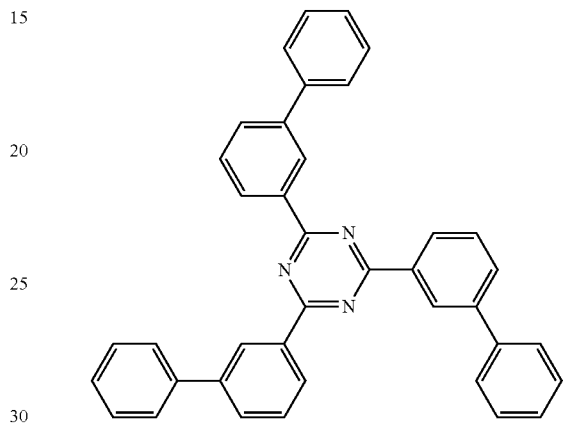

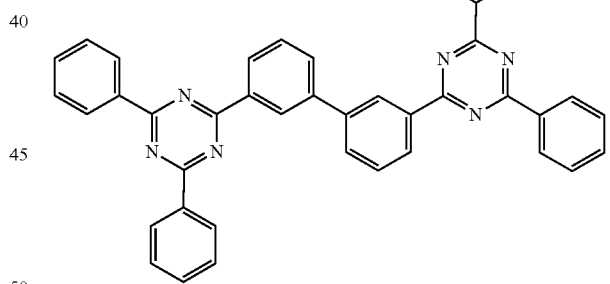

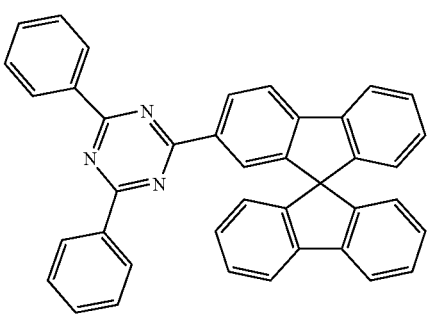

-continued

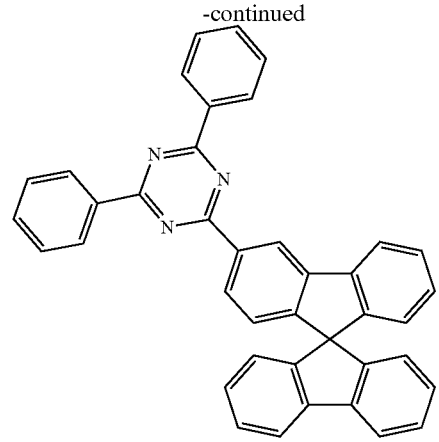

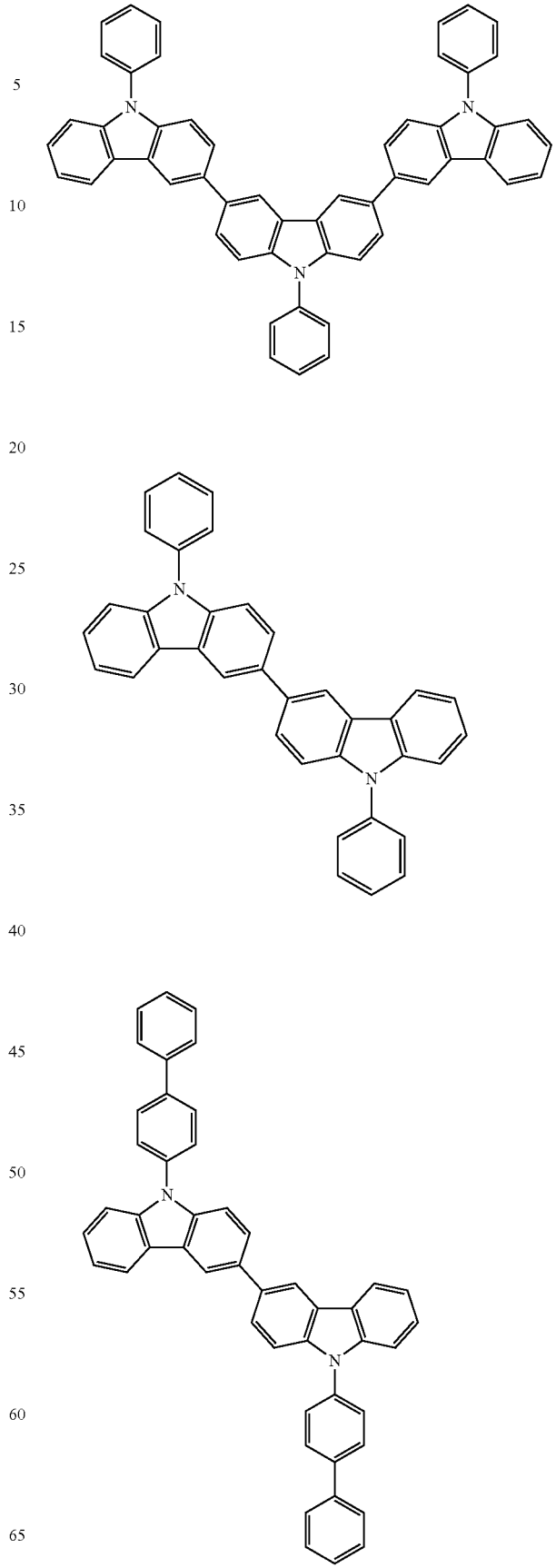

Electron Barrier Layer:

An electron barrier layer transports holes. In some embodiments, the electron barrier layer inhibits electrons from reaching the hole transporting layer while transporting holes. In some embodiments, the electron barrier layer enhances the recombination probability of electrons and holes in the light-emitting layer. The materials for use for the electron barrier layer may be the same materials as those mentioned hereinabove for the hole transporting layer.

Preferred compound examples for use as the electron barrier material are shown below.

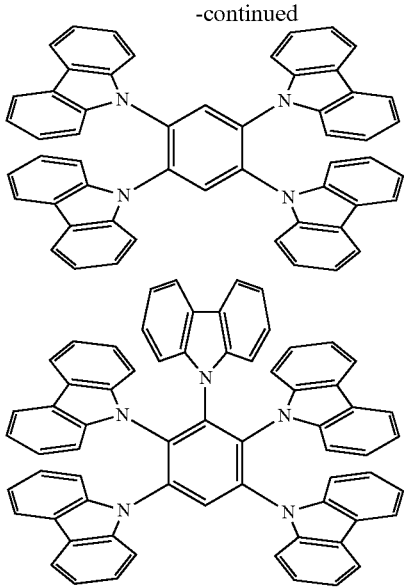

Exciton Barrier Layer:

An exciton barrier layer inhibits excitons generated through recombination of holes and electrons in the light-emitting layer from being diffused to the charge transporting layer. In some embodiments, the exciton barrier layer enables effective confinement of excitons in the light-emitting layer. In some embodiments, the light emission efficiency of the device is enhanced. In some embodiments, the exciton barrier layer is adjacent to the light-emitting layer on any of the side of the anode and the side of the cathode, and on both the sides. In some embodiments, where the exciton barrier layer is on the side of the anode, the layer can be between the hole transporting layer and the light-emitting layer and adjacent to the light-emitting layer. In some embodiments, where the exciton barrier layer is on the side of the cathode, the layer can be between the light-emitting layer and the cathode and adjacent to the light-emitting layer. In some embodiments, a hole injection layer, an electron barrier layer, or a similar layer is between the anode and the exciton barrier layer that is adjacent to the light-emitting layer on the side of the anode. In some embodiments, a hole injection layer, an electron barrier layer, a hole barrier layer, or a similar layer is between the cathode and the exciton barrier layer that is adjacent to the light-emitting layer on the side of the cathode. In some embodiments, the exciton barrier layer comprises excited singlet energy and excited triplet energy, at least one of which is higher than the excited singlet energy and the excited triplet energy of the light-emitting material, respectively.

Hole Transporting Layer:

The hole transporting layer comprises a hole transporting material. In some embodiments, the hole transporting layer is a single layer. In some embodiments, the hole transporting layer comprises a plurality of layers.

In some embodiments, the hole transporting material has one of injection or transporting property of holes and barrier property of electrons. In some embodiments, the hole transporting material is an organic material. In some embodiments, the hole transporting material is an inorganic material. Examples of known hole transporting materials that may be used herein include but are not limited to a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer, or a combination thereof. In some embodiments, the hole transporting material is selected from a porphyrin compound, an aromatic tertiary amine compound, and a styrylamine compound. In some embodiments, the hole transporting material is an aromatic tertiary amine compound. Preferred compound examples for use as the hole transporting material are shown below.

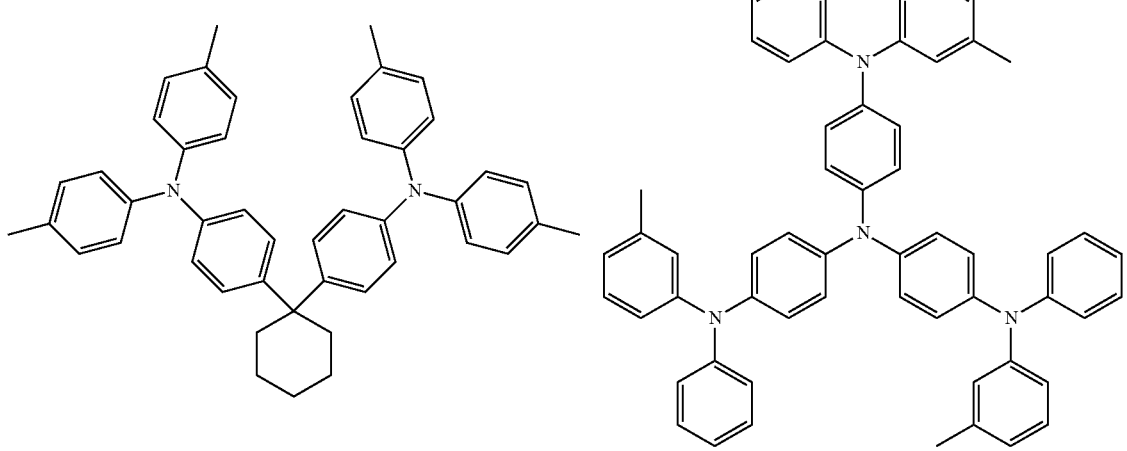

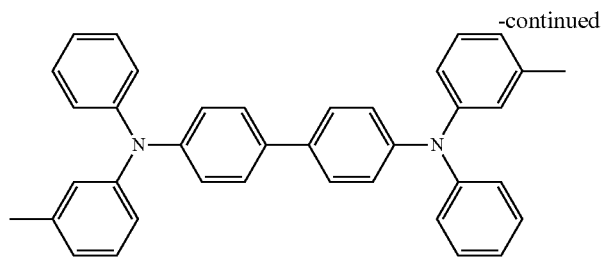
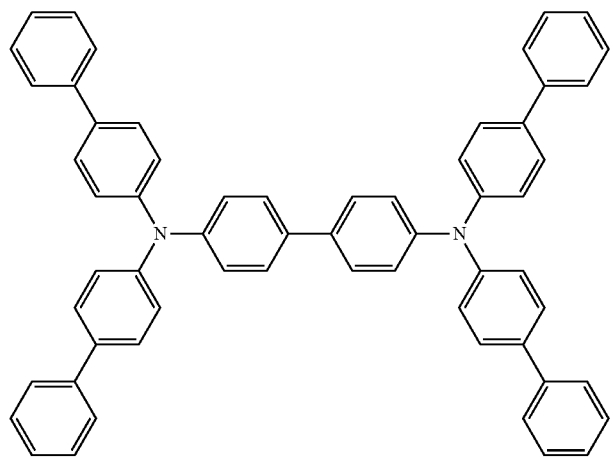
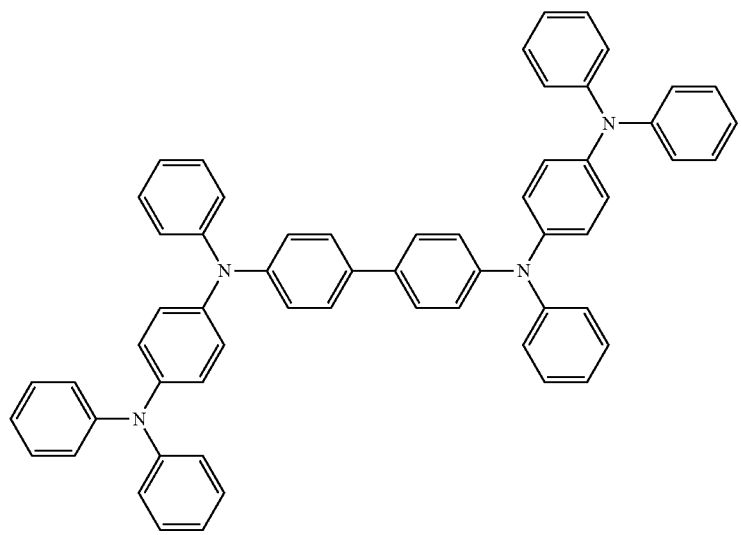
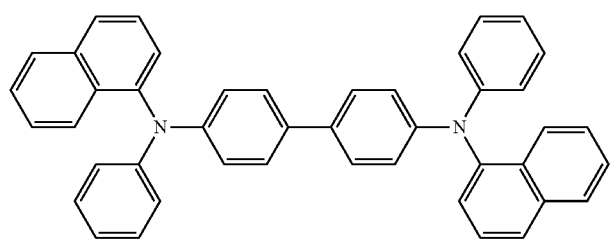

-continued
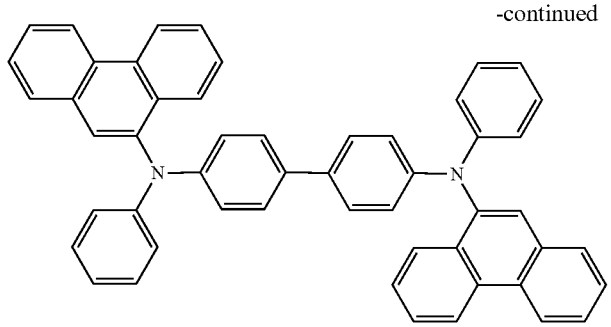
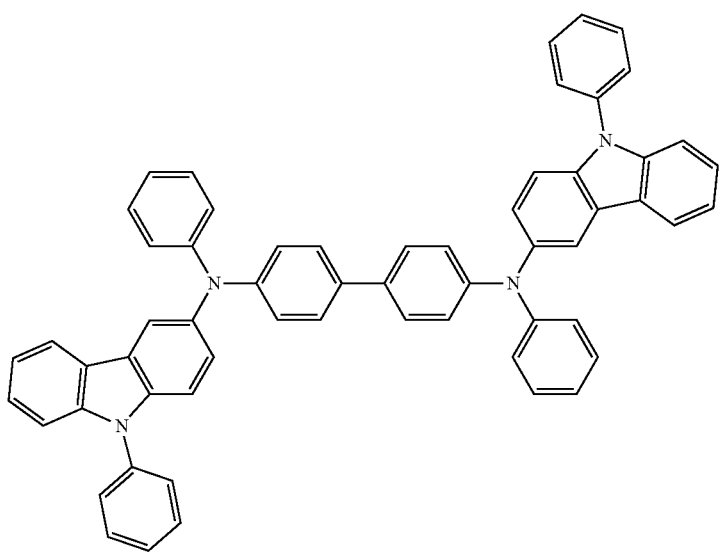
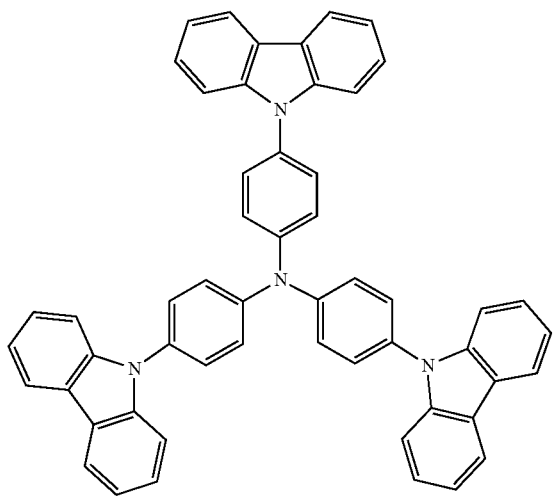

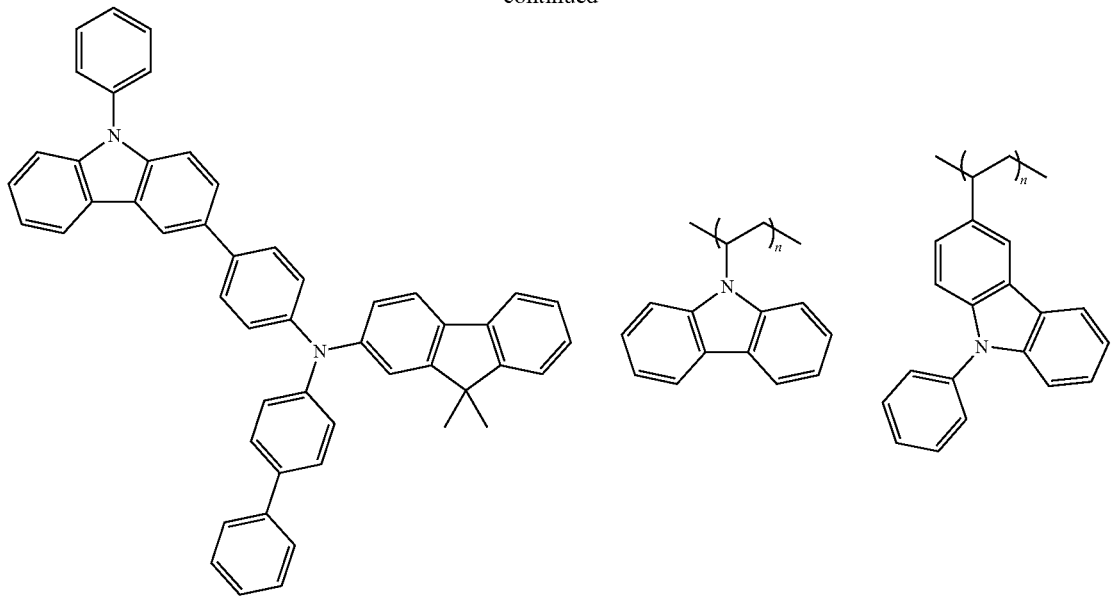

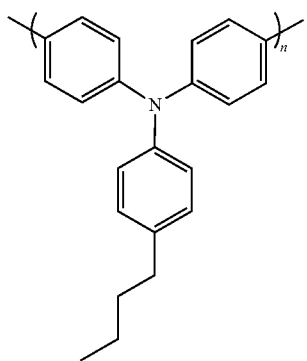

Electron Transporting Layer

The electron transporting layer comprises an electron transporting material. In some embodiments, the electron transporting layer is a single layer. In some embodiments, the electron transporting layer comprises a plurality of layers.

In some embodiments, the electron transporting material needs only to have a function of transporting electrons, which are injected from the cathode, to the light-emitting layer. In some embodiments, the electron transporting material also functions as a hole barrier material. Examples of the electron transporting layer that may be used herein include but are not limited to a nitro-substituted fluorene derivative, a diphenylquinone derivative, a thiopyran dioxide derivative, carbodiimide, a fluorenylidene methane derivative, anthraquinodimethane, an anthrone derivatives, an oxadiazole derivative, an azole derivative, an azine derivative, or a combination thereof, or a polymer thereof. In some embodiments, the electron transporting material is a thiadiazole derivative, or a quinoxaline derivative. In some embodiments, the electron transporting material is a polymer material. Preferred compound examples for use as the electron transporting material are shown below.

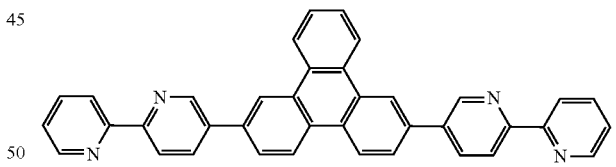

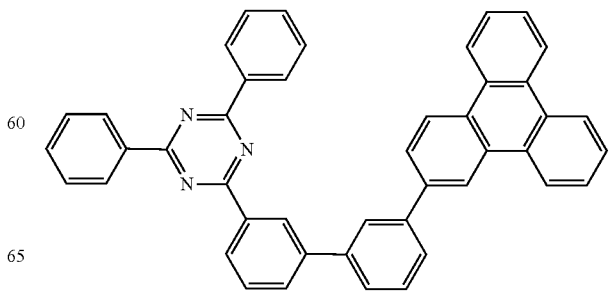

-continued
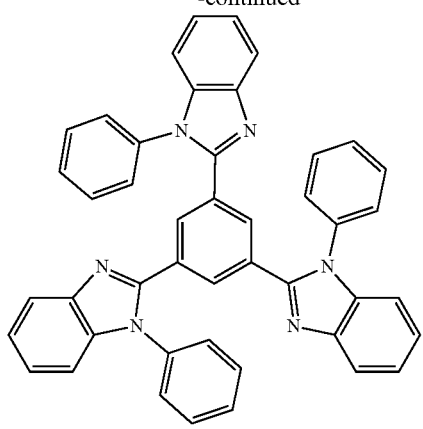
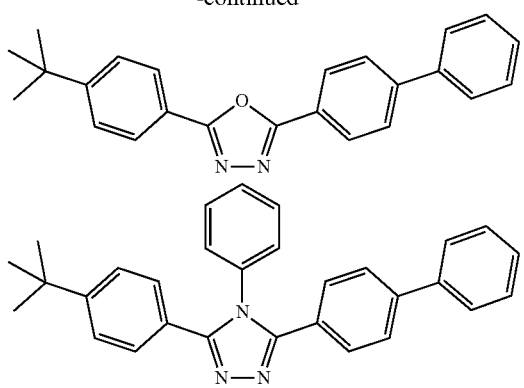
Preferred examples of compounds usable as materials that can be added to each organic layer are shown below.
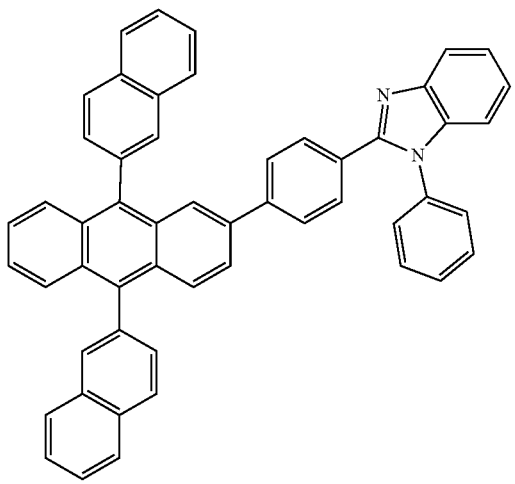
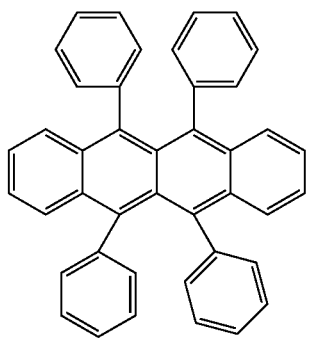
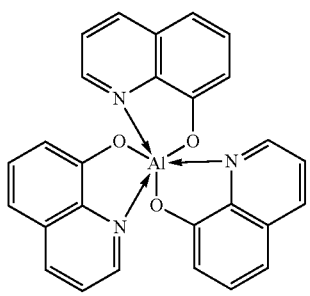
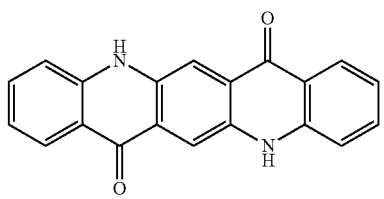
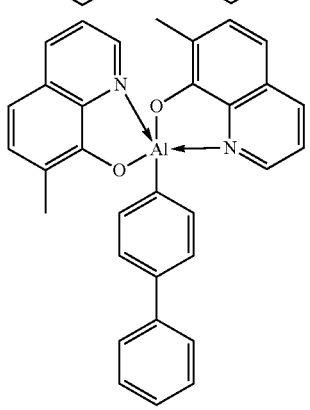
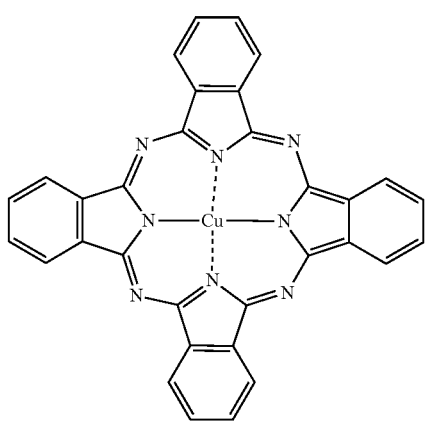

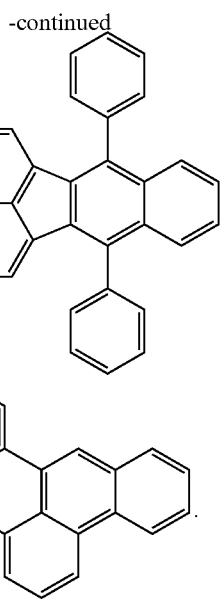

Hereinunder preferred materials for use in an organic electroluminescent device are specifically shown. However, the materials usable in the present invention should not be limitatively interpreted by the following exemplary compounds. Compounds that are exemplified as materials having a specific function can also be used as materials having any other function.

Devices:

In some embodiments, the light-emitting layers are incorporated into a device. For example, the device includes, but is not limited to an OLED bulb, an OLED lamp, a television screen, a computer monitor, a mobile phone, and a tablet.

In some embodiments, an electronic device comprises an OLED comprising an anode, a cathode, and at least one organic layer comprising a light emitting layer between the anode and the cathode.

In some embodiments, compositions described herein may be incorporated into various light-sensitive or light-activated devices, such as OLEDs or photovoltaic devices. In some embodiments, the composition may be useful in facilitating charge transfer or energy transfer within a device and/or as a hole-transport material. The device may be, for example, an organic light-emitting diode (OLED), an organic integrated circuit (OIC), an organic field-effect transistor (O-FET), an organic thin-film transistor (O-TFT), an organic light-emitting transistor (O-LET), an organic solar cell (O—SC), an organic optical detector, an organic photoreceptor, an organic field-quench device (O-FQD), a light-emitting electrochemical cell (LEC) or an organic laser diode (O-laser).

Bulbs or Lamps:

In some embodiments, an electronic device comprises an OLED comprising an anode, a cathode, and at least one organic layer comprising a light emitting layer between the anode and the cathode.

In some embodiments, a device comprises OLEDs that differ in color. In some embodiments, a device comprises an array comprising a combination of OLEDs. In some embodiments, the combination of OLEDs is a combination of three colors (e.g., RGB). In some embodiments, the combination of OLEDs is a combination of colors that are not red, green, or blue (for example, orange and yellow green). In some embodiments, the combination of OLEDs is a combination of two, four, or more colors.

In some embodiments, a device is an OLED light comprising:
a circuit board having a first side with a mounting surface and an opposing second side, and defining at least one aperture;
at least one OLED on the mounting surface, the at least one OLED configured to emanate light, comprising an anode, a cathode, and at least one organic layer comprising a light emitting layer between the anode and the cathode;
a housing for the circuit board; and
at least one connector arranged at an end of the housing, the housing and the connector defining a package adapted for installation in a light fixture.

In some embodiments, the OLED light comprises a plurality of OLEDs mounted on a circuit board such that light emanates in a plurality of directions. In some embodiments, a portion of the light emanated in a first direction is deflected to emanate in a second direction. In some embodiments, a reflector is used to deflect the light emanated in a first direction.

Displays or Screens:

In some embodiments, the light-emitting layer in the present invention can be used in a screen or a display. In some embodiments, the compounds in the present invention are deposited onto a substrate using a process including, but not limited to, vacuum evaporation, deposition, vapor deposition, or chemical vapor deposition (CVD). In some embodiments, the substrate is a photoplate structure useful in a two-sided etch that provides a unique aspect ratio pixel. The screen (which may also be referred to as a mask) is used in a process in the manufacturing of OLED displays. The corresponding artwork pattern design facilitates a very steep and narrow tie-bar between the pixels in the vertical direction and a large, sweeping bevel opening in the horizontal direction. This allows the close patterning of pixels needed for high definition displays while optimizing the chemical deposition onto a TFT backplane.

The internal patterning of the pixel allows the construction of a 3-dimensional pixel opening with varying aspect ratios in the horizontal and vertical directions. Additionally, the use of imaged "stripes" or halftone circles within the pixel area inhibits etching in specific areas until these specific patterns are undercut and fall off the substrate. At that point, the entire pixel area is subjected to a similar etch rate but the depths are varying depending on the halftone pattern. Varying the size and spacing of the halftone pattern allows etching to be inhibited at different rates within the pixel allowing for a localized deeper etch needed to create steep vertical bevels.

A preferred material for the deposition mask is invar. Invar is a metal alloy that is cold rolled into long thin sheet in a steel mill. Invar cannot be electrodeposited onto a rotating mandrel as the nickel mask. A preferred and more cost feasible method for forming the open areas in the mask used for deposition is through a wet chemical etching.

In some embodiments, a screen or display pattern is a pixel matrix on a substrate. In some embodiments, a screen or display pattern is fabricated using lithography (e.g., photolithography and e-beam lithography). In some embodiments, a screen or display pattern is fabricated using a wet chemical etch. In further embodiments, a screen or display pattern is fabricated using plasma etching.

Methods of Manufacturing Devices:

An OLED display is generally manufactured by forming a large mother panel and then cutting the mother panel in units of cell panels. In general, each of the cell panels on the mother panel is formed by forming a thin film transistor (TFT) including an active layer and a source/drain electrode on a base substrate, applying a planarization film to the TFT, and sequentially forming a pixel electrode, a light-emitting layer, a counter electrode, and an encapsulation layer, and then is cut from the mother panel.

An OLED display is generally manufactured by forming a large mother panel and then cutting the mother panel in units of cell panels. In general, each of the cell panels on the mother panel is formed by forming a thin film transistor (TFT) including an active layer and a source/drain electrode on a base substrate, applying a planarization film to the TFT, and sequentially forming a pixel electrode, a light-emitting layer, a counter electrode, and an encapsulation layer, and then is cut from the mother panel.

In another aspect, provided herein is a method of manufacturing an organic light-emitting diode (OLED) display, the method comprising:

forming a barrier layer on a base substrate of a mother panel;

forming a plurality of display units in units of cell panels on the barrier layer;

forming an encapsulation layer on each of the display units of the cell panels; and applying an organic film to an interface portion between the cell panels.

In some embodiments, the barrier layer is an inorganic film formed of, for example, SiNx, and an edge portion of the barrier layer is covered with an organic film formed of polyimide or acryl. In some embodiments, the organic film helps the mother panel to be softly cut in units of the cell panel.

In some embodiments, the thin film transistor (TFT) layer includes a light-emitting layer, a gate electrode, and a source/drain electrode. Each of the plurality of display units may include a thin film transistor (TFT) layer, a planarization film formed on the TFT layer, and a light-emitting unit formed on the planarization film, wherein the organic film applied to the interface portion is formed of a same material as a material of the planarization film and is formed at a same time as the planarization film is formed. In some embodiments, a light-emitting unit is connected to the TFT layer with a passivation layer and a planarization film therebetween and an encapsulation layer that covers and protects the light-emitting unit. In some embodiments of the method of manufacturing, the organic film contacts neither the display units nor the encapsulation layer.

Each of the organic film and the planarization film may include any one of polyimide and acryl. In some embodiments, the barrier layer may be an inorganic film. In some embodiments, the base substrate may be formed of polyimide. The method may further include, before the forming of the barrier layer on one surface of the base substrate formed of polyimide, attaching a carrier substrate formed of a glass material to another surface of the base substrate, and before the cutting along the interface portion, separating the carrier substrate from the base substrate. In some embodiments, the OLED display is a flexible display.

In some embodiments, the passivation layer is an organic film disposed on the TFT layer to cover the TFT layer. In some embodiments, the planarization film is an organic film formed on the passivation layer. In some embodiments, the planarization film is formed of polyimide or acryl, like the organic film formed on the edge portion of the barrier layer. In some embodiments, the planarization film and the organic film are simultaneously formed when the OLED display is manufactured. In some embodiments, the organic film may be formed on the edge portion of the barrier layer such that a portion of the organic film directly contacts the base substrate and a remaining portion of the organic film contacts the barrier layer while surrounding the edge portion of the barrier layer.

In some embodiments, the light-emitting layer includes a pixel electrode, a counter electrode, and an organic light-emitting layer disposed between the pixel electrode and the counter electrode. In some embodiments, the pixel electrode is connected to the source/drain electrode of the TFT layer.

In some embodiments, when a voltage is applied to the pixel electrode through the TFT layer, an appropriate voltage is formed between the pixel electrode and the counter electrode, and thus the organic light-emitting layer emits light, thereby forming an image. Hereinafter, an image forming unit including the TFT layer and the light-emitting unit is referred to as a display unit.

In some embodiments, the encapsulation layer that covers the display unit and prevents penetration of external moisture may be formed to have a thin film encapsulation structure in which an organic film and an inorganic film are alternately stacked. In some embodiments, the encapsulation layer has a thin film encapsulation structure in which a plurality of thin films are stacked. In some embodiments, the organic film applied to the interface portion is spaced apart from each of the plurality of display units. In some embodiments, the organic film is formed such that a portion of the organic film directly contacts the base substrate and a remaining portion of the organic film contacts the barrier layer while surrounding an edge portion of the barrier layer.

In one embodiment, the OLED display is flexible and uses the soft base substrate formed of polyimide. In some embodiments, the base substrate is formed on a carrier substrate formed of a glass material, and then the carrier substrate is separated.

In some embodiments, the barrier layer is formed on a surface of the base substrate opposite to the carrier substrate. In one embodiment, the barrier layer is patterned according to a size of each of the cell panels. For example, while the base substrate is formed over the entire surface of a mother panel, the barrier layer is formed according to a size of each of the cell panels, and thus a groove is formed at an interface portion between the barrier layers of the cell panels. Each of the cell panels can be cut along the groove.

In some embodiments, the method of manufacture further comprises cutting along the interface portion, wherein a groove is formed in the barrier layer, wherein at least a portion of the organic film is formed in the groove, and wherein the groove does not penetrate into the base substrate. In some embodiments, the TFT layer of each of the cell panels is formed, and the passivation layer which is an inorganic film and the planarization film which is an organic film are disposed on the TFT layer to cover the TFT layer. At the same time as the planarization film formed of, for example, polyimide or acryl is formed, the groove at the interface portion is covered with the organic film formed of, for example, polyimide or acryl. This is to prevent cracks from occurring by allowing the organic film to absorb an impact generated when each of the cell panels is cut along the groove at the interface portion. That is, if the entire barrier layer is entirely exposed without the organic film, an impact generated when each of the cell panels is cut along the groove at the interface portion is transferred to the barrier layer, thereby increasing the risk of cracks. However, in one embodiment, since the groove at the interface portion between the barrier layers is covered with the organic film and the organic film absorbs an impact that would otherwise be transferred to the barrier layer, each of the cell panels may be softly cut and cracks may be prevented from occurring in the barrier layer. In one embodiment, the organic film covering the groove at the interface portion and the planarization film are spaced apart from each other. For example, if the organic film and the planarization film are connected to each other as one layer, since external moisture may penetrate into the display unit through the planarization film and a portion where the organic film remains, the organic film and the planarization film are spaced apart from each other such that the organic film is spaced apart from the display unit.

In some embodiments, the display unit is formed by forming the light-emitting unit, and the encapsulation layer is disposed on the display unit to cover the display unit. As such, once the mother panel is completely manufactured, the carrier substrate that supports the base substrate is separated from the base substrate. In some embodiments, when a laser beam is emitted toward the carrier substrate, the carrier substrate is separated from the base substrate due to a difference in a thermal expansion coefficient between the carrier substrate and the base substrate.

In some embodiments, the mother panel is cut in units of the cell panels. In some embodiments, the mother panel is cut along an interface portion between the cell panels by using a cutter. In some embodiments, since the groove at the interface portion along which the mother panel is cut is covered with the organic film, the organic film absorbs an impact during the cutting. In some embodiments, cracks may be prevented from occurring in the barrier layer during the cutting.

In some embodiments, the methods reduce a defect rate of a product and stabilize its quality.

Another aspect is an OLED display including: a barrier layer that is formed on a base substrate; a display unit that is formed on the barrier layer; an encapsulation layer that is formed on the display unit; and an organic film that is applied to an edge portion of the barrier layer.

EXAMPLES

The features of the present invention will be described more specifically with reference to Examples given below. The materials, processes, procedures and the like shown below may be appropriately modified unless they deviate from the substance of the invention. Accordingly, the scope of the invention is not construed as being limited to the specific examples shown below. Hereinunder the light emission characteristics were evaluated using a source meter (available from Keithley Instruments Corporation: 2400 series), a semiconductor parameter analyzer (available from Agilent Corporation, E5273A), an optical power meter device (available from Newport Corporation, 1930C), an optical spectroscope (available from Ocean Optics Corporation, USB2000), a spectroradiometer (available from Topcon Corporation, SR-3), and a streak camera (available from Hamamatsu Photonics K. K., Model C4334).

In the following Examples, the compounds used as the first organic compound, the second organic compound and the third organic compound satisfy the requirement (a), and the compounds used as the fifth organic compound, the sixth organic compound, the seventh organic compound and the eighth organic compound satisfy the requirement (b) and the requirement (c).

[A] Production and Evaluation of First Organic Light-Emitting Device

Comparative Examples 1, 2 and Examples 1, 2

On a glass substrate having, as formed thereon, an anode of indium tin oxide (ITO) having a thickness of 100 nm, thin films were laminated according to a vacuum evaporation method at a vacuum degree of $1 \times 10^{-6}$ Pa. First, HATCN was formed on ITO to have a thickness of 10 nm, then on this, tris-PCz was formed to have a thickness of 25 nm, and further on this, m-CBP was formed to have a thickness of 5 nm. Next, mCBP, 4CzIPN ($\Delta E_{ST}$=0.05 eV, as measured in a toluene solution) and 4CzTPN ($\Delta E_{ST}$=0.03 eV, as measured in a toluene solution) were co-evaporated from different evaporation sources each at a concentration shown in Table 1 below to form a layer having a thickness of 30 nm to be a light-emitting layer. Next, SF3TRZ was formed to have a thickness of 10 nm as a hole barrier layer. Subsequently, SF3TRZ and Liq were co-evaporated from different evaporation sources to form an electron transporting layer having a thickness of 40 nm. At that time, SF3TRZ/Liq (by weight) was 7/3. Further, Liq was formed to have a thickness of 2 nm, and aluminum (Al) was vapor-deposited to have a thickness of 100 nm to be a cathode. According to the process, four kinds of organic electroluminescent devices of Comparative Example 1, Comparative Example 2, Example 1 and Example 2 were produced. The first organic compound of mCBP, the second organic compound of 4CzIPN and the third organic compound of 4CzTPN satisfy the requirement (a).

The produced organic electroluminescent devices were driven by electrification, and were recognized to emit delayed fluorescence derived from the third organic compound. The initial drive voltage to realize 5000 cd/m², and the time to reach the emission intensity of 95% (LT95) were measured. The results are shown in Table 1 below. As compared with that in Comparative Example 1 and Comparative Example 2, the drive voltage in Example 1 and Example 2 was obviously low. As known from the measurement results of LT95, the lifetime in Comparative Example 1 not using the second organic compound was extremely short, and even in Comparative Example 2 in which the concentration of the third organic compound was increased to compensate for it, the lifetime could not still be improved sufficiently. On the other hand, Example 1 and Example 2 using the second organic compound realized a noticeable lifetime-improving effect as compared with these Comparative Examples.

Except that in Comparative Example 1, which had an extremely short lifetime and was therefore poorly practicable, the organic electroluminescent devices in the remaining Comparative Example 2, Example 1 and Example 2 were tested to measure the external quantum yield at 1000 cd/m². As compared with that in Comparative Example 2, the external quantum yield in Example 1 in which the concentration of the third organic compound was lowered and the second organic compound was added greatly improved. On the other hand, in Example 2 in which the concentration of the third organic compound was not changed from that in Comparative Example 2, the second organic compound was added and the concentration of the first organic compound was lowered, the external quantum yield was on the same level as that in Comparative Example 2.

TABLE 1

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 1 | mCBP (95 wt %) | no | 4CzTPN (5 wt %) | 8.6 | 1.0 |
| Comparative Example 2 | mCBP (80 wt %) | no | 4CzTPN (20 wt %) | 8.6 | 4.1 times |
| Example 1 | mCBP (45 wt %) | 4CzIPN (50 wt %) | 4CzTPN (5 wt %) | 6.6 | 29 times |
| Example 2 | mCBP (30 wt %) | 4CzIPN (50 wt %) | 4CzTPN (20 wt %) | 7.5 | 9.4 times |

Comparative Example 3

For comparison, an organic electroluminescent device of Comparative Example 3 was produced in the same manner as in Example 1, except that the first organic compound was not used, and a light-emitting layer composed of the second organic compound (4CzIPN: 95% by weight) and the third organic compound (4CzTPN: 5% by weight) was formed. The performance of the device was evaluated, and as a result, though the drive voltage thereof was on the same level as that in Example 1, the lifetime and the external quantum yield thereof were obviously worse than those in Example 1 and Comparative Example 2.

Examples 3 to 5 and Comparative Example 2

As shown in Table 2, an organic electroluminescent device of Comparative Example 2 not using the second organic compound, and organic electroluminescent devices of Examples 3 to 5 containing 20% by weight of the second organic compound of 4CzIPN, in which the concentration of the third organic compound of 4CzTPN was varied, were produced, and tested for performance evaluation in the same manner as above. From the results shown in Table 2, it was confirmed that, using the second organic compound, the lifetime was prolonged by 4 to 8 times.

Examples 1, 5, 6, 7 and Comparative Example 1

As shown in Table 3, an organic electroluminescent device of Comparative Example 1 not using the second organic compound, and organic electroluminescent devices of Examples 1, 5, 6 and 7 containing 5% by weight of the third organic compound of 4CzTPN, in which the concentration of the second organic compound of 4CzIPN was varied, were produced, and tested for performance evaluation in the same manner as above. From the results shown in Table 3, it was confirmed that, using the second organic compound, the lifetime was prolonged by 16 to 22 times. In addition, an organic electroluminescent device containing 5% by weight of the third organic compound of 4CzTPN and 30% by weight of the second organic compound of 4CzIPN was produced and tested for performance evaluation also in the same manner, and as a result, LT95 was longer than in Comparative Example 1, and the drive voltage was smaller than in the latter. Further, an organic electroluminescent device containing 5% by weight of the third organic compound of 4CzTPN and 10% by weight of the second organic compound of 4CzIPN was produced and tested for performance evaluation also in the same manner, and as a result, LT95 was longer than in Comparative Example 1 but was shorter than in Example 5.

TABLE 2

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 2 | mCBP (80 wt %) | no | 4CzTPN (20 wt %) | 8.6 | 1.0 |
| Example 3 | mCBP (60 wt %) | 4CzIPN (20 wt %) | 4CzTPN (20 wt %) | 7.4 | 4.9 times |
| Example 4 | mCBP (70 wt %) | 4CzIPN (20 wt %) | 4CzTPN (10 wt %) | 7.1 | 6.3 times |
| Example 5 | mCBP (75 wt %) | 4CzIPN (20 wt %) | 4CzTPN (5 wt %) | 6.9 | 8.4 times |

TABLE 3

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 1 | mCBP (95 wt %) | no | 4CzTPN (5 wt %) | 8.6 | 1.0 |
| Example 5 | mCBP (75 wt %) | 4CzIPN (20 wt %) | 4CzTPN (5 wt %) | 6.9 | 16 times |
| Example 6 | mCBP (55 wt %) | 4CzIPN (40 wt %) | 4CzTPN (5 wt %) | 6.5 | 21 times |
| Example 1 | mCBP (45 wt %) | 4CzIPN (50 wt %) | 4CzTPN (5 wt %) | 6.3 | 21 times |
| Example 7 | mCBP (20 wt %) | 4CzIPN (75 wt %) | 4CzTPN (5 wt %) | 6.2 | 22 times |

Examples 8, 9 and Comparative Example 1

As shown in Table 4, an organic electroluminescent device of Comparative Example 1 not using the second organic compound, and organic electroluminescent devices of Examples 8 and 9 containing 5% by weight of the third organic compound of 4CzTPN, and using the second organic compound of a compound A (having $\Delta E_{ST}$=0.13 eV measured as a single layer film) or a compound B (having $\Delta E_{ST}$=0.13 eV measured as a single layer film) were produced, and tested for performance evaluation in the same manner as above. From the results shown in Table 4, it was confirmed that, using the second organic compound, the lifetime was prolonged, and especially in the case of using the compound A, a significant lifetime prolonging effect was confirmed.

TABLE 4

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 1 | mCBP (95 wt %) | no | 4CzTPN (5 wt %) | 8.6 | 1.0 |
| Example 8 | mCBP (45 wt %) | Compound A (50 wt %) | 4CzTPN (5 wt %) | 7.6 | 25 times |
| Example 9 | mCBP (45 wt %) | Compound B (50 wt %) | 4CzTPN (5 wt %) | 8 | 6.4 times |

Examples 10 to 12 and Comparative Example 4

As shown in Table 5, an organic electroluminescent device of Comparative Example 4 not using the second organic compound, and organic electroluminescent devices of Examples 10 to 12 using the third organic compound of a compound C, in which the concentration of the second organic compound 4CzIPN was varied, were produced, and tested for performance evaluation in the same manner as above. From the results shown in Table 5, it was confirmed that, using the second organic compound, the lifetime was prolonged.

TABLE 5

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 4 | mCBP (80 wt %) | no | Compound C (20 wt %) | 9.9 | 1.0 |
| Example 10 | mCBP (60 wt %) | 4CzIPN (20 wt %) | Compound C (20 wt %) | 9.8 | 5.3 times |
| Example 11 | mCBP (70 wt %) | 4CzIPN (20 wt %) | Compound C (10 wt %) | 9.0 | 7.2 times |

TABLE 5-continued

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Example 12 | mCBP (75 wt %) | 4CzIPN (20 wt %) | Compound C (5 wt %) | 8.4 | 11 times |

Examples 13, 14 and Comparative Example 5

As shown in Table 6, an organic electroluminescent device of Comparative Example 5 not using the second organic compound, and organic electroluminescent devices of Examples 13 and 14 using the third organic compound of a green-emitting compound 4CzIPN, and using the second organic compound of a compound B or a compound D (having $\Delta E_{ST}$=0.13 eV measured as a single layer film) were produced, and tested for performance evaluation in the same manner as above. From the results shown in Table 6, it was confirmed that, using the second organic compound, the lifetime was prolonged.

In addition, an organic electroluminescent device containing 6% by weight of the second organic compound of PXZ-TRZ, and containing 2% by weight of the third organic compound of 4CzTPN-PH, an organic electroluminescent device containing 0.1% by weight of the second organic compound of 4CzIPN and 0.1% by weight of the third organic compound of 4CzTPN-Ph, and an organic electroluminescent device containing 6% by weight of the second organic compound of 4CzIPN and 5% by weight of the third organic compound of 4CzTPN-Ph were produced, and tested for performance evaluation in the same manner as above. LT95 of these devices was shorter than the device of Example 15.

TABLE 6

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 5 | mCBP (95 wt %) | no | 4CzIPN (5 wt %) | 7.8 | 1.00 |
| Example 13 | mCBP (75 wt %) | Compound B (20 wt %) | 4CzIPN (5 wt %) | 7.7 | 11 times |
| Example 14 | mCBP (75 wt %) | Compound D (20 wt %) | 4CzIPN (5 wt %) | 6.7 | 5.9 times |

Examples 5, 15 and Comparative Example 1

As shown in Table 7, an organic electroluminescent device of Comparative Example 1 not using the second organic compound, an organic electroluminescent device of Example 5 containing 20% by weight of the second organic compound of 4CzIPN and 5% by weight of the third organic compound of 4CzTPN, and an organic electroluminescent device of Example 15 containing 50% by weight of the second organic compound of 4CzIPN and 5% by weight of the third organic compound of 4CzTPN-Ph were produced, and tested for performance evaluation in the same manner as above. From the results shown in Table 7, it was confirmed that, even when the third organic compound was changed to 4CzTPN-Ph, the resultant organic electroluminescent device still exhibited the lifetime improving effect.

Example 16 and Comparative Example 6

On a glass substrate having, as formed thereon, an anode of indium tin oxide (ITO) having a thickness of 100 nm, thin films were laminated according to a vacuum evaporation method at a vacuum degree of 1×10⁻⁶ Pa. First, HATCN was formed on ITO to have a thickness of 10 nm, then on this, tris-PCz was formed to have a thickness of 25 nm, and further on this, m-CBP was formed to have a thickness of 5 nm. Next, mCBP, 4CzIPN and 4CzTPN were co-evaporated from different evaporation sources each at a concentration shown in Table 8 below to form a layer having a thickness of 30 nm to be an exciton-generating layer. Next, SF3TRZ

TABLE 7

| | Composition of Light-Emitting Layer | | | Performance Evaluation | |
|---|---|---|---|---|---|
| | First Organic Compound | Second Organic Compound | Third Organic Compound | Drive Voltage at 5000 cd (V) | LT95 at 5000 cd relative value (times) |
| Comparative Example 1 | mCBP (95 wt %) | no | 4CzTPN (5 wt %) | 8.6 | 1.0 |
| Example 5 | mCBP (75 wt %) | 4CzIPN (20 wt %) | 4CzTPN (5 wt %) | 6.9 | 16 times |
| Example 15 | mCBP (45 wt %) | 4CzIPN (50 wt %) | 4CzTPN-Ph (5 wt %) | 7.9 | 4.6 times | and DBP were co-evaporated from different evaporation sources each at a concentration shown in Table 8 below to form a light-emitting layer having a thickness of 5 nm. Next, SF3TRZ was formed to have a thickness of 5 nm as a hole barrier layer. Subsequently, SF3TRZ and Liq were co-evaporated from different evaporation sources to form an electron transporting layer having a thickness of 40 nm. At that time, SF3TRZ/Liq (by weight) was 7/3. Further, Liq was formed to have a thickness of 2 nm, and aluminum (Al) was vapor-deposited to have a thickness of 100 nm to be a cathode. According to the process, organic electroluminescent devices of Comparative Example 6 and Example 16 were produced. From the results shown in Table 8, it was confirmed that, by forming an organic mixed layer containing the first organic compound, the second organic compound and the third organic compound as the exciton-generating layer neighboring to the light-emitting layer, the lifetime of the device was prolonged.

The produced organic electroluminescent devices were driven by electrification, and were recognized to emit red fluorescence derived from the eighth organic compound. The initial drive voltage to realize 5000 cd/m$^2$, and the time to reach the emission intensity of 95% (LT95) were measured. The results are shown in Table 9 below. From the found data of LT95, it was confirmed that, in Comparative Example 7 not using the sixth organic compound, the lifetime was short, and also in Comparative Example 8 in which the concentration of the seventh organic compound was increased for compensating for it, the lifetime could not still be improved sufficiently. On the other hand, Examples 17 to 21 using the sixth organic compound realized a noticeable lifetime-improving effect as compared with these Comparative Examples. In addition, in Example 20 and Example 21, the drive voltage was noticeably low as compared with that in Comparative Example 7 and Comparative

TABLE 8

| | Composition of Exciton-Generating Layer | | | Light-Emitting | Performance Evaluation | |
|---|---|---|---|---|---|---|
| | First Organic Compound | Second Organic Compound | Third Organic Compound | Layer Fluorescent Dopant | Drive Voltage at 5000 cd (V) | LT95 at 5000 cd relative value (times) |
| Comparative Example 6 | mCBP (95 wt %) | no | 4CzTPN (5 wt %) | DBP (1 wt %) | 11.1 | 1.00 |
| Example 16 | mCBP (45 wt %) | 4CzIPN (50 wt %) | 4CzTPN (5 wt %) | DBP (1 wt %) | 8.2 | 13 times |

[B] Production and Evaluation of Second Organic Light-Emitting Device

Comparative Example 7, Examples 17 to 20, and Comparative Example 8, Example 21

Seven types of organic electroluminescent devices of Comparative Example 7, Examples 17 to 20, Comparative Example 8 and Example 21 were produced in the same manner as in Example 1, except that mCBP, 4CzIPN ($\Delta E_{ST}$=0.05 eV, as measured in a toluene solution), 4CzTPN ($\Delta E_{ST}$=0.03 eV, as measured in a toluene solution) and a red-emitting material of DBP were co-evaporated from different evaporation sources each at a concentration shown in Table 9 below to form a layer having a thickness of 30 nm to be a light-emitting layer. The fifth organic compound of mCBP, the sixth organic compound of 4CzIPN, the seventh organic compound of 4CzTPN and the eighth organic compound of DBP satisfy the requirement (b) and the requirement (c).

Example 8. An organic electroluminescent device was produced by changing the content of the sixth organic compound of 4CzIPN to 10% by weight, and tested for performance evaluation in the same manner, and as a result, the drive voltage of the resultant device was higher and LT95 thereof was shorter than those in Example 17.

Except for the device of Comparative Example 7 in which the lifetime was extremely short and the device was poorly practicable, the remaining organic electroluminescent devices of Examples 17 to 20, Comparative Example 8 and Example 21 were tested to measure the external quantum yield at 5000 cd/m$^2$. As a result, all the devices attained the external quantum yield on the same level. This confirmed that according to the present invention, a lifetime can be significantly improved while maintaining the high external quantum yield.

TABLE 9

| | Composition of Light-Emitting Layer | | | | Performance Evaluation | |
|---|---|---|---|---|---|---|
| | Fifth Organic Compound | Sixth Organic Compound | Seventh Organic Compound | Eighth Organic Compound | Drive Voltage at 5000 cd (V) | LT95 at 5000 cd relative value (times) |
| Comparative Example 7 | mCBP (94.5 wt %) | no | 4CzTPN (5 wt %) | DBP (0.5 wt %) | 8.0 | 1.0 |
| Example 17 | mCBP (74.5 wt %) | 4CzIPN (20 wt %) | 4CzTPN (5 wt %) | DBP (0.5 wt %) | 9.3 | 16 times |
| Example 18 | mCBP (64.5 wt %) | 4CzIPN (30 wt %) | 4CzTPN (5 wt %) | DBP (0.5 wt %) | 8.7 | 32 times |
| Example 19 | mCBP (54.5 wt %) | 4CzIPN (40 wt %) | 4CzTPN (5 wt %) | DBP (0.5 wt %) | 8.8 | 35 times |
| Example 20 | mCBP (44.5 wt %) | 4CzIPN (50 wt %) | 4CzTPN (5 wt %) | DBP (0.5 wt %) | 5.9 | 38 times |

TABLE 9-continued

| | Composition of Light-Emitting Layer | | | | Performance Evaluation | |
|---|---|---|---|---|---|---|
| | Fifth Organic Compound | Sixth Organic Compound | Seventh Organic Compound | Eighth Organic Compound | Drive Voltage at 5000 cd (V) | LT95 at 5000 cd relative value (times) |
| Comparative Example 8 | mCBP (79.5 wt %) | no | 4CzTPN (20 wt %) | DBP (0.5 wt %) | 6.8 | 12 times |
| Example 21 | mCBP (29.5 wt %) | 4CzIPN (50 wt %) | 4CzTPN (20 wt %) | DBP (0.5 wt %) | 6.0 | 41 times |

Examples 22, 23 and Comparative Example 7

As shown in Table 10, an organic electroluminescent device of Comparative Example 7 not using the sixth organic compound, and organic electroluminescent devices of Examples 22 and 23 using the sixth organic compound of a compound A (having $\Delta E_{ST}$=0.13 eV measured as a single layer film) or a compound B (having $\Delta E_{ST}$=0.13 eV measured as a single layer film), in which the concentration of the seventh organic compound of 4CzTPN was 5% by weight, were produced, and tested for performance evaluation in the same manner as above. From the results shown in Table 10, it was confirmed that, using the sixth organic compound, the lifetime was prolonged by 13 to 41 times.

TABLE 10

| | Composition of Light-Emitting Layer | | | | Performance Evaluation | |
|---|---|---|---|---|---|---|
| | Fifth Organic Compound | Sixth Organic Compound | Seventh Organic Compound | Eighth Organic Compound | Drive Voltage at 5000 cd (V) | LT95 at 5000 cd relative value (times) |
| Comparative Example 7 | mCBP (94.5 wt %) | no | 4CzTPN (5 wt %) | DBP (0.5 wt %) | 8.0 | 1.0 |
| Example 22 | mCBP (44.5 wt %) | Compound A (50 wt %) | 4CzTPN (5 wt %) | DBP (0.5 wt %) | 9.4 | 41 times |
| Example 23 | mCBP (44.5 wt %) | Compound B (50 wt %) | 4CzTPN (5 wt %) | DBP (0.5 wt %) | 10 | 13 times |

Examples 24, 25 and Comparative Example 9

As shown in Table 11, an organic electroluminescent device of Comparative Example 9 not using the sixth organic compound, and organic electroluminescent devices of Examples 24 and 25 using the sixth organic compound of a compound B or a compound C (having $\Delta E_{ST}$=0.13 eV measured as a single layer film), using the seventh organic compound of 4CzIPN and using the eighth organic compound of TBRb of a yellow-emitting material were produced, and tested for performance evaluation in the same manner as above. From the results shown in Table 11, it was confirmed that, using the sixth organic compound, the lifetime was prolonged.

TABLE 11

| | Composition of Light-Emitting Layer | | | | Performance Evaluation | |
|---|---|---|---|---|---|---|
| | Fifth Organic Compound | Sixth Organic Compound | Seventh Organic Compound | Eighth Organic Compound | Drive Voltage at 5000 cd (V) | LT95 at 5000 cd relative value (times) |
| Comparative Example 9 | mCBP (94.5 wt %) | no | 4CzIPN (5 wt %) | TBRb (0.5 wt %) | 9.8 | 1.0 |
| Example 24 | mCBP (74.5 wt %) | Compound B (20 wt %) | 4CzIPN (5 wt %) | TBRb (0.5 wt %) | 8.8 | 3.6 times |
| Example 25 | mCBP (74.5 wt %) | Compound C (20 wt %) | 4CzIPN (5 wt %) | TBRb (0.5 wt %) | 9.0 | 3.0 times |

Compound A
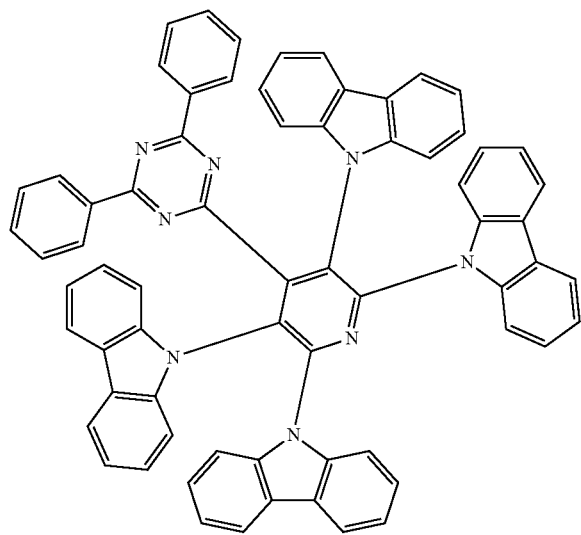
Compound B
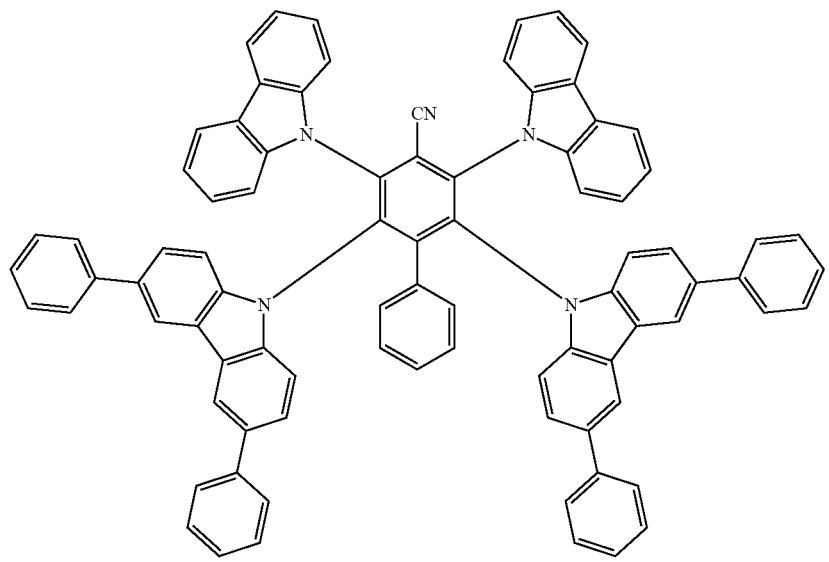

-continued
Compound C
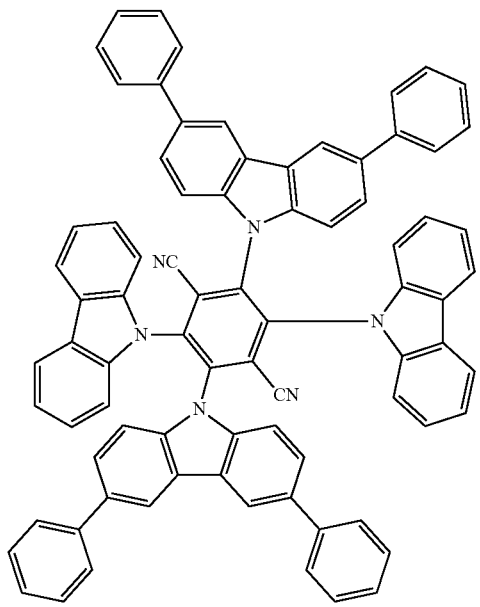
Compound D
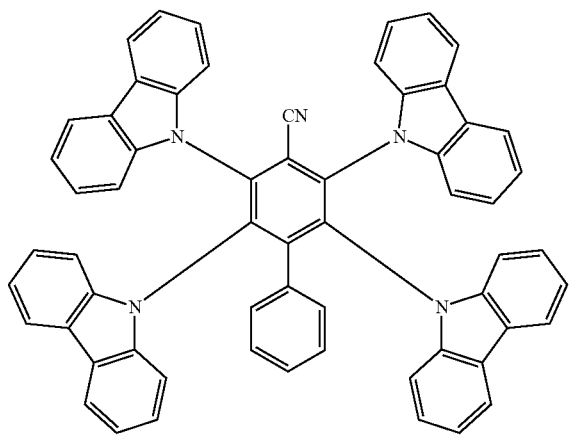
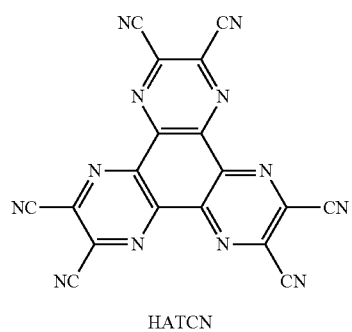
HATCN
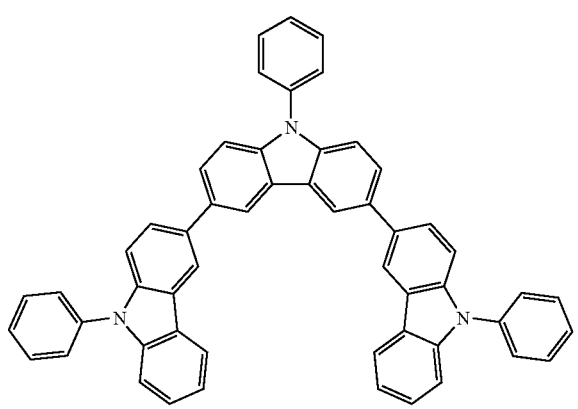
Tris-PCz
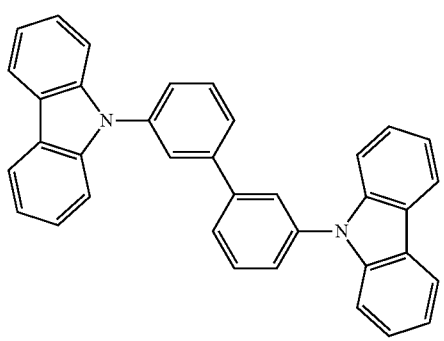
mCBP
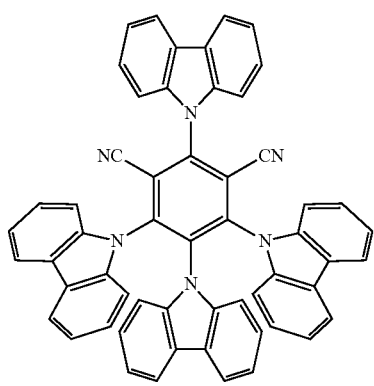
4CzIPN

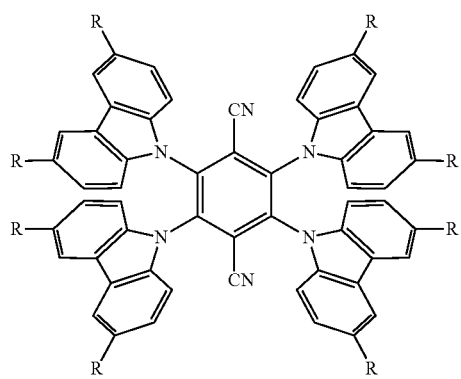

4CzTPN: R = H
4CzTPN-Ph: R = Ph

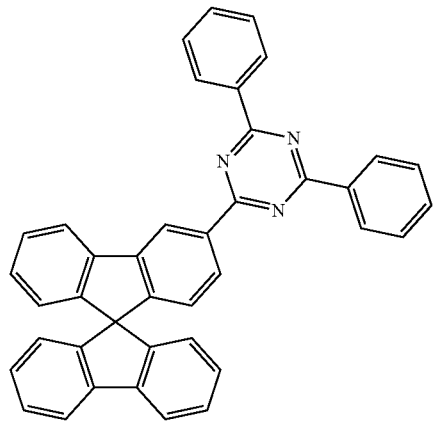

SF3TRZ

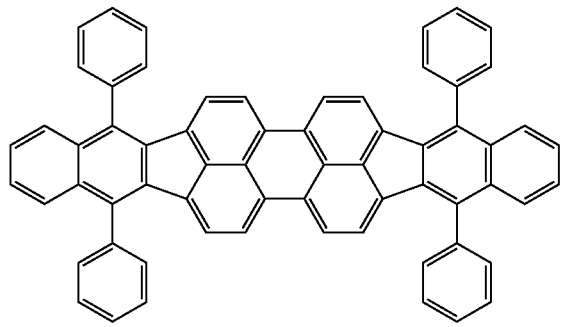

DBP

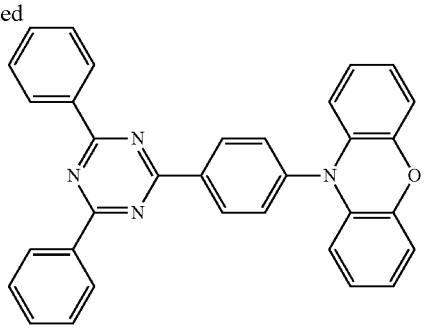

PXZ-TRZ

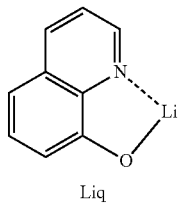

Liq

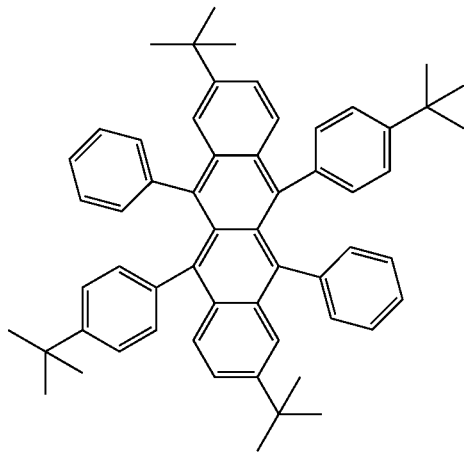

TBRb

INDUSTRIAL APPLICABILITY

According to the present invention, there can be provided an organic light-emitting device having a high light emission efficiency and a long lifetime. In addition, the drive voltage can be suppressed. Consequently, the industrial applicability of the present invention is great.

REFERENCE SIGNS LIST

1 Substrate
2 Anode
3 Hole Injection Layer
4 Hole Transporting Layer
5 Light-Emitting Layer
6 Electron Transporting Layer
7 Cathode

The invention claimed is:

1. An organic light-emitting device having an organic mixed layer that contains a first organic compound and a second organic compound and a third organic compound satisfying the following requirement (a), wherein:
the second organic compound is contained in the organic mixed layer in an amount of 15% by weight or more, a major part of emission from the organic light-emitting device is emission from the third organic compound, and the second organic compound and the third organic compound are delayed fluorescent materials each having a different structure:

Requirement(a) $E_{S1}(A) > E_{S1}(B) > E_{S1}(C)$ wherein $E_{S1}(A)$ represents a lowest excited singlet energy level of the first organic compound, $E_{S1}(B)$ represents a lowest excited singlet energy level of the second organic compound, $E_{S1}(C)$ represents a lowest excited singlet energy level of the third organic compound.

2. The organic light-emitting device according to claim 1, which is an organic electroluminescent device having an anode, a cathode, and at least one organic layer that includes the organic mixed layer between the anode and the cathode.

3. The organic light-emitting device according to claim 1, wherein the second organic compound is such that the energy difference $\Delta E_{st}$ between the lowest excited singlet state and the lowest excited triplet state at 77K is 0.3 eV or less.

4. The organic light-emitting device according to claim 1, wherein the third organic compound is such that the energy difference $\Delta E_{st}$ between the lowest excited singlet state and the lowest excited triplet state at 77K is 0.3 eV or less.

5. The organic light-emitting device according to claim 1, wherein the content of the second organic compound in the organic mixed layer is larger than the content of the third organic compound therein.

6. The organic light-emitting device according to claim 1, wherein the content of the second organic compound in the organic mixed layer is larger than the content of the first organic compound therein.

7. The organic light-emitting device according to claim 1, wherein the content of the second organic compound in the organic mixed layer is 45% by weight or more of the organic mixed layer.

8. The organic light-emitting device according to claim 1, wherein the content of the third organic compound in the organic mixed layer is 10% by weight or less of the organic mixed layer.

9. The organic light-emitting device according to claim 1, wherein the organic mixed layer does not contain a metal element.

10. The organic light-emitting device according to claim 1, wherein the organic mixed layer is composed of compounds alone each formed of atoms selected from the group consisting of a carbon atom, a hydrogen atom, a nitrogen atom, an oxygen atom and a sulfur atom.

11. The organic light-emitting device according to claim 1, wherein the second organic compound and the third organic compound both contain a dicyanobenzene structure.

12. An organic light-emitting device having an organic mixed layer that contains a fifth organic compound and a sixth organic compound and a seventh organic compound and an eighth organic compound satisfying the following requirement (b) and requirement (c), wherein:

the sixth organic compound is contained in the organic mixed layer in an amount of 25% by weight or more, and a major part of emission from the organic light-emitting device is emission from the eighth organic compound, and the sixth organic compound and the seventh organic compound are delayed fluorescent materials each having a different structure:

Requirement(b) $E_{S1}(D) > E_{S1}(E)$, or $E_{S1}(D) > E_{S1}(F)$

Requirement(c) $E_{S1}(E) > E_{S1}(F) > E_{S1}(G)$ wherein $E_{S1}(D)$ represents a lowest excited singlet energy level of the fifth organic compound, $E_{S1}(E)$ represents a lowest excited singlet energy level of the sixth organic compound, $E_{S1}(F)$ represents a lowest excited singlet energy level of the seventh organic compound, $E_{S1}(G)$ represents a lowest excited singlet energy level of the eighth organic compound.

13. The organic light-emitting device according to claim 12, which is an organic electroluminescent device having an anode, a cathode, and at least one organic layer that includes the organic mixed layer between the anode and the cathode.

14. The organic light-emitting device according to claim 12, wherein the sixth organic compound is such that the energy difference $\Delta E_{st}$ between the lowest excited singlet state and the lowest excited triplet state at 77K is 0.3 eV or less.

15. The organic light-emitting device according to claim 12, wherein the seventh organic compound is such that the energy difference $\Delta E_{st}$ between the lowest excited singlet state and the lowest excited triplet state at 77K is 0.3 eV or less.

16. The organic light-emitting device according to claim 12, wherein the content of the sixth organic compound in the organic mixed layer is larger than the content of the seventh organic compound therein.

17. The organic light-emitting device according to claim 12, wherein the content of the sixth organic compound in the organic mixed layer is larger than the content of the fifth organic compound therein.

18. The organic light-emitting device according to claim 12, wherein the content of the fifth organic compound in the organic mixed layer is larger than the content of the seventh organic compound therein.

19. The organic light-emitting device according to claim 12, wherein the content of the fifth organic compound, the content of the sixth organic compound and the content of the seventh organic compound in the organic mixed layer are all larger than the content of the eighth organic compound therein.

20. The organic light-emitting device according to claim 12, wherein the content of the sixth organic compound in the organic mixed layer is 45% by weight or more of the organic mixed layer.

21. The organic light-emitting device according to claim 12, wherein the content of the seventh organic compound in the organic mixed layer is 25% by weight or less of the organic mixed layer.

22. The organic light-emitting device according to claim 12, wherein the organic mixed layer does not contain a metal element.

23. The organic light-emitting device according to claim 12, wherein the organic mixed layer is composed of compounds alone each formed of atoms selected from the group consisting of a carbon atom, a hydrogen atom, a nitrogen atom, an oxygen atom and a sulfur atom.

24. The organic light-emitting device according to claim 12, wherein the sixth organic compound and the seventh organic compound both contain a dicyanobenzene structure.

25. The organic light-emitting device according to claim 1, wherein the organic mixed layer is a light-emitting layer.

26. The organic light-emitting device according to claim 1, wherein the organic mixed layer is formed as a layer different from a light-emitting layer.

* * * * *